(12) United States Patent
Shinohara

(10) Patent No.: US 6,901,015 B2
(45) Date of Patent: May 31, 2005

(54) SEMICONDUCTOR MEMORY DEVICE

(75) Inventor: Hirofumi Shinohara, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/463,615

(22) Filed: Jun. 18, 2003

(65) Prior Publication Data

US 2004/0017703 A1 Jan. 29, 2004

(30) Foreign Application Priority Data

Jul. 29, 2002 (JP) .................................. P2002-219501
Feb. 7, 2003 (JP) .................................. P2003-030837

(51) Int. Cl.[7] ............................ G11C 29/00; G11C 7/00
(52) U.S. Cl. ................................. 365/200; 365/230.03
(58) Field of Search ............................. 365/200, 230.03

(56) References Cited

U.S. PATENT DOCUMENTS

| | | | | |
|---|---|---|---|---|
| 5,295,101 A | * | 3/1994 | Stephens et al. | ............ 365/200 |
| 5,793,683 A | * | 8/1998 | Evans | ........................ 365/200 |
| 5,831,913 A | | 11/1998 | Kirihata | ...................... 365/200 |
| 5,970,000 A | * | 10/1999 | Kirihata et al. | ............. 365/200 |
| 6,229,741 B1 | | 5/2001 | Maeno | ........................ 365/200 |
| 6,367,030 B1 | * | 4/2002 | Yamauchi | ...................... 714/7 |
| 6,532,181 B2 | * | 3/2003 | Saito et al. | .................. 365/200 |

FOREIGN PATENT DOCUMENTS

| | | |
|---|---|---|
| JP | 10-275497 | 10/1998 |
| JP | 11-306790 | 11/1999 |
| JP | 2000-105994 | 4/2000 |
| JP | 2001-6391 | 1/2001 |

* cited by examiner

*Primary Examiner*—Van Thu Nguyen
(74) *Attorney, Agent, or Firm*—Oblon, Spivak, McClelland, Maier & Neustadt, P.C.

(57) ABSTRACT

A semiconductor memory device (1) comprises a normal RAM (2) and a redundancy RAM (3) provided independently from the normal RAM (2), serving as a redundancy circuit, and a control unit (4) for replacing a normal memory cell array of the normal RM (2) by a redundancy memory call array of the redundancy RAM (3). The control unit (4) can replace the normal memory cell array by some of a plurality of redundancy memory cells constituting the redundancy memory cell array. Therefore, a defective normal memory cell array can be replaced with using a redundancy memory cell which does not have a defect. As a result, a manufacturing yield of the semiconductor memory device (1) can be improved. With this constitution provided is a technique to improve the manufacturing yield of a semiconductor memory device which comprises a redundancy circuit.

8 Claims, 62 Drawing Sheets

|  |  |  |  | ENC<1:0> |
|---|---|---|---|---|
| HITR0=1 |  |  |  | (0,0) |
| HITR0=0 | HITR1=1 |  |  | (0,1) |
|  | HITR1=0 | HITR2=1 |  | (1,0) |
|  |  | HITR2=0 | HITR3=1 | (1,1) |
|  |  |  | HITR3=0 | (1,1) |

FIG. 15

| | XR<7> | XR<6:5> | XR<4:3> | XR<2:1> | XR<0> | YR<2:1> | YR<0> |
|---|---|---|---|---|---|---|---|
| HITR=1 | 1 | (0,0) | ENC<1:0> | A<13:12> | A<0> | A<11:10> | A<9> |
| HITR=0 | 0 | A<6:5> | A<4:3> | A<2:1> | A<0> | A<8:7> | A<9> |

F I G . 1 6

|  |  | DIR<1:0> | DIR<3:2> | DIR<5:4> | DIR<7:6> |
|---|---|---|---|---|---|
| HITR=1 |  | DI<1:0> | DI<3:2> | DI<5:4> | DI<7:6> |
| HITR=0 | HC0<0>=1 | DI<1:0> | | | |
|  | HC0<1>=1 | DI<3:2> | | | |
|  | HC0<2>=1 | DI<5:4> | | | |
|  | HC0<3>=1 | DI<7:6> | | | |
|  | HC1<0>=1 | | DI<1:0> | | |
|  | HC1<1>=1 | | DI<3:2> | | |
|  | HC1<2>=1 | | DI<5:4> | | |
|  | HC1<3>=1 | | DI<7:6> | | |
|  | HC2<0>=1 | | | DI<1:0> | |
|  | HC2<1>=1 | | | DI<3:2> | |
|  | HC2<2>=1 | | | DI<5:4> | |
|  | HC2<3>=1 | | | DI<7:6> | |
|  | HC3<0>=1 | | | | DI<1:0> |
|  | HC3<1>=1 | | | | DI<3:2> |
|  | HC3<2>=1 | | | | DI<5:4> |
|  | HC3<3>=1 | | | | DI<7:6> |

FIG. 17

| | | DIR<1:0> | DIR<3:2> | DIR<5:4> | DIR<7:6> |
|---|---|---|---|---|---|
| HITR=1 | | | | | |
| HITR=0 | HITC0=1 HITB<0>=1 | DI<1:0> | | | |
| | HITC0=1 HITB<1>=1 | DI<3:2> | | | |
| | HITC0=1 HITB<2>=1 | DI<5:4> | | | |
| | HITC0=1 HITB<3>=1 | DI<7:6> | | | |
| | HITC1=1 HITB<0>=1 | | DI<1:0> | | |
| | HITC1=1 HITB<1>=1 | | DI<3:2> | | |
| | HITC1=1 HITB<2>=1 | | DI<5:4> | | |
| | HITC1=1 HITB<3>=1 | | DI<7:6> | | |
| | HITC2=1 HITB<0>=1 | | | DI<1:0> | |
| | HITC2=1 HITB<1>=1 | | | DI<3:2> | |
| | HITC2=1 HITB<2>=1 | | | DI<5:4> | |
| | HITC2=1 HITB<3>=1 | | | DI<7:6> | |
| | HITC3=1 HITB<0>=1 | | | | DI<1:0> |
| | HITC3=1 HITB<1>=1 | | | | DI<3:2> |
| | HITC3=1 HITB<2>=1 | | | | DI<5:4> |
| | HITC3=1 HITB<3>=1 | | | | DI<7:6> |

|  | DIRC<1:0> | DIRC<3:2> | DIRC<5:4> | DIRC<7:6> |
|---|---|---|---|---|
| OC=0 | DIR<1:0> | DIR<3:2> | DIR<5:4> | DIR<7:6> |
| OC=1 | DIR<1:0> | DIR<1:0> | DIR<1:0> | DIR<1:0> |

|  |  | DQR<1:0> |
|---|---|---|
| OC=0 |  | DQRC<1:0> |
| OC=1 | SD<0>=1 | DQRC<1:0> |
|  | SD<1>=1 | DQRC<3:2> |
|  | SD<2>=1 | DQRC<5:4> |
|  | SD<3>=1 | DQRC<7:6> |

FIG. 27

| | | | YR<4:3> |
|---|---|---|---|
| HITC0=1 | | | (0,0) |
| HITC0=0 | HITC1=1 | | (0,1) |
| | HITC1=0 | HITC2=1 | (1,0) |
| | | HITC2=0 | HITC3=1 | (1,1) |
| | | | HITC3=0 | (1,1) |

FIG. 28

| | | DIR<1:0> | DIR<3:2> | DIR<5:4> | DIR<7:6> |
|---|---|---|---|---|---|
| HITR=1 | | DI<1:0> | DI<3:2> | DI<5:4> | DI<7:6> |
| HITR=0 | HITB<0>=1 | DI<1:0> | | | |
| | HITB<1>=1 | DI<3:2> | | | |
| | HITB<2>=1 | DI<5:4> | | | |
| | HITB<3>=1 | DI<7:6> | | | |

FIG. 29

| | | DIR<1:0> | DIR<3:2> | DIR<5:4> | DIR<7:6> |
|---|---|---|---|---|---|
| HITR=1 | | DI<1:0> | DI<3:2> | DI<5:4> | DI<7:6> |
| HITR=0 | HITB<0>=1 | DI<1:0> | DI<1:0> | DI<1:0> | DI<1:0> |
| | HITB<1>=1 | DI<3:2> | DI<3:2> | DI<3:2> | DI<3:2> |
| | HITB<2>=1 | DI<5:4> | DI<5:4> | DI<5:4> | DI<5:4> |
| | HITB<3>=1 | DI<7:6> | DI<7:6> | DI<7:6> | DI<7:6> |

F I G . 3 1
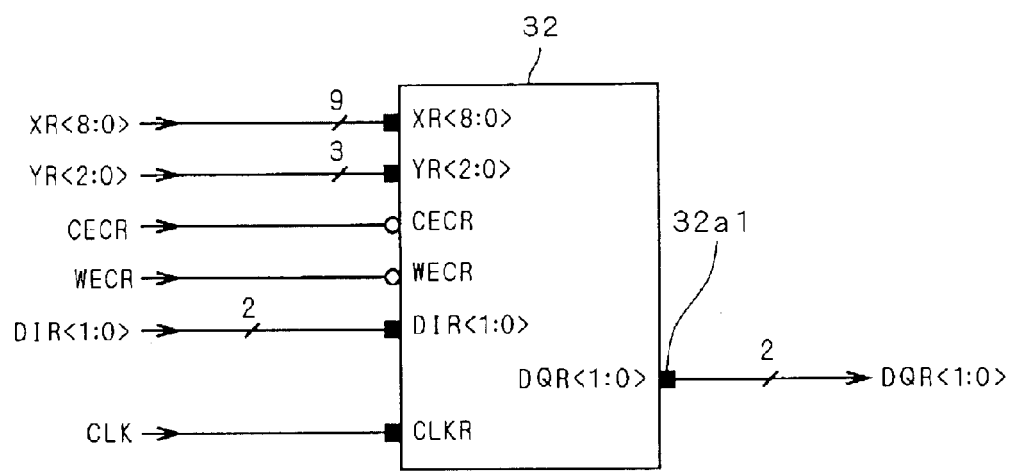

F I G. 4 3
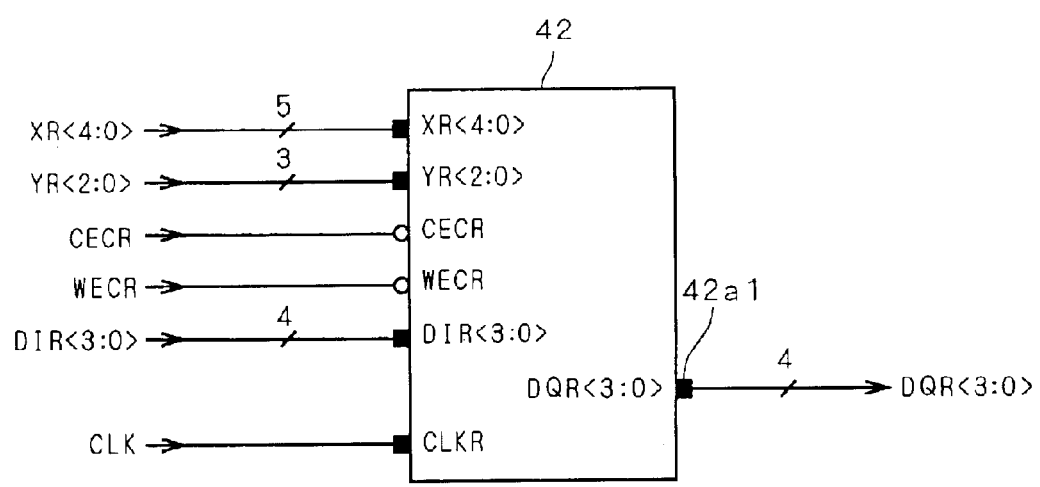

F I G . 4 8
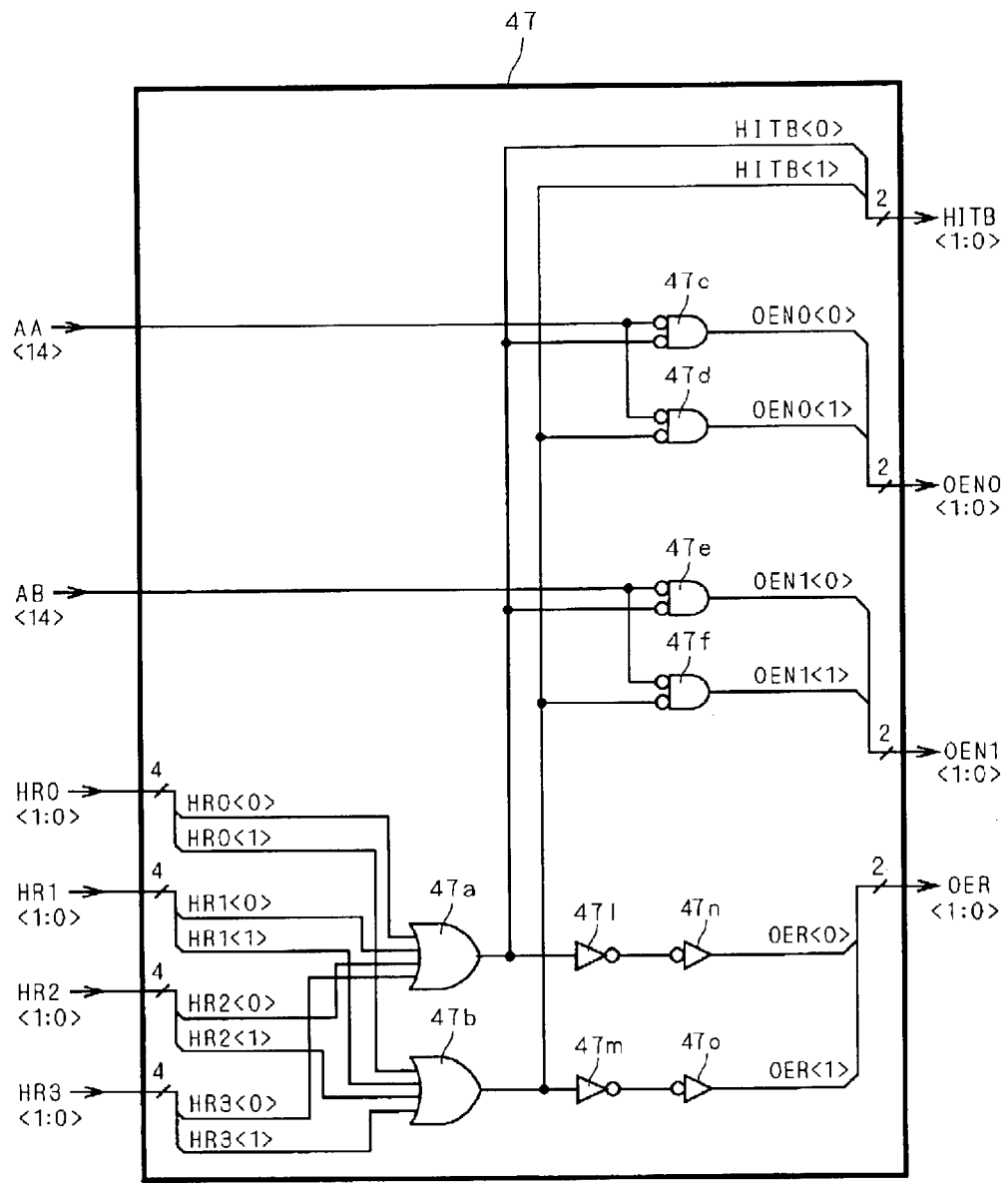

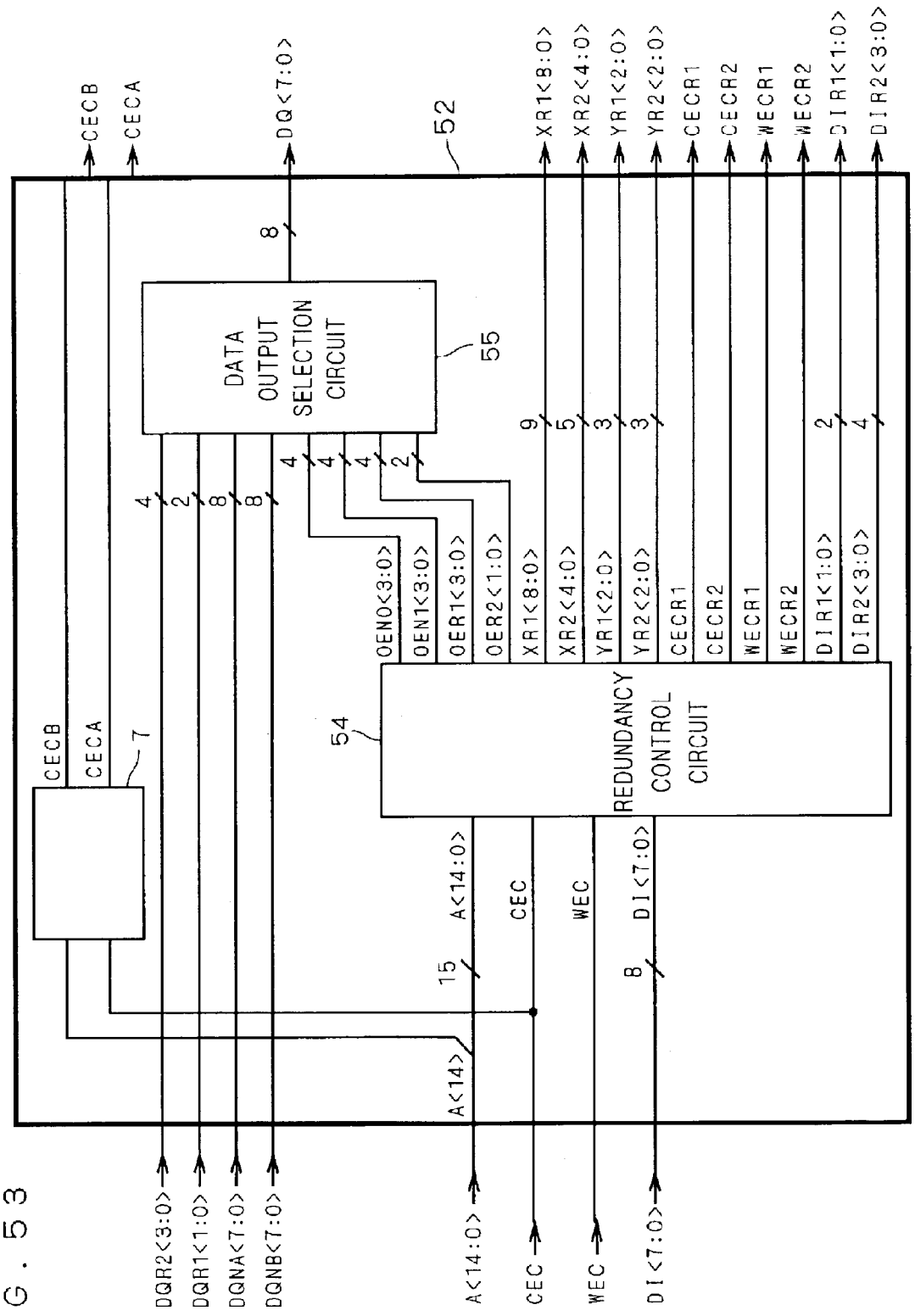
F I G. 53

SEMICONDUCTOR MEMORY DEVICE

BACKGROUND OF THE INVENTION

1. Field of the Invention

The present invention relates to a semiconductor memory device which comprises a redundancy circuit.

2. Description of the Background Art

FIG. 66 is a circuit diagram showing a configuration of a semiconductor memory device in a first background art. As shown in FIG. 66, the semiconductor memory device of the first background art comprises a normal RAM (Random Access Memory) 101 with 3 bits×32 words and a redundancy RAM 102 with 1 bit×32 words. The redundancy RAM 102 is provided independently from the normal RAM 101, serving as a redundancy circuit of the normal RAM 101.

To the normal RAM 101, a 5-bit address AA<4:0> and a write signal WE are inputted as an address A<4:0> and a write signal WE1, respectively, and further a 3-bit data DI<3:1> is inputted. The normal RAM 101 outputs a 3-bit data DO<3:1>.

To the redundancy RAM 102, a 5-bit address AA<4:0> is inputted as an address A<4:0>, and further a write signal WE2 and a 1-bit data DI<0> are inputted. The redundancy RAM 102 outputs a 1-bit data DO<0>.

The semiconductor memory device of the first background art further comprises selection circuits 103 to 105, 109 and 110, an AND circuit 108 and OR circuits 106 and 107. The selection circuit 103 selects either one of the data DO<3> and the data DO<2> outputted from the normal RAM 101 on the basis of a signal F<3>, and outputs the selected data as data XDO<2> to the outside of the semiconductor memory device. Similarly, the selection circuit 104 selects either one of the data DO<2> and the data DO<1> outputted from the normal RAM 101 on the basis of a signal F<2>, and outputs the selected data as data XDO<1> to the outside of the semiconductor memory device. The selection circuit 105 selects either one of the data DO<1> outputted from the normal RAM 101 and the data DO<0> outputted from the redundancy RAM 102 on the basis of a signal F<1>, and outputs the selected data as data XDO<0> to the outside of the semiconductor memory device.

FIG. 67 is a circuit diagram showing a configuration of the normal RAM 101. As shown in FIG. 67, the normal RAM 101 comprises write drivers WD1a to WD1c, sense amplifiers SA1a to SA1c, a column address decoder 121, a row address decoder 122, column selector circuits 123a to 123c and a plurality of memory cells 120 arranged in a matrix with eight rows and twelve columns. The memory cells 120 in a matrix with eight rows and twelve columns constitute groups of memory cells (memory cell groups) 124a to 124c. In FIGS. 67 and 68 discussed later, the lateral direction of paper is a column direction and the vertical direction is a row direction, and the bit lines and the word lines are arranged in the column direction and the row direction, respectively. Reference numbers 0 to 31 represent respect addresses of the memory cells 120 in the memory cell groups 124a to 124c in a decimal system.

A 2-bit address A<1:0> is inputted to the column address decoder 121 and a 3-bit address A<4:2> is inputted to the row address decoder 122. The row address decoder 122 decodes the address A<4:2> and selects a row which is indicated by the decoded result. The column address decoder 121 decodes the address A<1:0> and notifies the column selector circuits 123a to 123c of the decoded result. Each of the column selector circuits 123a to 123c selects a column indicated by the decoded result which is received. In each of the memory cell groups 124a to 124c, a memory cell 120 indicated by an address A<4:0> is thereby selected.

When the normal RAM 101 outputs data, a signal from the memory cell 120 selected by the memory cell group 124a is amplified by the sense amplifier SA1a and outputted as the data DO<1>. Further, a signal from the memory cell 120 selected by the memory cell group 124b is amplified by the sense amplifier SA1b and outputted as the data DO<2>, and a signal from the memory cell 120 selected by the memory cell group 124c is amplified by the sense amplifier SA1c and outputted as the data DO<3>.

When the write signal WE1=0, i.e., when data is written into the normal RAM 101, the inputted data DI<1> is written into the selected memory cell 120 in the memory cell group 124a through the write driver WD1a. Further, the inputted data DI<2> is written into the selected memory cell 120 in the memory cell group 124b through the write driver WD1b, and the inputted data DI<3> is written into the selected memory cell 120 in the memory cell group 124c through the write driver WD1c.

FIG. 68 is a circuit diagram showing a configuration of the redundancy RAM 102 serving as the redundancy circuit. As shown in FIG. 68, the redundancy RAM 102 comprises a write driver WD2, a sense amplifier SA2, a column address decoder 131, a row address decoder 132, a column selector circuit 133 and a plurality of memory cells 130 arranged in a matrix with eight rows and four columns. Reference numbers 0 to 31 represent respective addresses of the memory cells 130 in a decimal system. In some cases, the memory cells in the matrix with eight rows and four columns are collectively referred to as "memory cell group 134".

A 2-bit address A<1:0> is inputted to the column address decoder 131 and a 3-bit address A<4:2> is inputted to the row address decoder 132. The row address decoder 132 decodes the address A<4:2> and selects a row which is indicated by the decoded result. The column address decoder 131 decodes the address A<1:0> and notifies the column selector circuit 133 of the decoded result. The column selector circuit 133 selects a column indicated by the decoded result which is received. In the memory cell group 134, a memory cell 130 indicated by an address A<4:0> is thereby selected.

When the address AA<4:0> has the same value, the address of the memory cell 120 selected in each of the memory cell groups 124a to 124c of the normal RAM 101 is the same as the address of the memory cell 130 selected in the redundancy RAM 102. For example, when a value "01000" in binary is given to the address AA<4:0>, in each of the memory cell groups 124a to 124c of the normal RAM 101, the memory cell 120 having the address 8 in decimal is selected. At this time, also in the redundancy RAM 102, the memory cell 130 having the address 8 in decimal is selected.

When data is outputted from the redundancy RAM 102, a signal from the memory cell 130 selected as above is amplified by the sense amplifier SA2 and outputted as the data DO<0>. When the write signal WE2=0, i.e., when data is written into the redundancy RAM 102, the inputted data DI<0> is written into the selected memory cell 130 through the write driver WD2.

Next, discussion will be made on a data output operation of the semiconductor memory device in the first background art in a case where any one of the memory cell groups 124a to 124c of the normal RAM 101 has a defective memory cell 120. The following discussion will be made on an operation in a case where the memory cell group 124b has a defective memory cell 120, as one example. A signal F<3:0> is a signal outputted from a test circuit (not shown) included in the normal RAM 101, and when the memory cell group 124b has a defect, a signal F<1>=0, a signal F<2>=0 and a signal F<3>=1 are outputted.

Since the signal F<1>=0, the selection circuit 105 outputs the data DO<0> which is outputted from the redundancy RAM 102 as data XDO<0>. Since the signal F<2>=0, the selection circuit 104 outputs the data DO<1> which is outputted from the normal RAM 101 as data XDO<1>. Since the signal F<3>=1, the selection circuit 103 outputs the data DO<3> which is outputted from the normal RAM 101 as data XDO<2>.

Thus, the defective memory cell group 124b in the normal RAM 101 is replaced by the memory cell group 134 in the redundancy RAM 102 which serves as a redundancy circuit, and data from the memory cell 134 in the redundancy RAM 102 is outputted to the outside instead of the data from the memory cell group 124b in the normal RAM 101.

In the above case, the data DO<1> outputted from the normal RAM 101 is outputted to the outside of the semiconductor memory device with its bit position shifted by 1 bit. Specifically, the data DO<1> is outputted from the normal RAM 101 at the least significant bit position and when the data is outputted as the data XDO<1> to the outside of the semiconductor memory device, it is outputted at the second lowest bit position (the data XDO<0> is outputted at the least significant bit position).

When there is no defect in the memory cell groups 124a to 124c, the data DO<3:1> from the normal RAM 101 is outputted to the outside of the semiconductor memory device at the respective bit positions, but since the memory cell group 124b has a defect in the above case, it is necessary to output data to the bit position of the data DO<2> (the second lowest bit position) corresponding to the memory cell group 124b and therefore the data DO<1> is outputted with its bit position shifted by 1 bit. Thus, a replacement method by shifting the bit position of some data is referred to as "I/O shift replacement method".

Further, a second background art is proposed, as a variation of the semiconductor memory device in the above first background art, in which the redundancy RAM 102 comprises the memory cells 130 as many as one column of memory cells 120 in the normal RAM 101, i.e., 8 memory cells 130, and only one column of memory cells 120 in the normal RAM 101 are replaced by the memory cells 130. In the second background art, if there is a defective memory cell 120 in a column of the memory cell group 124b of the normal RAM 101, for example, when the address A<1:0> indicating the column is inputted to the normal RAM 101, the data DO<0> from the redundancy RAM 102 is outputted to the outside instead of the data DO<2> regardless of the value of the address A<4:2>.

Thus, since the redundancy RAM 102 comprises the memory cells 130 as many as one column of memory cells 120 in the normal RAM 101, it is possible to reduce the circuit scale of the redundancy circuit as compared with the first background art. As to the first and second background arts, the same techniques are disclosed in Japanese Patent Application Laid-Open No. 2001-6391.

Next, the respective problems of the first and second background arts will be discussed.

A. Problem of the First Background Art

In the semiconductor memory device of the first background art, all the memory cells 130 in the redundancy RAM 102 are used when the memory cell group of the normal RAM 101 is replaced by the memory cell group 134 of the redundancy RAM 102. Therefore, when there is a defect in the memory cells 130 of the redundancy RAM 102, the redundancy RAM 102 can not be used as a redundancy circuit. As a result, there arises a problem in the first background art that the manufacturing yield of the semiconductor memory device is not good.

Further, in the first background art, it may be possible to increase the number of bits in the redundancy circuit by providing another redundancy RAM 102 in order to relieve a plurality of memory cell groups which have defects in the normal RAM 101. In this case, as shown in FIG. 69, the first background art using the I/O shift replacement method needs the stages of selection circuits as many as the bits in the redundancy circuit, for outputting data of the normal RAM 101 and the redundancy RAM 102 to the outside of the semiconductor memory device. For this reason, the time required from the data output from the normal RAM 101 or redundancy RAM 102 to the data output to the outside of the semiconductor memory device increases and a desired performance can not be achieved. As a result, there arises a problem that the manufacturing yield of the semiconductor memory device is deteriorated.

Furthermore, in the first background art, since one redundancy RAM 102 can relieve only one normal RAM 101, a plurality of redundancy RAMs 102 are needed to relieve a plurality of normal RAMs 101. Therefore, the circuit scale of the redundancy circuit increases and the percent defective of the redundancy circuit increases. As a result, there arises a problem that the manufacturing yield of the semiconductor memory device is deteriorated.

B. Problem of the Second Background Art

In the semiconductor memory device of the second background art, the memory cells 120 of the normal RAM 101 which are aligned in the column direction, i.e., in the direction that the bit lines extend are replaced by the memory cells 130 of the redundancy RAM 102. In the memory cell groups, defects are caused not only in the column direction but also in the row direction, i.e., in the direction that the word lines extend in some cases. For example of this case, the word line is broken. In such a case, the second background art can not always relieve all the memory cells 120 in the row. Therefore, there arises a problem in the second background art that the manufacturing yield of the semiconductor memory device is not good.

SUMMARY OF THE INVENTION

It is an object of the present invention to provide a technique for improving a manufacturing yield of a semiconductor memory device which includes a redundancy circuit.

The present invention is intended for a semiconductor memory device.

According to a first aspect of the present invention, the semiconductor memory device includes a first memory device, a second memory device and a control unit. The first memory device has a normal memory cell area. The second memory device is provided independently from the first memory device and has a redundancy memory cell area. The control unit defines a replacement unit with respect to the normal memory cell area in advance to be used for relieving the normal memory cell area which has a defect, and is capable of replacing the replacement unit in the normal memory cell area by some of a plurality of redundancy memory cells constituting the redundancy memory cell area when the normal memory cell area actually has a defect. The number of bits of data corresponding to the replacement unit is smaller than the number of bits of unit data in the first memory device.

It is possible to reduce a circuit scale of the second memory device as compared with a case where the number of bits of data corresponding to the replacement unit is equal to the number of bits of unit data in the first memory device.

Further, since some of the redundancy memory cells in the second memory device can be used for replacement, it is possible to replace the replacement unit by the redundancy memory cell without using any redundancy memory cell which has a defect. As a result, the manufacturing yield of the semiconductor memory device is improved.

According to a second aspect of the present invention, the semiconductor memory device includes a first memory device, a second memory device and a control unit. The first memory device has a normal memory cell area. The second memory device is provided independently from the first memory device and has a redundancy memory cell area. The control unit defines a replacement unit with respect to the normal memory cell area in advance to be used for relieving the normal memory cell area which has a defect, and replaces the replacement unit in the normal memory cell area by the redundancy memory cell area when the normal memory cell area actually has a defect. The number of bits of data corresponding to the replacement unit is smaller than the number of bits of unit data in the first memory device. The control unit outputs data, out of the unit data in the first memory device, other than the data corresponding to the replacement unit at its bit position without any change and outputs data read out from the redundancy memory cell area instead of the data corresponding to the replacement unit at the bit position of the data corresponding to the replacement unit when the replacement unit is replaced by the redundancy memory cell area.

Since the control unit outputs data out of all the data in said first memory device other than said data corresponding to the replacement unit at its bit position without any change, it is possible to reduce a delay until data output as compared with a case where data is outputted with its bit position shifted.

According to a third aspect of the present invention, the semiconductor memory device includes a plurality of first memory devices, a second memory device and a control unit. The plurality of first memory devices are provided independently from one another, to which different address areas are allocated, and each have a normal memory cell area. The second memory device is provided independently from the plurality of first memory devices and has a redundancy memory cell area. The control unit defines a replacement unit with respect to the normal memory cell area in advance to be used for relieving the normal memory cell area in each of the plurality of first memory devices which has a defect, and replaces the replacement unit in one of the plurality of first memory devices corresponding to an inputted address by the redundancy memory cell area. The number of bits of data corresponding to the replacement unit is smaller than the number of bits of unit data in each of the plurality of first memory devices.

Since a plurality of first memory devices can be relieved by the second memory device, it is not necessary to provide the second memory device for each first memory device. Therefore, it is possible to reduce the circuit scale of the second memory device. As a result, the manufacturing yield of the semiconductor memory device is improved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 15 is an address scramble table in accordance with the first preferred embodiment of the present invention;

FIGS. 16 and 17 are tables showing data outputted from a data input subword selection circuit in accordance with the first preferred embodiment of the present invention;

FIG. 27 is a table showing data outputted from a redundancy column address encoder in accordance with the second preferred embodiment of the present invention;

FIGS. 28 and 29 are tables showing data outputted from a data input subword selection circuit in accordance with the second preferred embodiment of the present invention;

FIGS. 30 to 36 are diagrams showing a constitution of a semiconductor memory device in accordance with a third preferred embodiment of the present invention;

FIGS. 42 to 49 are diagrams showing a constitution of a semiconductor memory device in accordance with a fourth preferred embodiment of the present invention;

FIGS. 52 to 55 are diagrams showing a constitution of a semiconductor memory device in accordance with a fifth preferred embodiment of the present invention;

DESCRIPTION OF THE PREFERRED EMBODIMENTS

The First Preferred Embodiment

FIGS. 1 to 11 are diagrams showing a constitution of a semiconductor memory device in accordance with the first preferred embodiment of the present invention. The semiconductor memory device 1 of the first preferred embodiment is a 256-kbit RAM with 8 bits×32 kwords.

Figure 1:
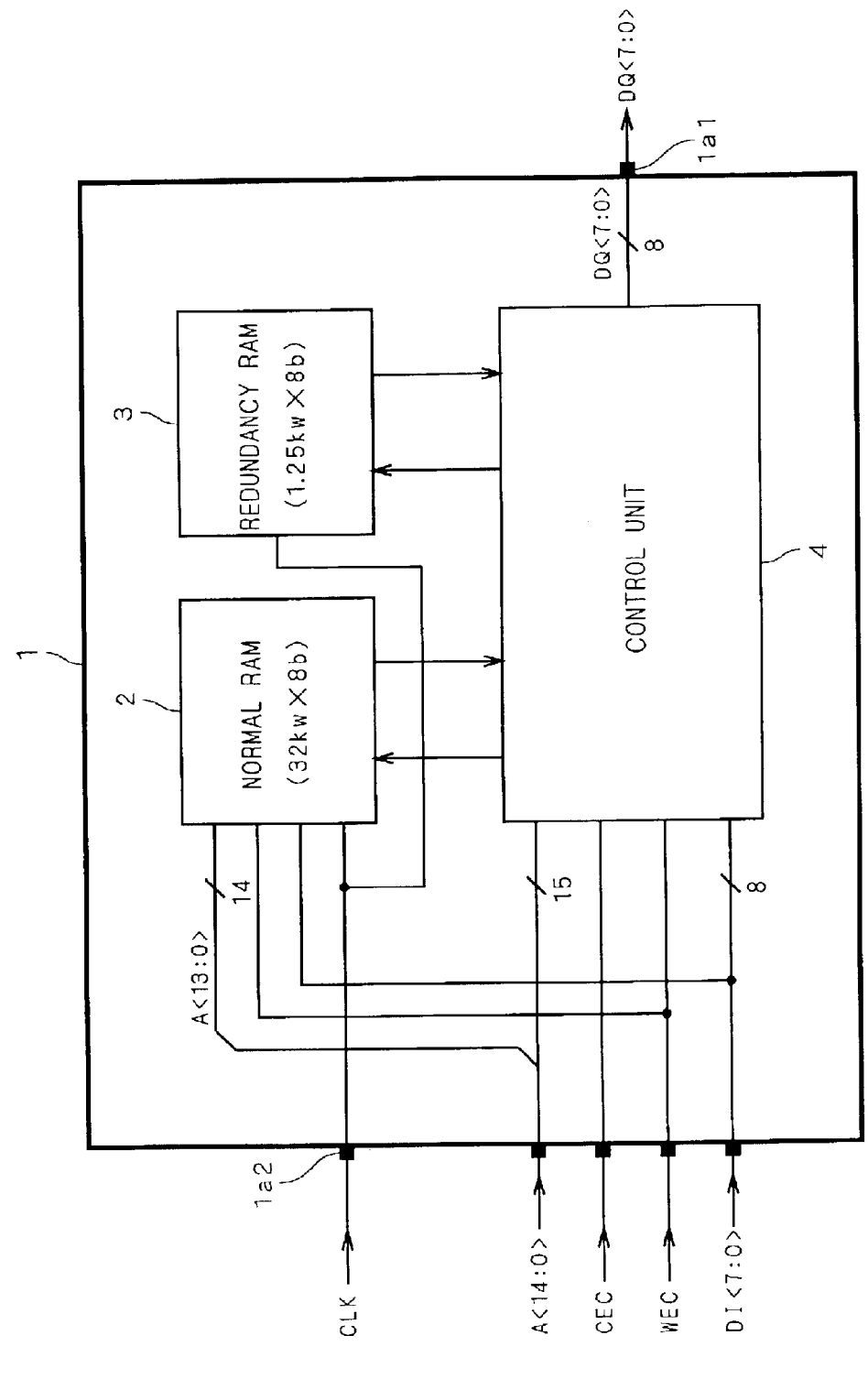
FIGS. 1 to 11 are diagrams showing a constitution of a semiconductor memory device in accordance with a first preferred embodiment of the present invention.

As shown in FIG. 1, the semiconductor memory device 1 of the first preferred embodiment comprises a control unit 4, a normal RAM 2 which is a memory device and a redundancy RAM 3 which is a memory device, like the normal RAM 2, performing a function as a redundancy circuit of the normal RAM 2 by a control of the control unit 4. The normal RAM 2 is a 256-kbit RAM with 8 bits×32 kwords. The redundancy RAM 3 is a 10-kbit RAM with 8 bits×1.25 kwords, being provided independently from the normal RAM 2.

To the semiconductor memory device 1 of the first preferred embodiment, a clock CLK, a 15-bit address A<14:0>, a chip enable signal CEC, a write signal WEC and 8-bit data DI<7:0> are inputted through an input terminal 1a2. The semiconductor memory device 1 outputs 8-bit data DQ<7:0> to the outside through output terminals 1a1 provided by the bit.

Figure 2:
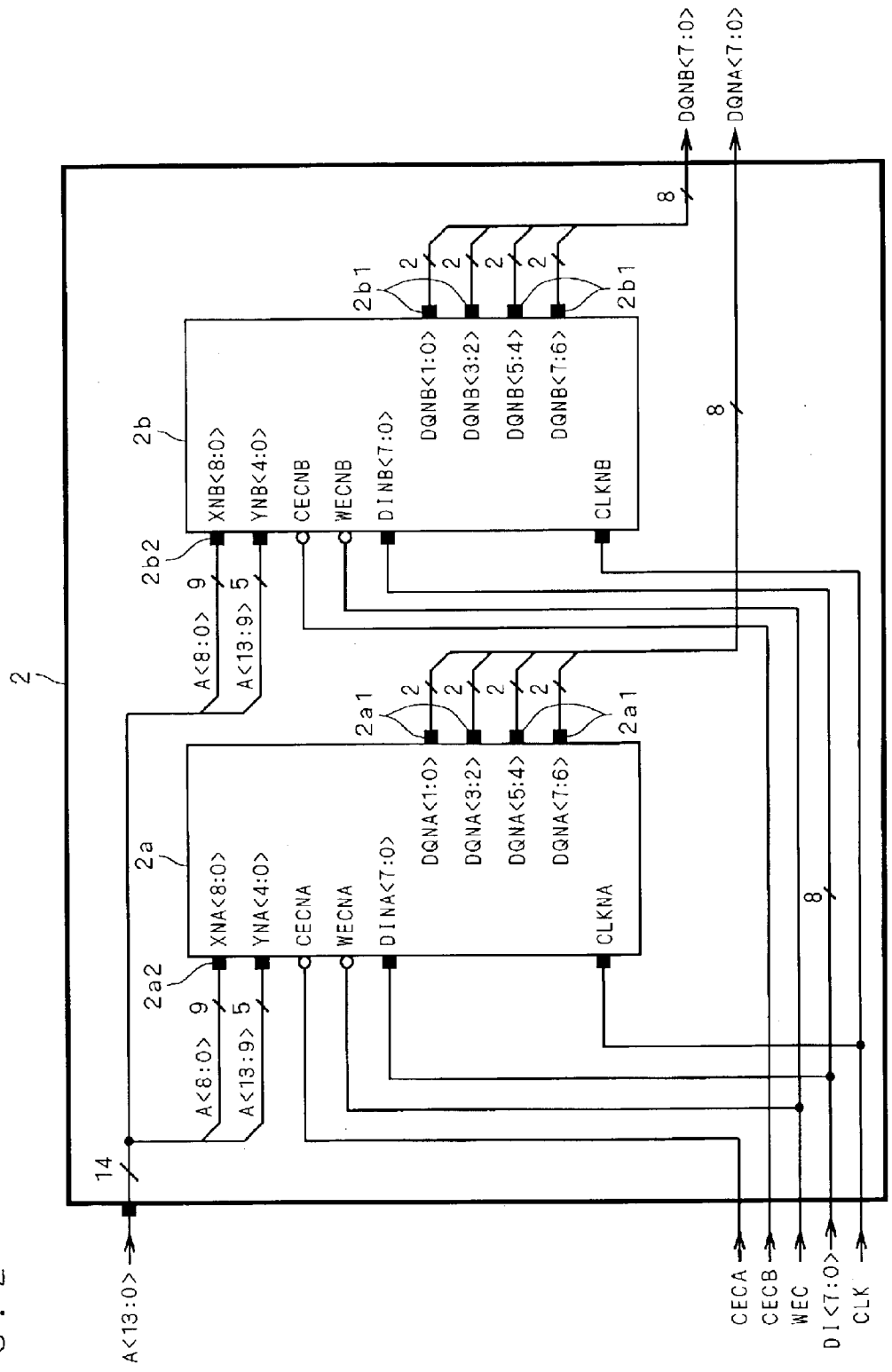

FIG. 2 is a block diagram showing a configuration of the normal RAM 2. As shown in FIG. 2, the normal RAM 2 comprises normal RAMs 2a and 2b each of which is a 128-kbit RAM with 8 bits×32 kwords. The normal RAMs 2a and 2b have different address areas which are allocated thereto, and in address space allocated to the normal RAM 2, the higher address area is allocated to the normal RAM 2a and the lower address area is allocated to the normal RAM 2b.

Each of the normal RAMs 2a and 2b deals 8-bit unit data, i.e., 8-bit I/O data. To the normal RAMs 2a and 2b, an address A<13:0>, the write signal WEC, data DI<7:0> and the clock CLK are inputted from the outside of the semiconductor memory device 1 through input terminals 2a2 and 2b2, respectively. An address A<8:0> out of the address A<13:0> is inputted to the normal RAM 2a as a row address XNA<8:0> and inputted to the normal RAM 2b as a row address XNB<8:0>. An address A<13:9> out of the address A<13:0> is inputted to the normal RAM 2a as a column address YNA<4:0> and inputted to the normal RAM 2b as a column address YNB<4:0>.

The write signal WEC is inputted to the normal RAM 2a as a write signal WECNA and inputted to the normal RAM 2b as a write signal WECNB. The data DI<7:0> is inputted to the normal RAM 2a as data DINA<7:0> and inputted to the normal RAM 2b as data DINB<8:0>. The clock CLK is inputted to the normal RAM 2a as a clock CLKNA and inputted to the normal RAM 2b as a clock CLKNB.

Further, a chip enable signal CECA outputted from the control unit 4 is inputted to the normal RAM 2a as a chip enable signal CECNA and a chip enable signal CECB outputted from the control unit 4 is inputted to the normal RAM 2b as a chip enable signal CECNB.

The normal RAM 2a outputs 8-bit data DQNA<7:0> to the control unit 4 through output terminals 2a1 provided by the bit. The normal RAM 2b outputs 8-bit data DQNB<7:0> to the control unit 4 through output terminals 2b1 provided by the bit.

Each of the normal RAMs 2a and 2b comprises a normal memory cell area 17 consisting of a plurality of normal memory cells 16 arranged in a matrix with 512 rows and 256 columns (not shown in FIG. 2). A memory cell area consisting of a plurality of memory cells arranged in a matrix as above is referred to as a "memory cell array". Hereinafter, the normal memory cell area 17 is referred to as a "normal memory cell array 17". In the first preferred embodiment and the following preferred embodiments, discussion will be made assuming that a direction that the word lines extend is a row direction and a direction that the bit lines extend is a column direction. This rule is decided for convenience of discussion on the present invention, and it goes without saying that the present invention is true even assuming that a direction that the word lines extend is a column direction and a direction that the bit lines extend is a row direction.

Figure 12:
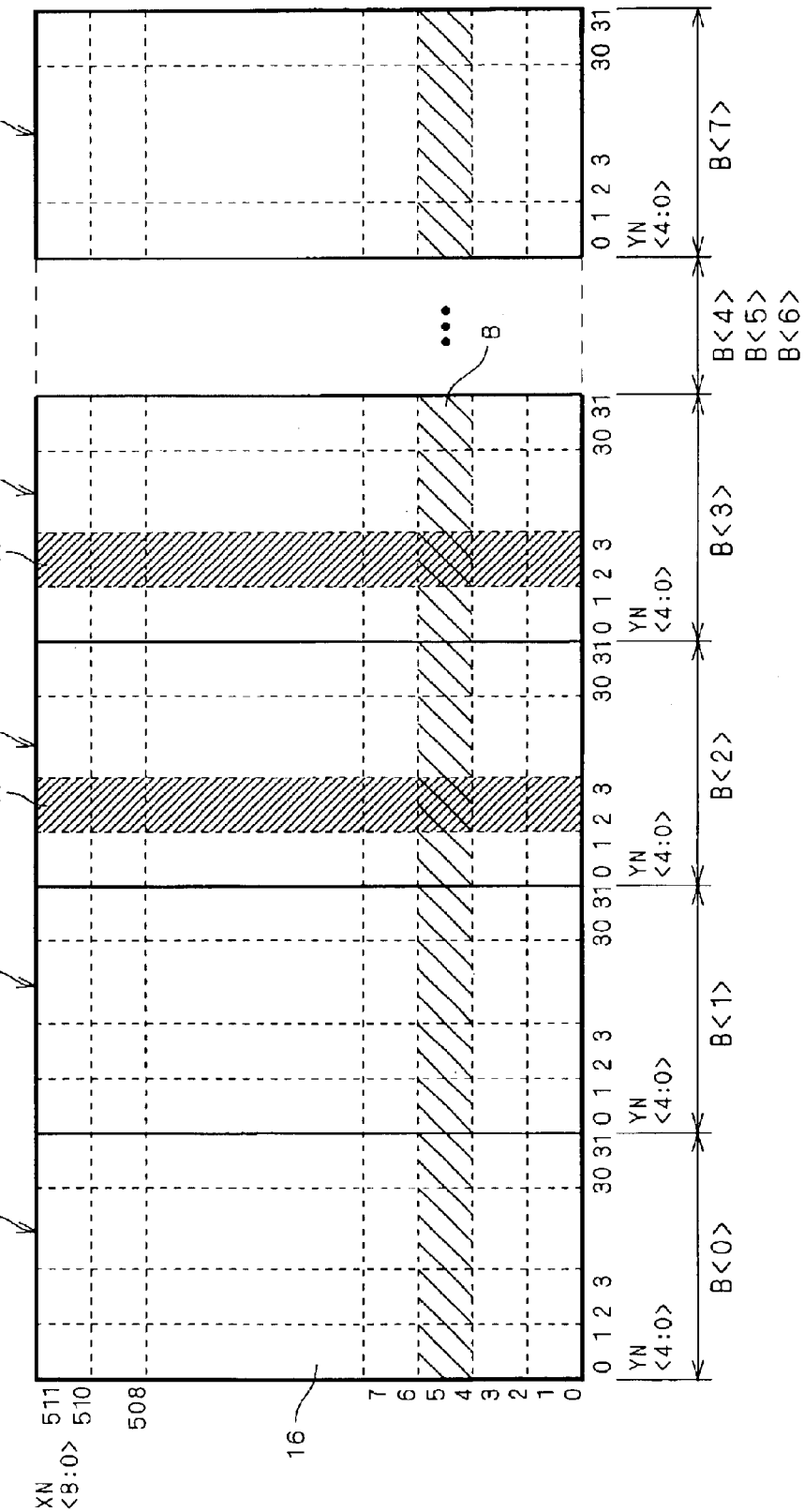
FIG. 12 is a diagram showing a constitution of a normal memory cell array in accordance with the first preferred embodiment of the present invention.

FIG. 12 is a schematic diagram showing a constitution of the normal memory cell array 17 included in each of the normal RAMs 2a and 2b. In FIG. 12, the row addresses XNA<8:0> and XNB<8:0> are collectively represented as a "row address XN<8:0>", and the column addresses YNA<4:0> and YNB<4:0> are collectively represented as a "row address YN<4:0>".

In each of the normal RAMs 2a and 2b, as shown in FIG. 12, a plurality of normal memory cells 16 arranged in a matrix with 512 rows and 32 columns correspond to one bit of the unit data consisting of 8 bits. Bits B<0> to B<7> in FIG. 12 represent the bits of the unit data in each of the normal RAMs 2a and 2b, and the bit B<0> represents the least significant bit of the unit data and the bit B<7> represents the most significant bit thereof. Groups of the normal memory cells 16 arranged in a matrix with 512 rows and 32 columns corresponding to the bits B<0> to B<7> are referred to as normal memory cell groups 17a to 17h, respectively.

Next, an operation of the normal RAM 2 will be discussed. When the 15-bit address A<14:0> inputted from the outside of the semiconductor memory device 1 indicates "4000 to 7FFF" in hexadecimal, i.e., when the address A<14>=1, the chip enable signal CECNA is equal to the chip enable signal CEC and the chip enable signal CECNB is "1", and when the chip enable signal CEC is "0", the normal RAM 2a is selected. When the address A<14:0> indicates "0000 to 3FFF" in hexadecimal, i.e., when the address A<14>=0, the chip enable signal CECNA is "1" and the chip enable signal CECNB is equal to the chip enable signal CEC, and when the chip enable signal CEC is "0", the normal RAM 2b is selected. Since operations of the normal RAMs 2a and 2b after being selected are the same, the following discussion will be made taking the normal RAM 2a as an example.

The normal RAM 2a performs read and write of data in synchronization with the clock CLKNA. The normal RAM 2a decodes the inputted row address XNA<8:0> to select one out of the 512 rows, which is indicated by the decoded result. Then, the normal RAM 2a decodes the column address YNA<4:0> to select one out of the 32 columns in each of the normal memory cell groups 17a to 17h, which is indicated by the decoded result. The normal memory cell 16 specified by the address A<13:0> is thereby selected in each of the memory cell groups 17a to 17h.

When the chip enable signal CECNA=0 and the write signal WECNA=1, data is read out from the selected normal memory cell 16 in each of the memory cell groups 17a to 17h and outputted to the control unit 4 as 8-bit data DQNA<7:0>.

When the chip enable signal CECNA=0 and the write signal WECNA=0, if the data DI<7:0> is inputted to the normal RAM 2a from the outside of the semiconductor memory device 1 as data DINA<7:0>, the data is written into the selected normal memory cell 16.

Figure 3:
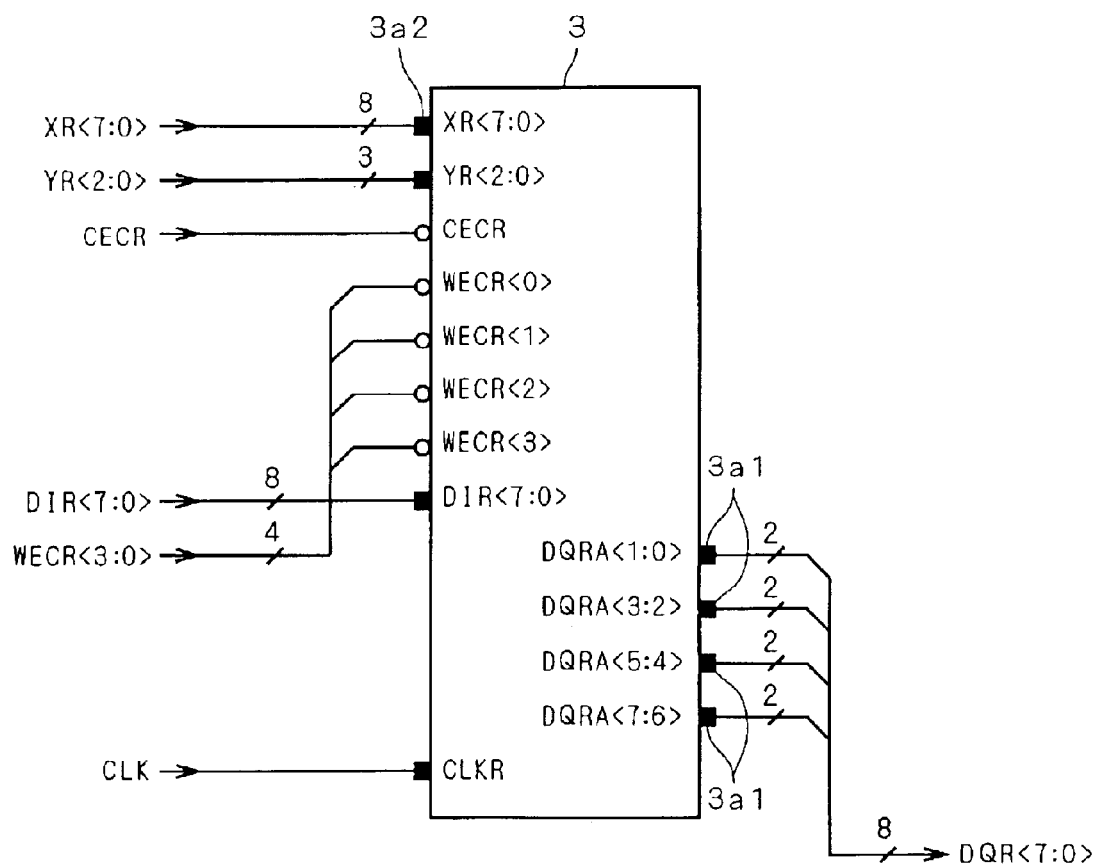

FIG. 3 is a diagram showing input and output signals of the redundancy RAM 3 serving as a redundancy circuit of the normal RAM 2. The redundancy RAM 3 deals with 8-bit unit data, i.e., 8-bit I/O data. To the redundancy RAM 3, a 8-bit row address XR<7:0>, a 3-bit column address YR<2:0>, a chip enable signal CECR, a 4-bit write signal WECR<3:0> and 8-bit data DIR<7:0> are inputted from the control unit 4 through an input terminal 3a2. Further, the clock CLK is inputted to the redundancy RAM 3 from the outside of the semiconductor memory device 1 through the input terminal 3a2 as a clock CLKR. The redundancy RAM 3 outputs 8-bit data DQR<7:0> to the control unit 4 through output terminals 3a1 provided by the bit.

The redundancy RAM 3 comprises a redundancy memory cell area 18 consisting of a plurality of redundancy memory cells 19 arranged in a matrix with 160 rows and 64 columns (not shown in FIG. 3). As discussed above, since a memory cell area consisting of a plurality of memory cells arranged in a matrix is referred to as a "memory cell array", the redundancy memory cell area 18 is hereinafter referred to as a "redundancy memory cell array 18".

Figures 13, 14:
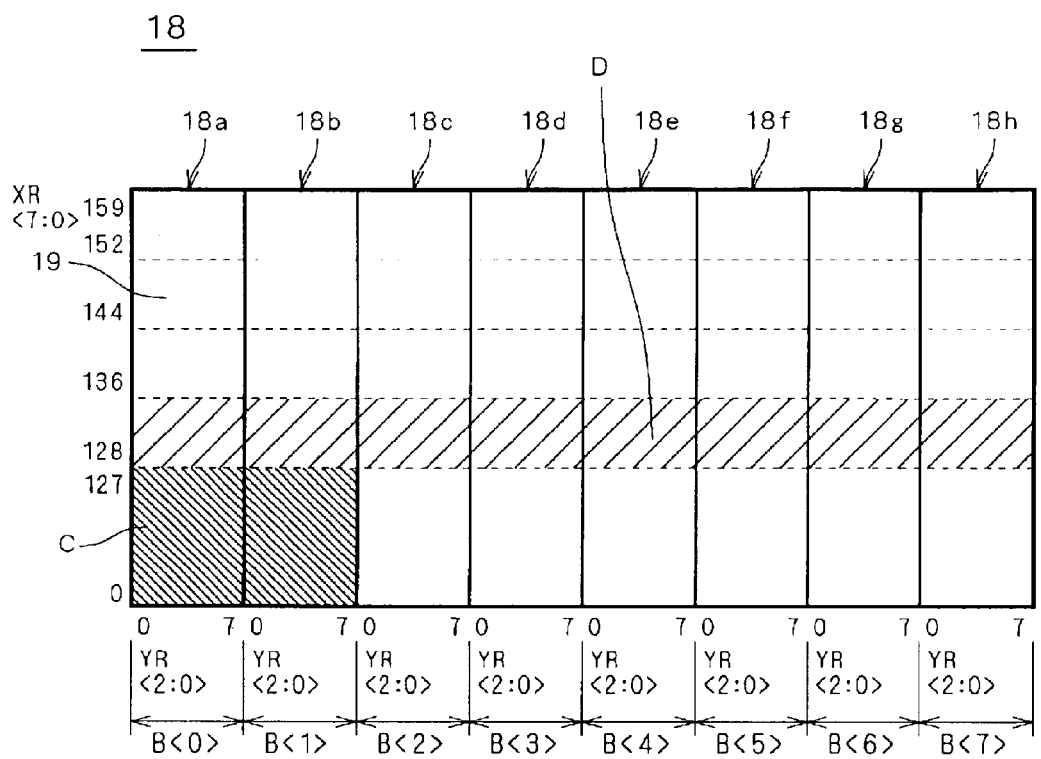
FIG. 13 is a diagram showing a constitution of a redundancy memory cell array in accordance with the first preferred embodiment of the present invention.
FIG. 14 is a table showing values of an encode signal ENC in accordance with the first preferred embodiment of the present invention.

FIG. 13 is a schematic diagram showing a constitution of the redundancy memory cell array 18 included in the redundancy RAM 3. As shown in FIG. 13, a plurality of redundancy memory cells 19 arranged in a matrix with 160 rows and 8 columns correspond to one bit of the unit data consisting of 8 bits in the redundancy RAM 3. Bits B<0> to B<7> in FIG. 13, like the bits B<0> to B<7> shown in FIG. 12, represent the bits of the unit data in the redundancy RAM 3, and the bit B<0> represents the least significant bit of the unit data and the bit B<7> represents the most significant bit thereof. Groups of the redundancy memory cells 19 arranged in a matrix with 160 rows and 8 columns corresponding to the bits B<0> to B<7> are referred to as redundancy memory cell groups 18a to 18h, respectively.

Next, an operation of the redundancy RAM 3 will be discussed. The redundancy RAM 3 performs read and write of data in synchronization with the clock CLKR. The redundancy RAM 3 decodes the inputted row address XR<7:0> to select one out of the 160 rows, which is indicated by the decoded result. Then, the redundancy RAM 3 decodes the column address YR<2:0> to select one out of the 8 columns in each of the redundancy memory cell groups 18a to 18h, which is indicated by the decoded result. The redundancy memory cell 19 specified by the row address XR<7:0> and the column address YR<2:0> is thereby selected in each of the memory cell groups 18a to 18h.

The redundancy RAM 3 is writable by 2 bits. The read of data is performed by 8 bits. Specifically, data can be written with each 2-bit data B<1:0>, B<3:2>, B<5:4> and <7:6> of the unit data as one unit.

When the chip enable signal CECR=0 and the write signals WECR<0> to WECR<3> are all "1", data is read out from the selected redundancy memory cell 19 in each of the memory cell groups 18a to 18h and outputted to the control unit 4 as 8-bit data DQR<7:0>.

When the chip enable signal CECR=0 and only the write signal WECR<0>="0" among the write signals WECR<3:0>, if the data DIR<7:0> is inputted from the control unit 4, only data DIR<1:0> among the inputted data DIR<7:0> is written into the selected redundancy memory cell 19 corresponding to the bits <1:0>.

When the chip enable signal CECR=0 and only the write signal WECR<1>="0" among the write signals WECR<3:0>, only data DIR<3:2> among the inputted data DIR<7:0> is written into the selected redundancy memory cell 19 corresponding to the bits <3:2>.

When the chip enable signal CECR=0 and only the write signal WECR<2>="0" among the write signals WECR<3:0>, only data DIR<5:4> among the inputted data DIR<7:0> is written into the selected redundancy memory cell 19 corresponding to the bits <5:4>.

When the chip enable signal CECR=0 and only the write signal WECR<3>="0" among the write signals WECR<3:0>, only data DIR<7:6> among the inputted data DIR<7:0> is written into the selected redundancy memory cell 19 corresponding to the bits <7:6>.

The normal RAMs 2a and 2b and the redundancy RAM 3 which have the above constitutions do not have a redundancy circuit therein for replacement of the memory cells thereof and can be automatically generated by a general module generator.

Next, discussion will be made on a method of replacing the normal memory cell array 17 in the normal RAMs 2a and 2b by the redundancy memory cell array 18 in the redundancy RAM 3. FIGS. 12 and 13 also show a replacement mapping in replacing the normal RAMs 2a and 2b by the redundancy RAM 3, and the following discussion will be made referring to these figures.

As indicated by the broken line in FIG. 12, the normal memory cell array 17 in each of the normal RAMs 2a and 2b is logically divided in advance into a plurality of sections extending in the row direction or the column direction. A section A in the column direction is constituted of a plurality of normal memory cells 16 aligned in the column direction, more specifically, a plurality of normal memory cells 16 arranged in a matrix with 512 rows and 2 columns. In more detail, the section A is constituted of a plurality of normal memory cells 16 arranged in two adjacent columns. For example, the section A in the normal memory cell group 17c which is finely hatched in FIG. 12 is constituted of a plurality of normal memory cells 16 arranged in 2 columns specified by the column address YN<4:0>=2, 3 (in decimal). The normal memory cell array 17 has 16 sections A per one bit of the unit data, in total 128 sections A.

In two bits of the unit data whose bit positions are adjacent to each other, two sections A specified by the column addresses YN<4:0> having the same value, corresponding to the respective bits, are paired. Specifically, two sections A specified by the column addresses YN<4:0> having the same value corresponding to the bits B<0> and B<1> are paired. Herein, since one section A includes two columns of normal memory cells 16. Therefore, in the two sections A specified by the column addresses YN<4:0> having the same value, two pairs of the two values of the column addresses YN<4:0> representing the two columns coincide with each other.

Similarly, two sections A are paired which correspond to the bits B<2> and B<3> respectively and which are specified by the column addresses YN<4:0> having the same value, two sections A are paired which correspond to the bits B<4> and B<5> respectively and which are specified by the column addresses YN<4:0> having the same value and two sections A are paired which correspond to the bits B<6> and B<7> respectively and which are specified by the column addresses YN<4:0> having the same value.

Herein, in each of the normal RAMs 2a and 2b and the redundancy RAM 3, pairs of two bits, which are subsets of 8 bits constituting unit data, i.e., one word, specifically, the bits B<1:0>, B<3:2>, B<5:4> and B<7:6> are referred to as subwords B<1:0>, B<3:2>, B<5:4> and B<7:6>, respectively. Further, the subwords B<1:0>, B<3:2>, B<5:4> and B<7:6> are sometimes referred to as the zeroth subword the first subword, the second subword and the third subword, respectively.

The above-discussed pair of sections A is a replacement unit for replacement carried out to relieve a defective normal memory cell array 17 and replaced by the redundancy memory cell array 18 of the redundancy RAM 3. Thus, an operation for replacing the normal memory cells aligned in the column direction by the redundancy RAM is referred to as "column replacement". The replacement unit in column replacement, such as the pair of sections A, is referred to as a "column replacement unit". Further, each column replacement unit corresponding to the zeroth subword B<1:0> is the zeroth column replacement unit, each column replacement unit corresponding to the first subword B<3:2> is the first column replacement unit, each column replacement unit corresponding to the second subword B<5:4> is the second column replacement unit and each column replacement unit corresponding to the third subword B<7:6> is the third column replacement unit.

In the normal RAM 2 consisting of the normal RAMs 2a and 2b, there are 128 column replacement units. The control unit 4 defines these 128 column replacement units with respect to the normal memory cell area 17 in advance.

A section B in the row direction is constituted of a plurality of normal memory cells 16 aligned in the row direction, more specifically, a plurality of normal memory cells 16 arranged in a matrix with 2 rows and 256 columns. In more detail, the section B is constituted of a plurality of normal memory cells 16 arranged in two adjacent rows. For example, the section B which is roughly hatched in FIG. 12 is constituted of a plurality of normal memory cells 16 arranged in 2 rows specified by the row addresses XN<8:0>=4, 5 (in decimal). The section B, like the above-discussed pair of sections A, is also a replacement unit for replacement carried out to relieve a defective normal memory cell array 17 and replaced by the redundancy memory cell array 18 of the redundancy RAM 3. Thus, an operation for replacing the normal memory cells aligned in the row direction by the redundancy RAM is referred to as "row replacement". The replacement unit in row replacement, such as one section B, is referred to as a "row replacement unit". Further, when it is not necessary to differentiate between the row replacement unit and the above-discussed column replacement unit, each of these are sometimes referred to simply as a "replacement unit".

In the normal RAM 2 consisting of the normal RAMs 2a and 2b, there are 512 row replacement units. The control unit 4 defines these 512 row replacement units with respect to the normal memory cell area 17 in advance.

The redundancy memory cell array 18 of the redundancy RAM 3 is logically divided in advance into four redundancy sections C and four redundancy sections D, as shown in FIG. 13. One redundancy section C is constituted of a plurality of redundancy memory cells 19 arranged in a matrix with 128 rows and 16 columns, covering two bits of the unit data whose bit positions are adjacent to each other. Specifically, one redundancy section C is constituted of the redundancy memory cells 19 which are arranged in rows specified by a range of the row addresses XR<7:0>=0 to 127 (in decimal) and correspond to the subword B<1:0>.

Similarly, another redundancy section C is constituted of the redundancy memory cells 19 which are arranged in rows specified by a range of the row addresses XR<7:0>=0 to 127 (in decimal) and correspond to the subword B<3:2>, still another redundancy section C is constituted of the redundancy memory cells 19 which are arranged in rows specified by a range of the row addresses XR<7:0>=0 to 127 (in decimal) and correspond to the subword B<5:4> and further one redundancy section C is constituted of the redundancy memory cells 19 which are arranged in rows specified by a range of the row addresses XR<7:0>=0 to 127 (in decimal) and correspond to the subword B<7:6>. The redundancy sections C corresponding to the subwords B<1:0>, B<3:2>, B<5:4> and B<7:6> are the zeroth redundancy section C, the first redundancy section C, the second redundancy section C and the third redundancy section C, respectively.

One redundancy section D is constituted of a plurality of redundancy memory cells 19 arranged in a matrix with 8 rows and 64 columns. A plurality of redundancy memory cells 19 arranged in rows (32 rows) specified by a range of the row addresses XR<7:0>=128 to 159 (in decimal) are logically divided into four redundancy sections D. The redundancy section D corresponding to the rows specified by a range of the row addresses XR<7:0>=128 to 135 (in decimal) is referred to as the zeroth redundancy section D, the redundancy section D corresponding to the rows specified by a range of the row addresses XR<7:0>=136 to 143 (in decimal) is referred to as the first redundancy section D, the redundancy section D corresponding to the rows specified by a range of the row addresses XR<7:0>=144 to 151 (in decimal) is referred to as the second redundancy section D and the redundancy section D corresponding to the rows represented by a range of the row addresses XR<7:0>=152 to 159 (in decimal) is referred to as the third redundancy section D. The control unit 4 defines these redundancy sections C and D with respect to the redundancy memory cell area 18 in advance.

In the semiconductor memory device 1 of the first preferred embodiment, when the normal memory cell array 17 has a defect and the column replacement is performed, the column replacement unit of the normal memory cell array 17 corresponding to the defective portion can be replaced by an arbitrary redundancy section C of the redundancy memory cell array 18 by a control of the control unit 4. For example, the column replacement unit corresponding to the subword B<3:2> (the pair of sections A) which is finely hatched in FIG. 12 can be replaced by the redundancy section C corresponding to the subword B<1:0> which is finely hatched in FIG. 13.

When the row replacement is performed, the row replacement unit of the normal memory cell array 17 corresponding to the defective portion can be replaced by an arbitrary redundancy section D of the redundancy memory cell array 18 by a control of the control unit 4. For example, the row replacement unit (the section B) which is roughly hatched in FIG. 12 can be replaced by the redundancy section D which is roughly hatched in FIG. 13.

In this case, since the redundancy RAM 3 comprises four redundancy sections C, the control unit 4 can replace four column replacement units at the maximum. Similarly, since the redundancy RAM 3 comprises four redundancy sections D, the control unit 4 can replace four row replacement units at the maximum.

The column replacement unit and the redundancy section C have an equal number of memory cells and different shapes. The row replacement unit and the redundancy section D have an equal number of memory cells and different shapes. The control unit 4 perform an address scramble discussed later on the redundancy RAM 3 to allow a mapping of memory spaces having different shapes and an equal area. As a result, in the semiconductor memory device 1, it becomes possible to replace a section by another section of different shape.

Figure 4:
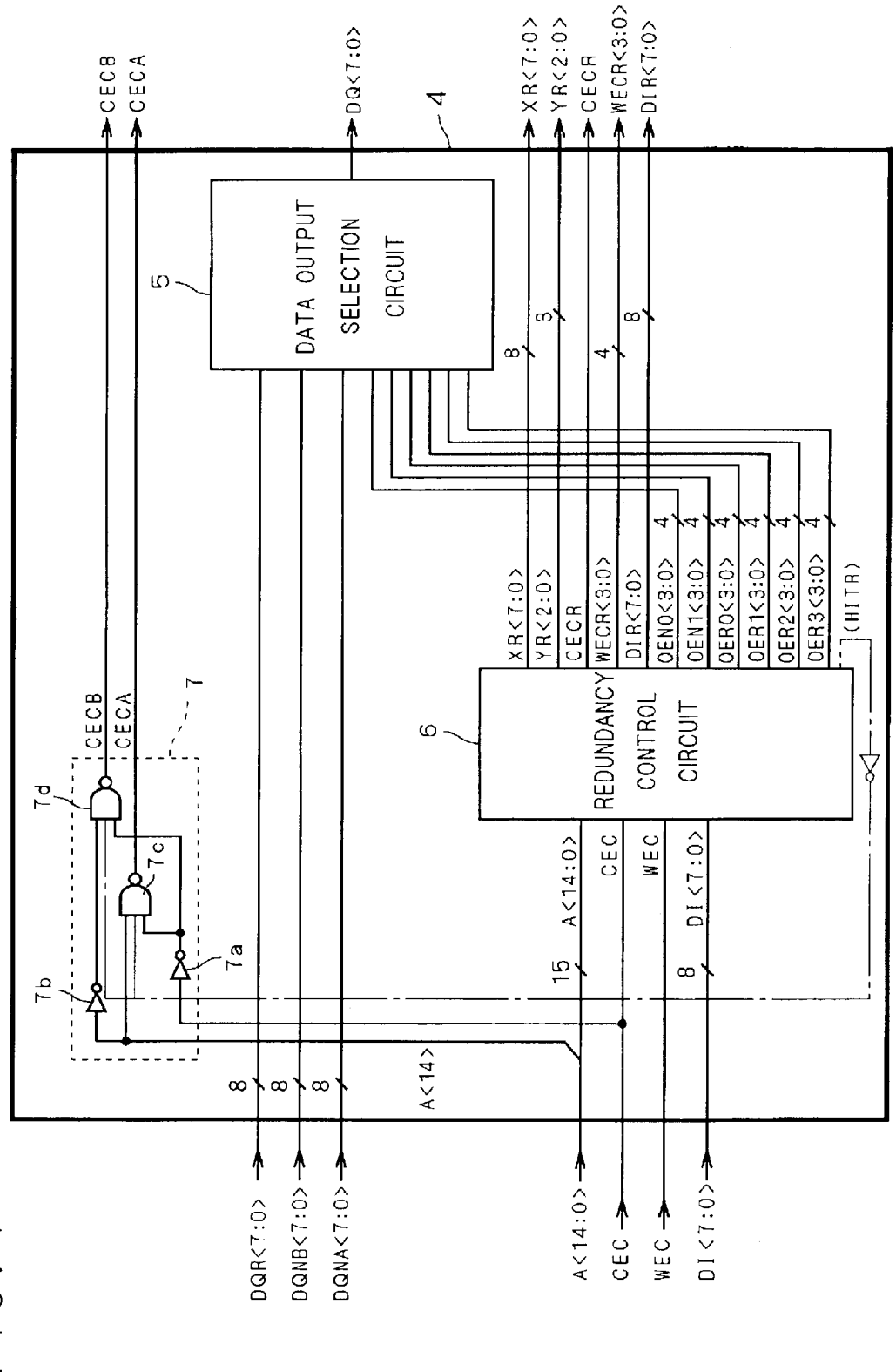

Next, discussion will be made on an internal constitution of the control unit 4 for performing such replacements. As shown in FIG. 4, the control unit 4 comprises a data output selection circuit 5, a redundancy control circuit 6 and a normal RAM selection circuit 7.

The normal RAM selection circuit 7 is a circuit for selecting either one of the normal RAMs 2a and 2b according to the address A<14> and the chip enable signal CEC which are inputted. The normal RAM selection circuit 7 comprises inverters 7a and 7b and NAND circuits 7c and 7d. The inverter 7a inverts the chip enable signal CEC and outputs the inverted signal to the NAND circuit 7c. The inverter 7b inverts the address A<14> and outputs the inverted address to the NAND circuit 7d. The NAND circuit 7c performs a NAND operation of the output from the inverter 7a and the address A<14> and outputs the operation result to the normal RAM 2a as the chip enable signal CECA. The NAND circuit 7d performs a NAND operation of the output from the inverter 7b and the output from the inverter 7a and outputs the operation result to the normal RAM 2b as the chip enable signal CECB.

The normal RAM selection circuit 7 having such a constitution outputs the chip enable signal CECA of 1 and the chip enable signal CECB of 1 when the chip enable signal CEC is "1". Further, the normal RAM selection circuit 7 outputs the chip enable signal CECA of 1 and the chip enable signal CECB of 0 when the chip enable signal CEC is "0" and the address <14> is "0", and outputs the chip enable signal CECA of 0 and the chip enable signal CECB of 1 when the chip enable signal CEC is "0" and the address <14> is "1".

Figure 5:
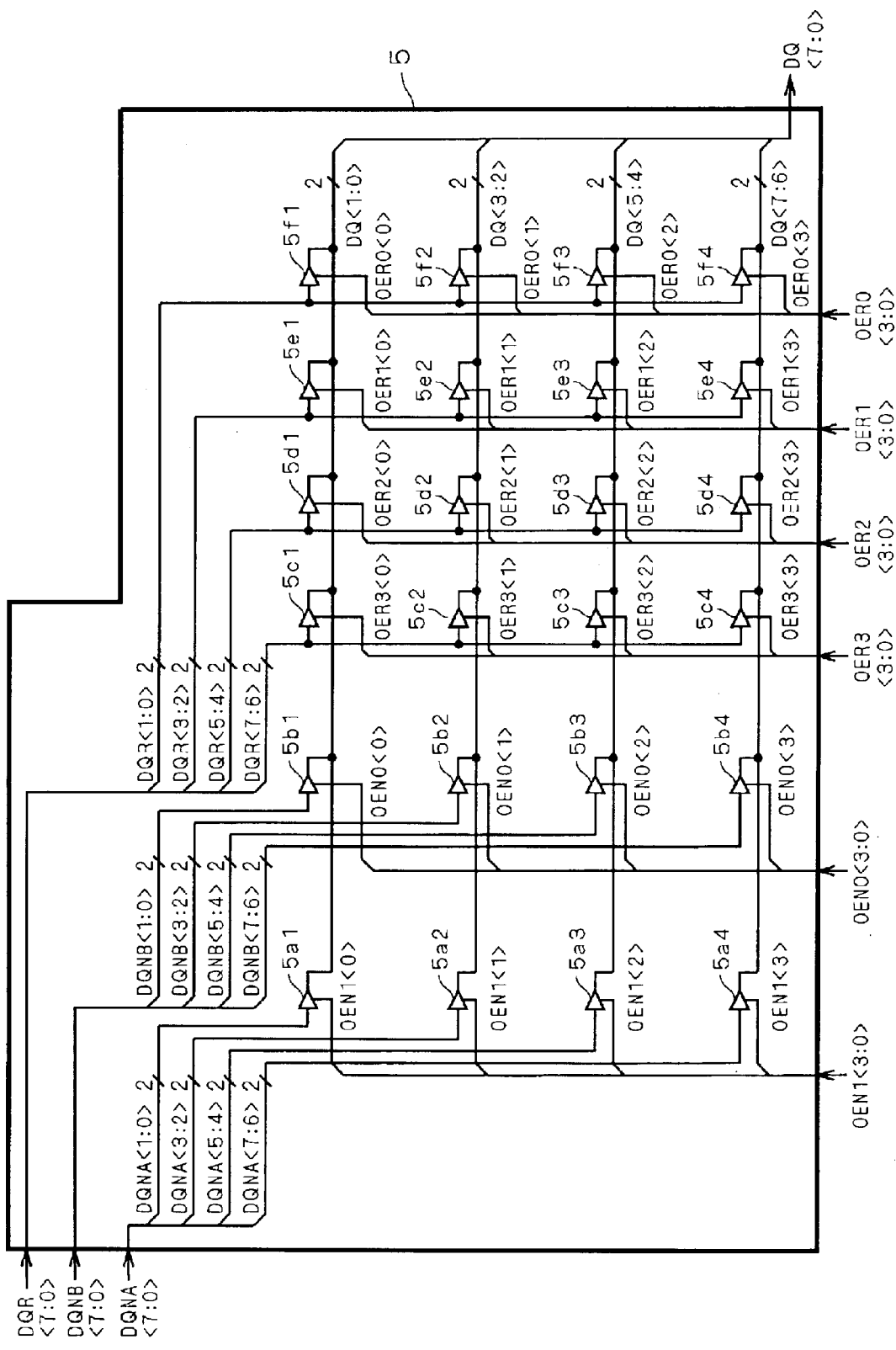

FIG. 5 is a circuit diagram showing a configuration of the data output selection circuit 5. As shown in FIG. 5, the data output selection circuit 5 comprises tristate buffers 5a1 to 5a4 for connecting data output terminals 2a1 of the normal RAM 2a and the data output terminals 1a1 of the semiconductor memory device 1, tristate buffers 5b1 to 5b4 for connecting data output terminals 2b1 of the normal RAM 2b and the data output terminals 1a1 of the semiconductor memory device 1 and tristate buffers 5c1 to 5c4, 5d1 to 5d4, 5e1 to 5e4 and 5f1 to 5f4 for connecting data output terminals 3a1 of the redundancy RAM 3 and the data output terminals 1a1 of the semiconductor memory device 1. The tristate buffers 5a1 to 5a4, 5b1 to 5b4, 5c1 to 5c4, 5d1 to 5d4, 5e1 to 5e4 and 5f1 to 5f4 are sometimes referred to collectively as "tristate buffer 5W".

Data DQNA<1:0>, DQNA<3:2>, DQNA<5:4> and DQNA<7:6> outputted from the normal RAM 2a are inputted to the tristate buffers 5a1 to 5a4, respectively. Data DQNB<1:0>, DQNB<3:2>, DQNB<5:4> and DQNB<7:6> outputted from the normal RAM 2b are inputted to the tristate buffers 5b1 to 5b4, respectively. Data DQR<7:6> outputted from the redundancy RAM 3 is inputted to all the tristate buffers 5c1 to 5c4 and data DQR<5:4> is inputted to all the tristate buffers 5d1 to 5d4. Data DQR<3:2> is inputted to all the tristate buffers 5e1 to 5e4 and data DQR<1:0> is inputted to all the tristate buffers 5f1 to 5f4.

Each tristate buffer 5W consists two subtristate buffers. In each tristate buffer 5W, one of the inputted signals is inputted to one subtristate buffer and the other of the inputted signal is inputted to the other subtristate buffer. For example, data DQNA<1> is inputted to one of the subtristate buffers included in the tristate buffer 5a1 and data DQNB<0> is inputted to the other.

Among the tristate buffers 5a1, 5b1, 5c1, 5d1, 5e1 and 5f1, outputs of the subtristate buffers to which the lower order bit of the inputted data is inputted (hereinafter, referred to as "lower subtristate buffer") are connected to one another and outputs of the subtristate buffers to which the higher order bit of the inputted data is inputted (hereinafter, referred to as "higher subtristate buffer") are connected to one another. For example, the output of the lower subtristate buffer in the tristate buffer 5a1 to which the data DQNA<0> is inputted, the output of the lower subtristate buffer in the tristate buffer 5b1 to which the data DQNB<0> is inputted, the output of the lower subtristate buffer in the tristate buffer 5c1 to which the data DQR<6> is inputted, the output of the lower subtristate buffer in the tristate buffer 5d1 to which the data DQR<4> is inputted, the output of the lower subtristate buffer in the tristate buffer 5e1 to which the data DQR<2> is inputted and the output of the lower subtristate buffer in the tristate buffer 5f1 to which the data DQR<0> is inputted are connected to one another.

Similarly, among the tristate buffers 5a2, 5b2, 5c2, 5d2, 5e2 and 5f2, outputs of the lower subtristate buffers are connected to one another and outputs of the higher subtristate buffers are connected to one another. Further, among the tristate buffers 5a3, 5b3, 5c3, 5d3, 5e3 and 5f3, outputs of the lower subtristate buffers are connected to one another and outputs of the higher subtristate buffers are connected to one another. Furthermore, among the tristate buffers 5a4, 5b4, 5c4, 5d4, 5e4 and 5f4, outputs of the lower subtristate buffers are connected to one another and outputs of the higher subtristate buffers are connected to one another.

To the data output selection circuit 5, enable signals OEN0<3:0>, ONE1<3:0>, OER0<3:0>, OER1<3:0>, OER2<3:0> and OER3<3:0> outputted from the redundancy control circuit 6 are inputted.

The tristate buffers 5a1 to 5a4 are controlled on activation/inactivation by the enable signals OEN1<0> to OEN1<3>, respectively. In other words, in each of the tristate buffers 5a1 to 5a4, the outputs of the two subtristate buffers are simultaneously controlled by one enable signal. The output of the data DQNA<7:0> to the output terminals 1a1 of the semiconductor memory device 1 is thereby controlled on a subword basis.

The tristate buffers 5b1 to 5b4 are controlled on activation/inactivation by the enable signals OEN0<0> to OEN0<3>, respectively. The output of the data DQNB<7:0> to the output terminals 1a1 of the semiconductor memory device 1 is thereby controlled on a subword basis.

The tristate buffers 5c1 to 5c4 are controlled on activation/inactivation by the enable signals OER3<0> to OER3<3>, and the tristate buffers 5d1 to 5d4 are controlled on activation/inactivation by the enable signals OER2<0> to OER2<3>, respectively. Further, the tristate buffers 5e1 to 5e4 are controlled on activation/inactivation by the enable signals OER1<0> to OER1<3>, and the tristate buffers 5f1 to 5f4 are controlled on activation/inactivation by the enable signals OER0<0> to OER0<3>, respectively. The output of the data DQR<7:0> to the output terminals 1a1 of the semiconductor memory device 1 is thereby controlled on a subword basis.

Any one of the tristate buffers 5a1, 5b1, 5c1, 5d1, 5e1 and 5f1 is activated, and the output of the lower subtristate buffer of the activated tristate buffer is outputted to the outside of the semiconductor memory device 1 through the output terminal 1a1 thereof as data DQ<0> and the output of the higher subtristate buffer thereof is outputted to the outside of the semiconductor memory device 1 through the output terminal 1a1 thereof as data DQ<1>.

Any one of the tristate buffers 5a2, 5b2, 5c2, 5d2, 5e2 and 5f2 is activated, and the output of the lower subtristate buffer of the activated tristate buffer is outputted to the outside of the semiconductor memory device 1 through the output terminal 1a1 thereof as data DQ<2> and the output of the higher subtristate buffer thereof is outputted to the outside of the semiconductor memory device 1 through the output terminal 1a1 thereof as data DQ<3>.

Any one of the tristate buffers 5a3, 5b3, 5c3, 5d3, 5e3 and 5f3 is activated, and the output of the lower subtristate buffer of the activated tristate buffer is outputted to the outside of the semiconductor memory device 1 through the output terminal 1a1 thereof as data DQ<4> and the output of the higher subtristate buffer thereof is outputted to the outside of the semiconductor memory device 1 through the output terminal 1a1 thereof as data DQ<5>.

Any one of the tristate buffers 5a4, 5b4, 5c4, 5d4, 5e4 and 5f4 is activated, and the output of the lower subtristate buffer of the activated tristate buffer is outputted to the outside of the semiconductor memory device 1 through the output terminal 1a1 thereof as data DQ<6> and the output of the higher subtristate buffer thereof is outputted to the outside of the semiconductor memory device 1 through the output terminal 1a1 thereof as data DQ<7>. Further, when the enable signals OEN0<3:0>, OEN1<3:0>, OER0<3:0>, OER1<3:0>, OER2<3:0> and OER3<3:0> are "1", the tristate buffers are activated and output the inputted signals without any change, and when these enable signals are "0", the tristate buffers are inactivated and the outputs thereof come into a high impedance state.

Figure 6:
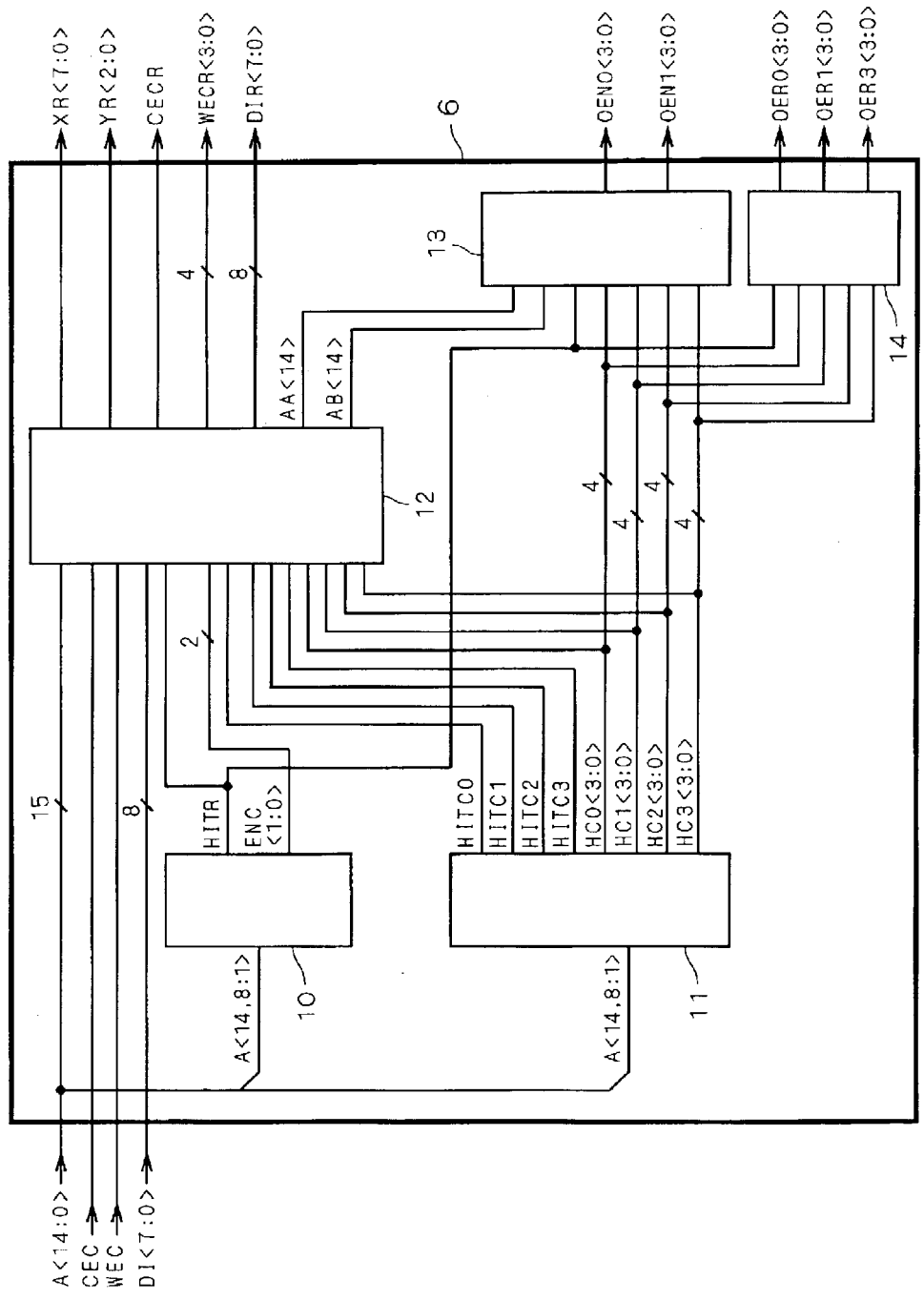

FIG. 6 is a block diagram showing a constitution of the redundancy control circuit 6. As shown in FIG. 6, the redundancy control circuit 6 comprises a row replacement selection circuit 10, a column replacement selection circuit 11, a redundancy RAM control circuit 12 and enable signal output circuits 13 and 14.

Figure 7:
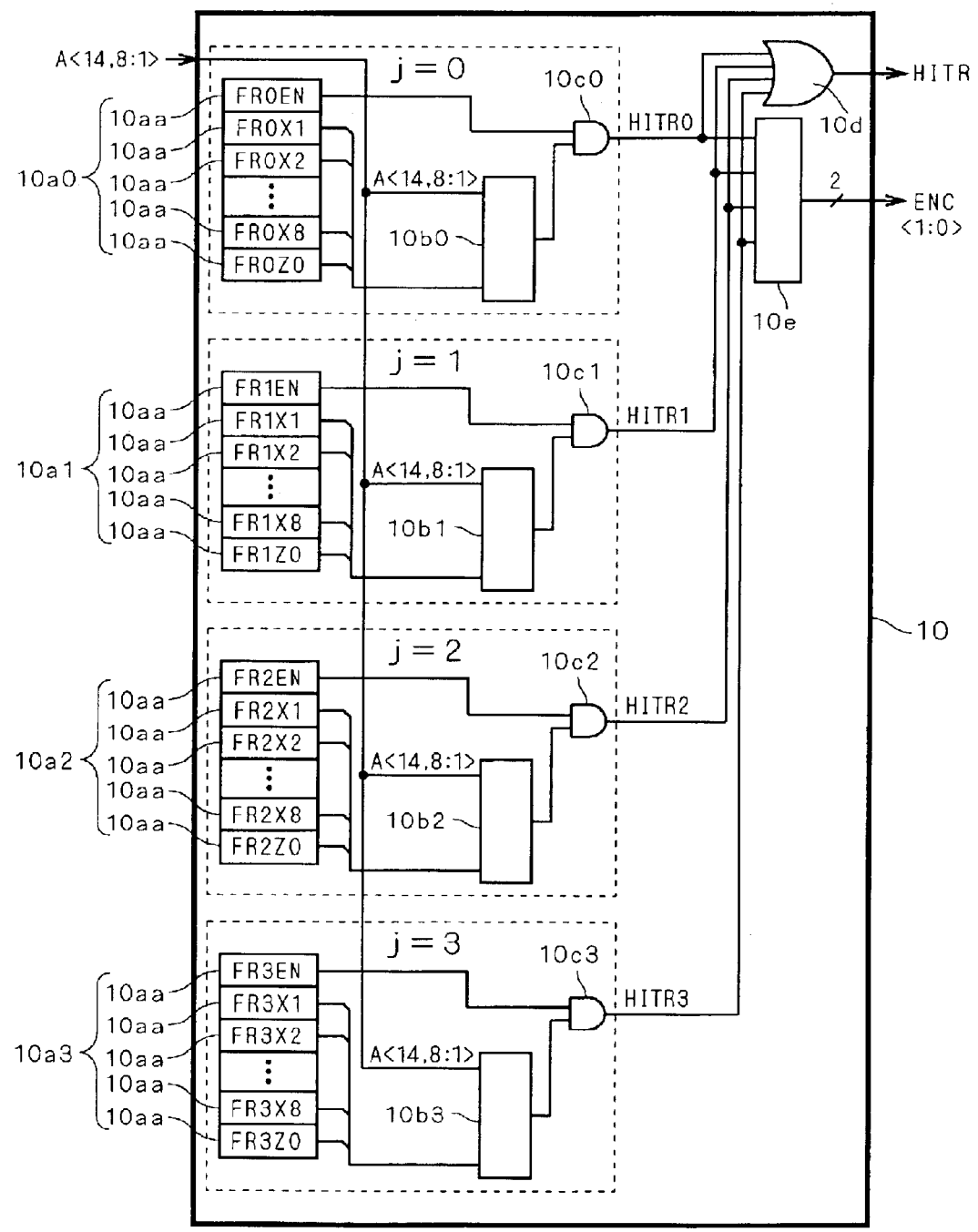

FIG. 7 is a circuit diagram showing a configuration of the row replacement selection circuit 10. As shown in FIG. 7, the row replacement selection circuit 10 comprises fuse circuits 10aj (j=0 to 3), redundancy row address comparator circuits 10bj (j=0 to 3), AND circuits 10cj (j=0 to 3), an OR circuit 10d and a redundancy row address encoder 10e.

The fuse circuit 10aj outputs enable signals FRjEN (j=0 to 3) to the AND circuit 10cj and outputs addresses FRjX1 to FRjX8 and FRjZ0 (j=0 to 3) to the redundancy row address comparator circuit 10bj. The fuse circuit 10aj is provided with ten unit fuse blocks 10aa. Each unit fuse block 10aa is provided with a fuse (not shown) and a fuse judgment circuit (not shown) for judging whether the fuse is broken (programmed) or not. The ten fuse judgment circuits output the enable signal FRjEN and the addresses FRjX1 to FRjX8 and FRjZ0 respectively.

Each of the enable signal FRjEN and the addresses FRjX1 to FRjX8 and FRjZ0 indicates "1" when the fuse on which whether there is a break or not is judged by the fuse judgment circuit which outputs the enable signal and the addresses is broken by laser trimming or application of high voltage and indicates "0" when the fuse is not broken.

An address A<14, 8:1> is also inputted to the redundancy row address comparator circuit 10bj. The redundancy row address comparator circuit 10bj performs comparisons between the address A<1> and the address FRjX1, between the address A<2> and the address FRjX2, between the address A<3> and the address FRjX3, between the address A<4> and the address FRjX4, between the address A<5> and the address FRjX5, between the address A<6> and the address FRjX6, between the address A<7> and the address FRjX7, between the address A<8> and the address FRjX8 and between the address A<14> and the address FRjZ0, and outputs "1" when all the comparison result indicate coincidence and otherwise outputs "0".

The AND circuit 10cj performs an AND operation of the output from the redundancy row address comparator circuit 10bj and the enable signal FRjEN and outputs the operation result to the OR circuit 10d and the redundancy row address encoder 10e as a hit signal HITRj (j=0 to 3). The OR circuit 10d performs an OR operation of the inputted hit signals HITR0 to HITR3 and outputs the operation result to the redundancy RAM control circuit 12 as a hit signal HITR.

The redundancy row address encoder 10e outputs a 2-bit encode signal ENC<1:0> to the redundancy RAM control circuit 12 on the basis of the inputted hit signals HITR0 to HITR3. FIG. 14 is a table showing a relation between values of the encode signal ENC and values of the hit signals HITR0 to HITR3. As shown in FIG. 14, the encode signal ENC<1:0> indicates (0, 0) when the hit signal HITR0 is "1", the encode signal ENC<1:0> indicates (0, 1) when the hit signal HITR0 is "0" and the hit signal HITR1 is "1" and the encode signal ENC<1:0> indicates (1, 0) when the hit signal HITR0 is "0", the hit signal HITR1 is "0" and the hit signal HITR2 is "1". The encode signal ENC<1:0> indicates (1, 1) when the hit signal HITR0 is "0", the hit signal HITR1 is "0", the hit signal HITR2 is "0" and the hit signal HITR3 is 1 or all the hit signals HITR0 to HITR3 are "0".

Figure 8:
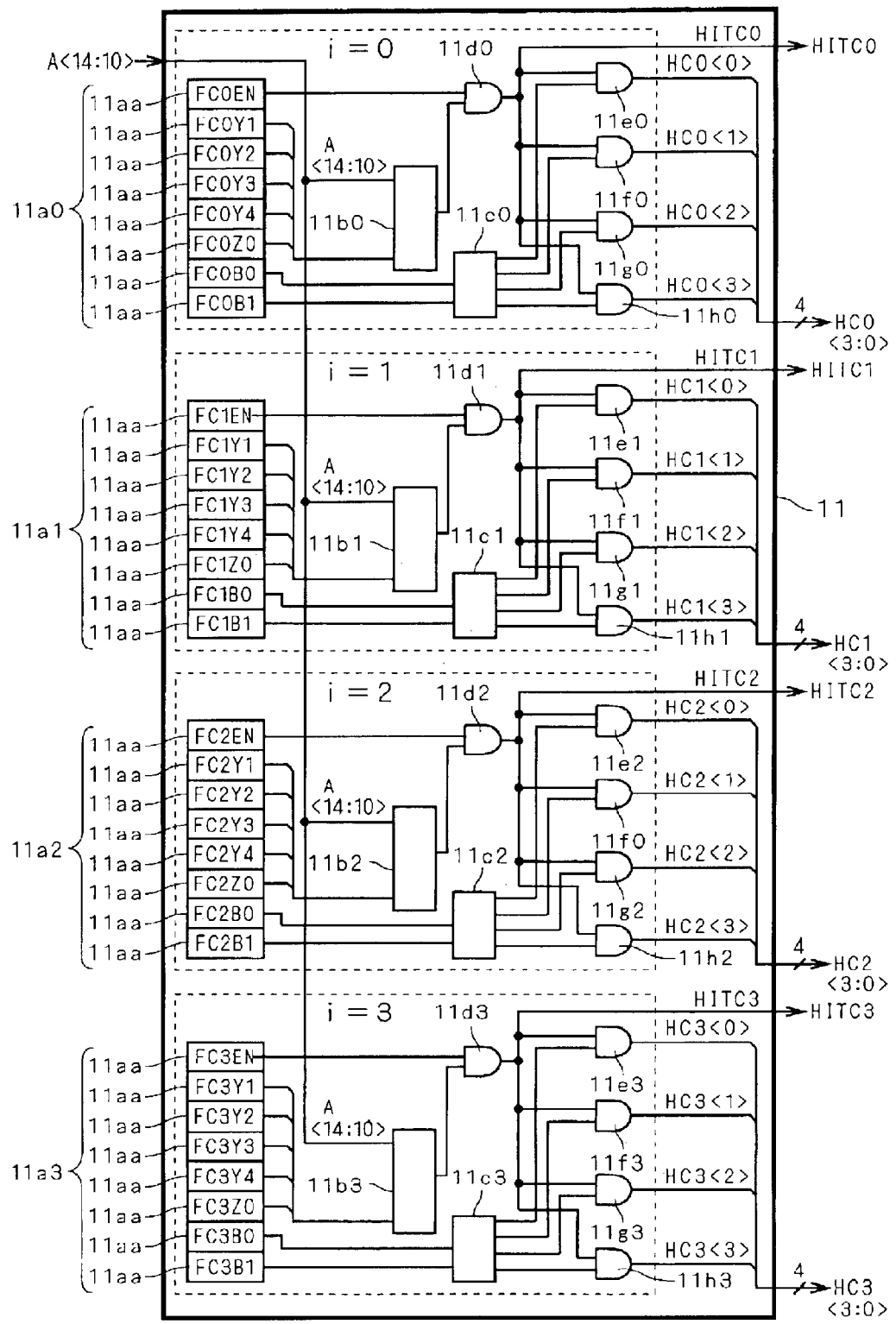

FIG. 8 is a circuit diagram showing a configuration of the column replacement selection circuit 11. As shown in FIG. 8, the column replacement selection circuit 11 comprises fuse circuits 11ai (i=0 to 3), redundancy row address comparator circuits 11bi (i=0 to 3), redundancy column subword decoder 11ci (i=0 to 3) and AND circuits 11di, 11ei, 11fi, 11gi and 11hi (i=0 to 3).

The fuse circuit 11ai outputs enable signals FCiEN (i=0 to 3) and addresses FCiY1 to FCiY4 and FCiZ0 (i=0 to 3) and subword selection signals FCiB0 and FCiB1. The fuse circuit 11ai is provided with eight unit fuse blocks 11aa. Each unit fuse block 11aa is provided with a fuse (not shown) and a fuse judgment circuit (not shown) for judging whether the fuse is broken (programmed) or not. The eight fuse judgment circuits output the enable signal FCiEN and the addresses FCiY1 to FCiY4 and FCiZ0 and the subword selection signals FCiB0 and FCiB1 respectively.

Each of the enable signal FCiEN and the addresses FCiY1 to FCiY4 and FCiZ0 (i=1 to 3) and the subword selection signals FCiB0 and FCiB1 indicates "1" when the fuse on which whether there is a break or not is judged by the fuse judgment circuit which outputs the enable signal, the addresses and the subword selection signals is broken by laser trimming or application of high voltage and indicates "0" when the fuse is not broken.

An address A<14:10> and the addresses FCiY1 to FCiY4 and FCiZ0 are inputted to the redundancy column address comparator circuit 11bi. The redundancy column address comparator circuit 11bi performs comparisons between the address A<10> and the address FCiY1, between the address A<11> and the address FCiY2, between the address A<12> and the address FCiY3, between the address A<13> and the address FCiY4 and between the address A<14> and the address FCiZ0, and outputs "1" when all the comparison results indicate coincidence and otherwise outputs "0".

The redundancy column subword decoder 11ci, receiving the subword selection signals FCiB0 and FCiB1, outputs "1" or "0" to each of the AND circuits 11ei to 11hi on the basis of the subword selection signals. The redundancy column subword decoder 11ci outputs "1" to the AND circuit 11ei and "0" to the AND circuits 11fi to 11hi when the subword selection signal FCiB0 is "0" and the subword selection signal FCiB1 is "0". Further, the redundancy column subword decoder 11ci outputs "1" to the AND circuit 11fi and "0" to the AND circuits 11ei, 11gi and 11hi when the subword selection signal FCiB0 is "1" and the subword selection signal FCiB1 is "0", outputs "1" to the AND circuit 11gi and "0" to the AND circuits 11ei, 11fi and 11hi when the subword selection signal FCiB0 is "0" and the subword selection signal FCiB1 is "1", and outputs "1" to the AND circuit 11hi and "0" to the AND circuits 11ei to 11gi when the subword selection signal FCiB0 is "1" and the subword selection signal FCiB1 is "1".

The AND circuit 11di performs an AND operation of the output from the redundancy column address comparator circuit 11bi and the enable signal FCiEN and outputs the operation result to the AND circuits 11ei to 11hi and the redundancy RAM control circuit 12 as a hit signal HITCi (i=0 to 3). The AND circuit 11ei performs an AND operation of the hit signal HITCi and the signal received from the redundancy column subword decoder 11ci and outputs the operation result to the enable signal output circuit 13 and the redundancy RAM control circuit 12 as a signal HCi<0>. The AND circuit 11fi performs an AND operation of the hit signal HITCi and the signal received from the redundancy column subword decoder 11ci and outputs the operation result to the enable signal output circuit 13 and the redundancy RAM control circuit 12 as a signal HCi<1>. The AND circuit 11gi performs an AND operation of the hit signal HITCi and the signal received from the redundancy column subword decoder 11ci and outputs the operation result to the enable signal output circuit 13 and the redundancy RAM control circuit 12 as a signal HCi<2>. The AND circuit 11hi performs an AND operation of the hit signal HITCi and the signal received from the redundancy column subword decoder 11ci and outputs the operation result to the enable signal output circuit 13 and the redundancy RAM control circuit 12 as a signal HCi<3>.

Figure 9:
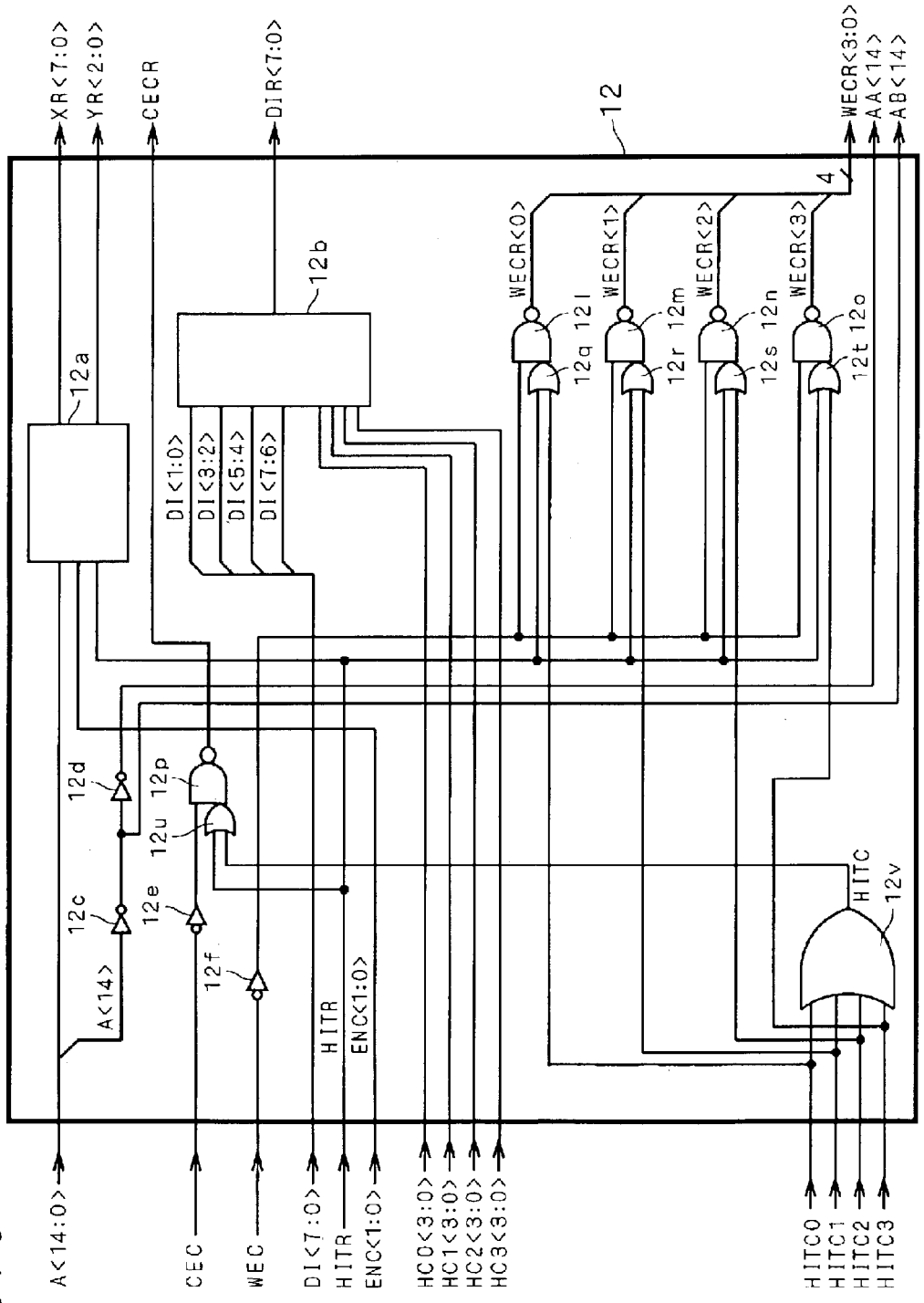

FIG. 9 is a circuit diagram showing a configuration of the redundancy RAM control circuit 12. As shown in FIG. 9, the redundancy RAM control circuit 12 comprises an address scramble circuit 12a, a data input subword selection circuit 12b, inverters 12c to 12f, NAND circuits 12l to 12p and OR circuits 12q to 12v.

The inverter 12c inverts the address A<14> and outputs the inverted signal to the inverter 12d, and further outputs the inverted signal to the enable signal output circuit 13 as an address AB<14>.

The inverter 12d inverts the output from the inverter 12c and outputs the inverted signal to the enable signal output circuit 13 as an address AA<14>. The address AA<14> is a signal equivalent to the address A<14>.

The inverter 12e inverts the chip enable signal CEC and outputs the inverted signal to the NAND circuit 12p. The inverter 12f inverts the write signal WEC and outputs the inverted signal to each of the NAND circuits 12l to 12o. The OR circuit 12v performs an OR operation of the hit signals HITC0 to HHITC3 and outputs the operation result to the OR circuit 12u as the hit signal HITC. The OR circuit 12u performs an OR operation of the hit signals HITR and HITC and outputs the operation result to the NAND circuit 12p. The NAND circuit 12p performs a NAND operation of the output from the inverter 12e and the output of the OR circuit 12u and outputs the operation result to the redundancy RAM 3 as the chip enable signal CECR.

The OR circuit 12q performs an OR operation of the hit signals HITR and HITC0 and outputs the operation result to the NAND circuit 12l. The OR circuit 12r performs an OR operation of the hit signals HITR and HITC1 and outputs the operation result to the NAND circuit 12m. The OR circuit 12s performs an OR operation of the hit signals HITR and HITC2 and outputs the operation result to the NAND circuit 12n. The OR circuit 12t performs an OR operation of the hit signals HITR and HITC3 and outputs the operation result to the NAND circuit 12o.

The NAND circuit 12l performs a NAND operation of the output from the OR circuit 12q and the output from the inverter 12f and outputs the operation result to the redundancy RAM 3 as the write signal WECR<0>. The NAND circuit 12m performs a NAND operation of the output from the OR circuit 12r and the output from the inverter 12f and outputs the operation result to the redundancy RAM 3 as the write signal WECR<1>. The NAND circuit 12n performs a NAND operation of the output from the OR circuit 12s and the output from the inverter 12f and outputs the operation result to the redundancy RAM 3 as the write signal WECR<2>. The NAND circuit 12o performs a NAND operation of the output from the OR circuit 12t and the output from the inverter 12f and outputs the operation result to the redundancy RAM 3 as the write signal WECR<3>.

The address scramble circuit 12a outputs the row address XR<7:0> and the column address YR<2:0> to the redundancy RAM 3 on the basis of the address A<14:0>, the encode signal ENC<1:0> and the hit signal HITR. FIG. 15 is an address scramble table, indicating the row address XR<7:0> and the column address YR<2:0> outputted from the address scramble circuit 12a.

As shown in FIG. 15, when the hit signal HTIR is "1", the row address XR<7> is "1", the row address XR<6:5> is (0, 0), the row address XR<4:3> is equal to the encode signal ENC<1:0>, the row address XR<2:1> is equal to the address A<13:12>, the row address XR<0> is equal to the address A<0>, the column address YR<2:1> is equal to the address A<11:10> and the column address YR<0> is equal to the address A<9>. When the hit signal HTIR is "0", the row address XR<7> is "0", the row address XR<6:5> is equal to the address A<6:5>, the row address XR<4:3> is equal to the address A<4:3>, the row address XR<2:1> is equal to the address A<2:1>, the row address XR<0> is equal to the address A<0>, the column address YR<2:1> is equal to the address A<8:7> and the column address YR<0> is equal to the address A<9>.

The data input subword selection circuit 12b outputs the data DIR<7:0> to the redundancy RAM 3 on the basis of the data DI<7:0>, the hit signal HITR and the hit signals HCi<3:0> (i=0 to 3).

FIG. 16 is a table showing the data DIR<7:0> outputted from the data input subword selection circuit 12b. As shown in FIG. 16, when the hit signal HTIR is "1", the data DIR<7:0> is equal to the data DI<7:0>. In other words, the inputted data DI<7:0> is outputted without any change as the data DIR<7:0>. When the hit signal HTIR is "0", the data DIR<7:0> takes the values as follows.

The data DIR<1:0> is equal to the data DI<1:0> when the hit signal HC0<0> is "1", the data DIR<1:0> is equal to the data DI<3:2> when the hit signal HC0<1> is "1", the data DIR<1:0> is equal to the data DI<5:4> when the hit signal HC0<2> is "1", and the data DIR<1:0> is equal to the data DI<7:6> when the hit signal HC0<3> is "1". Further, the values of the data DIR<7:2> are undefined when the hit signal HC0<k> (k=0 to 3) is "1".

The data DIR<3:2> is equal to the data DI<1:0> when the hit signal HC1<0> is "1", the data DIR<3:2> is equal to the data DI<3:2> when the hit signal HC1<1> is "1", the data DIR<3:2> is equal to the data DI<5:4> when the hit signal HC1<2> is "1", and the data DIR<3:2> is equal to the data DI<7:6> when the hit signal HC1<3> is "1". Further, the values of the data DIR<7:4, 1:0> are undefined when the hit signal HC1<k> (k=0 to 3) is "1".

The data DIR<5:4> is equal to the data DI<1:0> when the hit signal HC2<0> is "1", the data DIR<5:4> is equal to the data DI<3:2> when the hit signal HC2<1> is "1", the data DIR<5:4> is equal to the data DI<5:4> when the hit signal HC2<2> is "1", and the data DIR<5:4> is equal to the data DI<7:6> when the hit signal HC2<3> is "1". Further, the values of the data DIR<7:4, 3:0> are undefined when the hit signal HC2<k> (k=0 to 3) is "1".

The data DIR<7:6> is equal to the data DI<1:0> when the hit signal HC3<0> is "1", the data DIR<7:6> is equal to the data DI<3:2> when the hit signal HC3<1> is "1", the data DIR<7:6> is equal to the data DI<5:4> when the hit signal HC3<2> is "1", and the data DIR<7:6> is equal to the data DI<7:6> when the hit signal HC3<3> is "1". Further, the value of the data DIR<5:0> are undefined when the hit signal HC3<k> (k=0 to 3) is "1".

Figure 10:
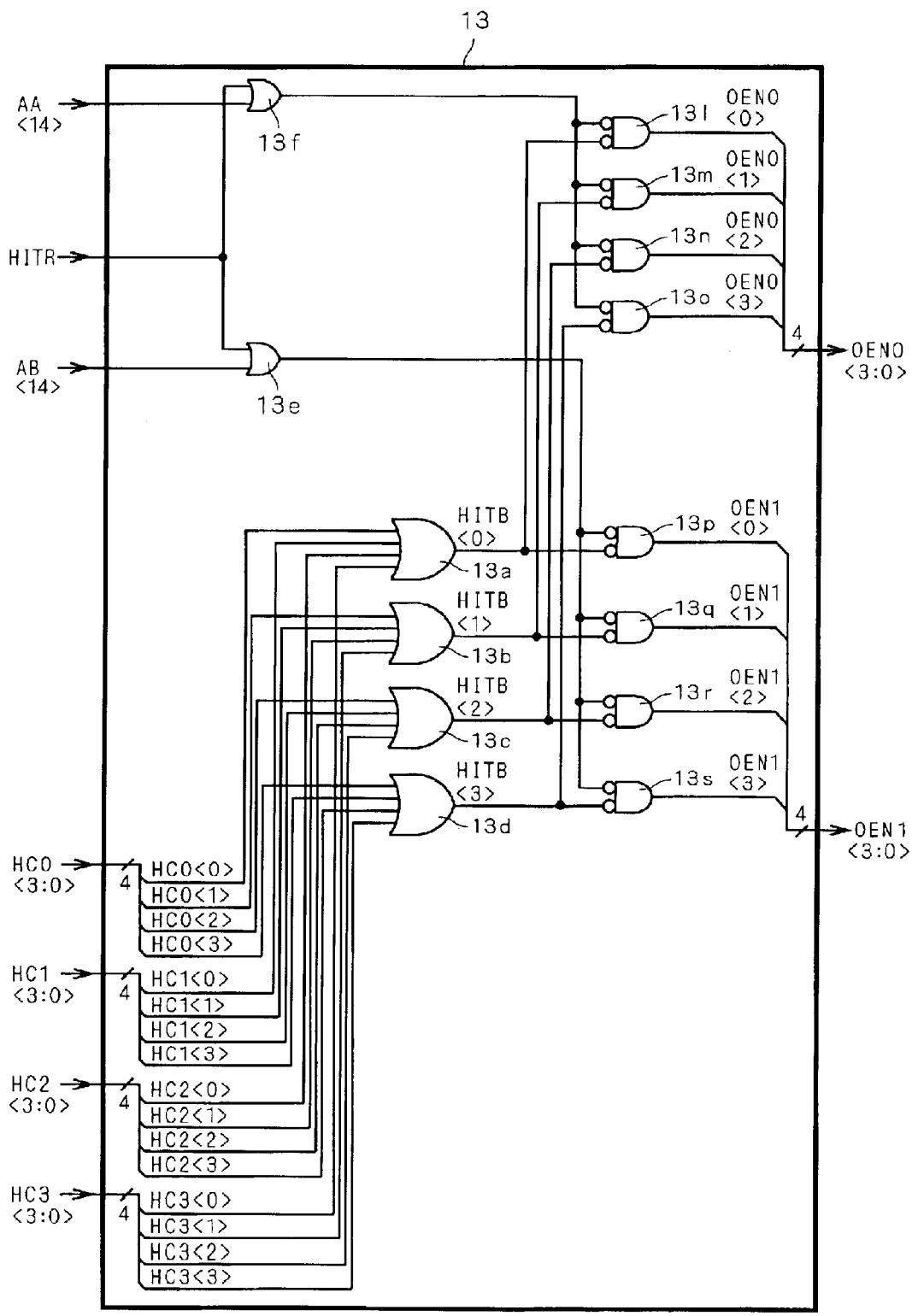

FIG. 10 is a circuit diagram showing a configuration of the enable signal output circuit 13. As shown in FIG. 10, the enable signal output circuit 13 comprises OR circuits 13a to 13f and the AND circuits 13l to 13s. The OR circuit 13a performs an OR operation of the hit signals HC0<0> to HC3<0> and outputs the operation result to the AND circuits 13l and 13p as a hit signal HITB<0>. The OR circuit 13b performs an OR operation of the hit signals HC0<1> to HC3<1> and outputs the operation result to the AND circuits 13m and 13q as a hit signal HITB<1>. The OR circuit 13c performs an OR operation of the hit signals HC0<2> to HC3<2> and outputs the operation result to the AND circuits 13n and 13r as a hit signal HITB<2>. The OR circuit 13d performs an OR operation of the hit signals HC0<3> to HC3<3> and outputs the operation result to the AND circuits 13o and 13s as a hit signal HITB<3>.

The OR circuit 13e performs an OR operation of the address AB<14> and the hit signal HITR and outputs the operation result to each of the AND circuits 13p and 13s. The OR circuit 13f performs an OR operation of the address AA<14> and the hit signal HITR and outputs the operation result to each of the AND circuits 13l and 13o.

The AND circuit 13l performs an AND operation of the NOT of the hit signal HITB<0> and the NOT of the output from the OR circuit 13f and outputs the operation result to the data output selection circuit 5 as the enable signal OEN0<0>. The AND circuit 13m performs an AND operation of the NOT of the hit signal HITB<1> and the NOT of the output from the OR circuit 13f and outputs the operation result to the data output selection circuit 5 as the enable signal OEN0<1>. The AND circuit 13n performs an AND operation of the NOT of the hit signal HITB<2> and the NOT of the output from the OR circuit 13f and outputs the operation result to the data output selection circuit 5 as the enable signal OEN0<2>. The AND circuit 13o performs an AND operation of the NOT of the hit signal HITB<3> and the NOT of the output from the OR circuit 13f and outputs the operation result to the data output selection circuit 5 as the enable signal OEN0<3>.

The AND circuit 13p performs an AND operation of the NOT of the hit signal HITB<0> and the NOT of the output from the OR circuit 13e and outputs the operation result to the data output selection circuit 5 as the enable signal OEN1<0>. The AND circuit 13q performs an AND operation of the NOT of the hit signal HITB<1> and the NOT of the output from the OR circuit 13e and outputs the operation result to the data output selection circuit 5 as the enable signal OEN1<1>. The AND circuit 13r performs an AND operation of the NOT of the hit signal HITB<2> and the NOT of the output from the OR circuit 13e and outputs the operation result to the data output selection circuit 5 as the enable signal OEN1<2>. The AND circuit 13s performs an AND operation of the NOT of the hit signal HITB<3> and the NOT of the output from the OR circuit 13e and outputs the operation result to the data output selection circuit 5 as the enable signal OEN1<3>.

Figure 11:
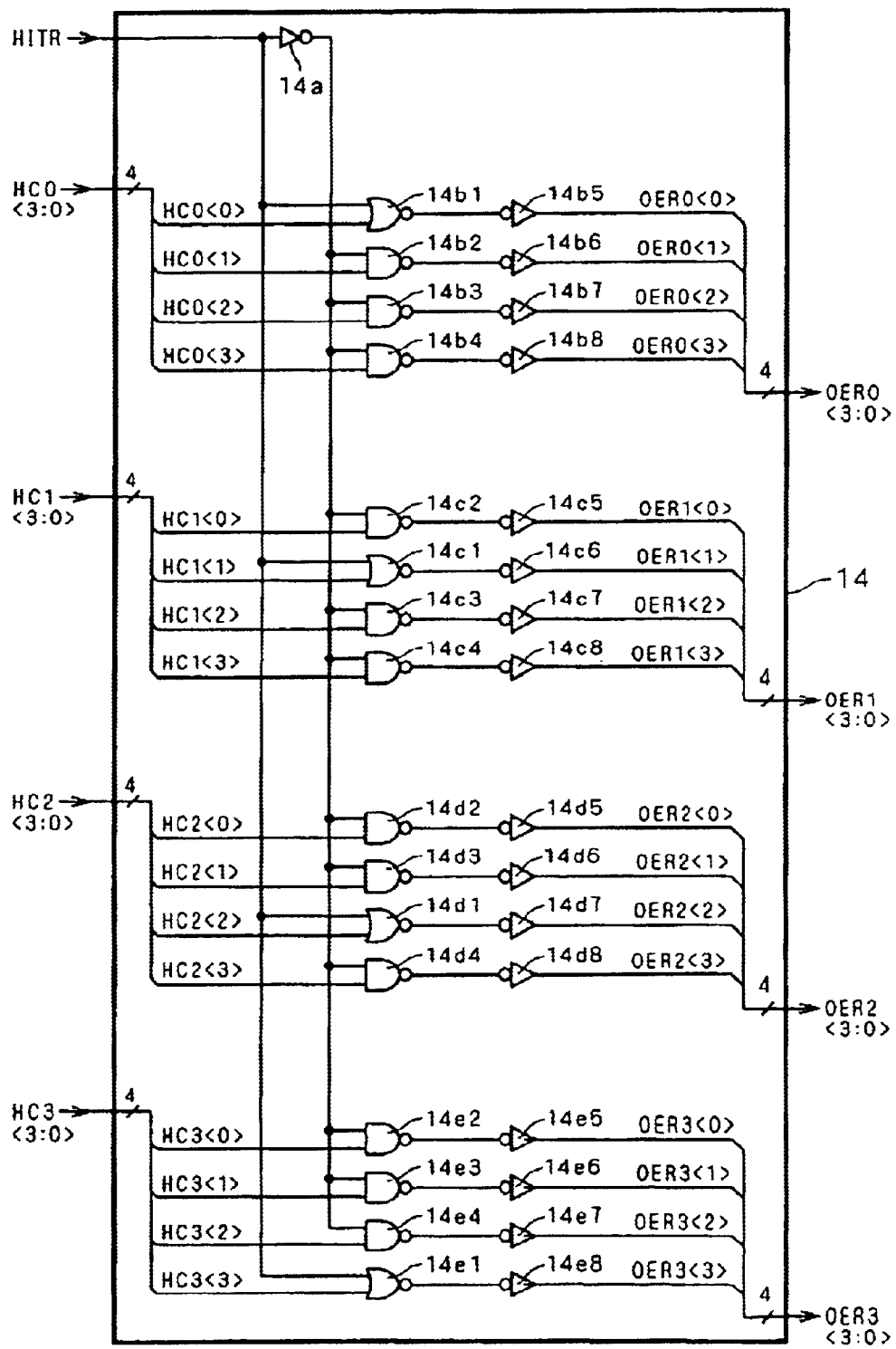

FIG. 11 is a circuit diagram showing a configuration of the enable signal output circuit 14. As shown in FIG. 11, the enable signal output circuit 14 comprises inverters 14a, 14b5 to 14b8, 14c5 to 14c8, 14d5 to 14d8 and 14e5 to 14e and NOR circuits 14b1, 14c1, 14d1 and 14e1 and NAND circuits 14b2 to 14b4, 14c2 to 14c4, 14d2 to 14d4 and 14e2 to 14e4.

The inverter 14a inverts the hit signal HITR and outputs the inverted signal to each of the NAND circuits 14b2 to 14b4, 14c2 to 14c4, 14d2 to 14d4 and 14e2 to 14e4.

The NOR circuit 14b1 performs a NOR operation of the hit signal HITR and the hit signal HC0<0> and inputs the operation result to the inverter 14b5. The inverter 14b5 inverts the inputted signal and outputs the inverted signal to the data output selection circuit 5 as the enable signal OER0<0>. The NOR circuit 14c1 performs a NOR operation of the hit signal HITR and the hit signal HC1<1> and inputs the operation result to the inverter 14c6. The inverter 14c6 inverts the inputted signal and outputs the inverted signal to the data output selection circuit 5 as the enable signal OER1<1>. The NOR circuit 14d1 performs a NOR operation of the hit signal HITR and the hit signal HC2<2> and inputs the operation result to the inverter 14d7. The inverter 14d7 inverts the inputted signal and outputs the inverted signal to the data output selection circuit 5 as the enable signal OER2<2>. The NOR circuit 14e1 performs a NOR operation of the hit signal HITR and the hit signal HC3<3> and inputs the operation result to the inverter 14e8. The inverter 14e8 inverts the inputted signal and outputs the inverted signal to the data output selection circuit 5 as the enable signal OER3<3>.

The NAND circuit 14b2 performs a NAND operation of the output from the inverter 14a and hit signal HC0<1> and inputs the operation result to the inverter 14b6. The inverter 14b6 inverts the inputted signal and outputs the inverted signal to the data output selection circuit 5 as the enable signal OER0<1>. The NAND circuit 14b3 performs a NAND operation of the output from the inverter 14a and hit signal HC0<2> and inputs the operation result to the inverter 14b7. The inverter 14b7 inverts the inputted signal and outputs the inverted signal to the data output selection circuit 5 as the enable signal OER0<2>. The NAND circuit 14b4 performs a NAND operation of the output from the inverter 14a and hit signal HC0<3> and inputs the operation result to the inverter 14b8. The inverter 14b8 inverts the inputted signal and outputs the inverted signal to the data output selection circuit 5 as the enable signal OER0<3>.

The NAND circuit 14c2 performs a NAND operation of the output from the inverter 14a and hit signal HC1<0> and inputs the operation result to the inverter 14c5. The inverter 14c5 inverts the inputted signal and outputs the inverted signal to the data output selection circuit 5 as the enable signal OER1<0>. The NAND circuit 14c3 performs a NAND operation of the output from the inverter 14a and hit signal HC1<2> and inputs the operation result to the inverter 14c7. The inverter 14c7 inverts the inputted signal and outputs the inverted signal to the data output selection circuit 5 as the enable signal OER1<2>. The NAND circuit 14c4 performs a NAND operation of the output from the inverter 14a and hit signal HC1<3> and inputs the operation result to the inverter 14c8. The inverter 14c8 inverts the inputted signal and outputs the inverted signal to the data output selection circuit 5 as the enable signal OER1<3>.

The NAND circuit 14d2 performs a NAND operation of the output from the inverter 14a and hit signal HC2<0> and inputs the operation result to the inverter 14d5. The inverter 14d5 inverts the inputted signal and outputs the inverted signal to the data output selection circuit 5 as the enable signal OER2<0>. The NAND circuit 14d3 performs a NAND operation of the output from the inverter 14a and hit signal HC2<1> and inputs the operation result to the inverter 14d6. The inverter 14d6 inverts the inputted signal and outputs the inverted signal to the data output selection circuit 5 as the enable signal OER2<1>. The NAND circuit 14d4 performs a NAND operation of the output from the inverter 14a and hit signal HC2<3> and inputs the operation result to the inverter 14d8. The inverter 14d8 inverts the inputted signal and outputs the inverted signal to the data output selection circuit 5 as the enable signal OER2<3>.

The NAND circuit 14e2 performs a NAND operation of the output from the inverter 14a and hit signal HC3<0> and inputs the operation result to the inverter 14e5. The inverter 14e5 inverts the inputted signal and outputs the inverted signal to the data output selection circuit 5 as the enable signal OER3<0>. The NAND circuit 14e3 performs a NAND operation of the output from the inverter 14a and hit signal HC3<1> and inputs the operation result to the inverter 14e6. The inverter 14e6 inverts the inputted signal and outputs the inverted signal to the data output selection circuit 5 as the enable signal OER3<1>. The NAND circuit 14e4 performs a NAND operation of the output from the inverter 14a and hit signal HC3<2> and inputs the operation result to the inverter 14e7. The inverter 14e7 inverts the inputted signal and outputs the inverted signal to the data output selection circuit 5 as the enable signal OER3<2>.

Next, an operation of the semiconductor memory device 1 of the first preferred embodiment will be discussed. First discussion will be made on an operation in the case where the normal memory cell array 17 in each of the normal RAMs 2a and 2b has no defect. In this case, no fuse in the fuse circuits 10aj and 11ai is programmed, and the enable signals FRjEN and FCiEN, the addresses FRjX1 to FRjX8, FRjZ0, FCiY1 to FCiY4 and FCiZ0 and the subword selection signals FCiB0 and FCiB1 all indicate "0". Therefore, regardless of the value of the inputted address A<14:0>, the hit signals HITCi (i=0 to 3) and HITRj (j=0 to 3), HITR and HITC all indicate "0". Further, the hit signals HCi<3:0> (i=0 to 3) and HITB<3:0> all indicate "0". The result is that the enable signal OEN1<k> is equal to the address /A<14> (k=0 to 3) and the enable signal OEN1<k> is equal to the address A<14> (k=0 to 3). Sign "/" of the address /A<14> represents the "NOT" of the signal. In other words, the address /A<14> is an inverted one of the address A<14>. Further, the enable signal OERi<k> is "0" (i=0 to 3, k=0 to 3). Then, the chip enable signal CECR (low active) which selects the redundancy RAM 3 is "1".

Since the enable signal OEN0<k>=the address /A<14> (k=0 to 3) and the enable signal OEN1<k>=the address A<14> (k=0 to 3), when the address A<14>=0, the data DQNB<7:0> from the normal RAM 2b is outputted to the outside of the semiconductor memory device 1 as data the DQ<7:0>. When the address A<14>=1, the data DQNA<7:0> from the normal RAM 2a is outputted to the outside of the semiconductor memory device 1 as data the DQ<7:0>. In this case, since the enable signal OERi<k>=0 (i=0 to 3, k=0 to 3), the tristate buffers 5c1 to 5c4, 5d1 to 5d4, 5e1 to 5e4 and 5f1 to 5f4 each become inactive, there is no collision between the data DQR<7:0> of the redundancy RAM 3 and the data DQNA<7:0> from the normal RAM 2a or the data DQNB<7:0> from the normal RAM 2b.

Thus, in the case where the normal memory cell array 17 in each of the normal RAMs 2a and 2b has no defect, without using the redundancy RAM 3, the semiconductor memory device 1 can perform a function of a 256-kbit RAM with 8 bits and 32 kwords. Further, since the enable signal CECR=1, the redundancy RAM 3 is not selected and no extra power consumption is needed.

Next discussion will be made on an operation of the semiconductor memory device 1 in the case where the normal memory cell array 17 in the normal RAM 2 has a column defect. Herein, "column defect" refers to a case where data can not be read out from or written into a plurality of normal memory cells 16 aligned in the column direction in the normal memory cell array 17 due to a break in the bit line or the like.

Herein considered is a case where a column replacement unit (a pair of sections A) in the normal RAM 2 defined by the address A<13:10>=the address Yi<4:1>, the address A<14>=the address Zi<0> and subword number SB<1:0>= subword number Bi<1:0> is replaced by the i-th redundancy section C (i=0 to 3). The subword number SB<1:0> consists of two bits, indicating the number of the subword corresponding to the column replacement unit. Subword No. 0 is indicated when the subword number SB<1:0>=(0, 0), subword No. 1 is indicated when the subword number SB<1:0>=(0, 1), subword No. 2 is indicated when the subword number SB<1:0>=(1, 0) and subword No. 3 is indicated when the subword number SB<1:0>=(1, 1). The subword number SB<1:0> indicates subword No. k (k=0 to 3) and the k-th column replacement unit is replaced by the i-th redundancy section C.

First, in the fuse circuit 11ai, (i=0 to 3), a fuse in the unit fuse block 11aa which outputs the enable signal FCiEN is programmed. Then, a fuse in the unit fuse block 11aa which outputs the address FCiYx, a fuse in the unit fuse block 11aa which outputs the address FCiZy and a fuse in the unit fuse block 11aa which outputs the subword selection signal FCiBz are programmed. A value of "x" of the address FCiYx coincides with a value of "x" of the address Yi<x> indicating "1" among the addresses Yi<4:1>. A value of "y" of the address FCiZy coincides with a value of "y" of the address Zi<y> indicating "1" in the address Zi<0>. A value of "z" of the subword selection signal FCiBz coincides with a value of "z" of the subword number Bi<z> indicating "1" among the subword numbers Bi<1:0>.

For example, in the normal memory cell array 17 of the normal RAM 2b, when the column replacement unit (the pair of the sections A) hatched in FIG. 12 is replaced by the redundancy section C hatched in FIG. 13, since the address Y0<4:1>=(0001), the address Z0<0>=0 and the subword number B0<1:0>=(0, 1), three fuses, i.e., a fuse in the unit fuse block 11aa which outputs the enable signal FC0EN, a fuse in the unit fuse block 11aa which outputs the address FC0Y1 and a fuse in the unit fuse block 11aa which outputs the subword selection signal FC0B0, are programmed. Further, a case where the column replacement unit (the pair of sections A) hatched in FIG. 12 is replaced by the redundancy section C hatched in FIG. 13 is referred to as "replacement 1".

The redundancy column address comparator circuit 11bj, as discussed above, compares the address A<14:10> with the addresses FCiY1 to FCiY4 and FCiZ0 and outputs "1" when all the addresses coincide. The enable signal FCiEN indicates "1" since the unit fuse block 11aa which outputs the enable signal is programmed. Therefore, the hit signal HITCi becomes "1". Further, the subword selection signals FCiB0 and FCiB1 are decoded by the redundancy column subword decoder 11ci and the decoded result is inputted to the AND circuit 11ei to 11hi. The hit signal HCi<k> thereby becomes "1". The outputs from one of the OR circuits 13a to 13d to which the hit signal HCi<k> is inputted become "1" and the hit signal HITB<k> becomes "1". In the above replacement 1, the hit signals HITC0, HITC, HC0<1> and HITB<1> each become "1".

On the side of the normal RAM 2, the outputs from one of the AND circuits 131 to 13s to which the hit signal HITB<k> is inputted output "0", and the enable signals OEN0<k> and OEN1<k> become "0" regardless of the value of the address A<14> and the outputs of the tristate buffers to which the enable signals are connected are brought into a high impedance state. Therefore, in each of the data DQNA<7:0> and the data DQNB<7:0>, the data corresponding to the k-th subword is not outputted to the outside of the semiconductor memory device 1.

On the side of the redundancy RAM 3, the enable signal OERi<k> corresponding to the hit signal HCi<k> becomes "1" and the tristate buffer to which the enable signal is connected is activated. Therefore, the data corresponding to the i-th subword out of the data DQR<7:0> of the redundancy RAM 3 is outputted to the outside of the semiconductor memory device 1.

Further, among the write signals WECR<3:0>, only the write signal WECR<i> corresponding to the hit signal HITCi becomes equivalent to the write signal WER and the others always becomes "1". This makes it possible to write data to only the i-th redundancy section C of the redundancy memory cell array 18.

The data input subword selection circuit 12b outputs data indicated on the column of FIG. 16 where the hit signal HITR=0 and the hit signal HICi<k>=1 as the data DIR<7:0>.

The address scramble circuit 12a outputs data indicated on the column of FIG. 15 where the hit signal HITR=0 as the row address XR<7:0> and the column address YR<2:0>. This maps the column replacement unit to the redundancy section C in the address space of the redundancy RAM 3.

In the redundancy column address comparator circuit 11bi, when the address A<14:10> does not coincide with all the addresses FCiY1 to FCiY4 and FCiZ0, all the hit signals HITCi become "0" and the hit signal HITC also becomes "0". The operation in this case is the same as that in the case where the normal RAM 2 has no defect.

Thus, when the normal RAM 2 has a column defect, the column replacement unit including an area in the normal memory cell array 17 which has a defect is logically replaced by the redundancy section C of the redundancy memory cell array 18 in the redundancy RAM 3. There are four redundancy sections C (i=0 to 3) and any one of them can replace any column replacement unit in the normal RAM 2. When there is a defect in each of columns which have the same column address and correspond to subwords with different numbers in the normal RAM 2, column replacements of both columns can be performed at the same time by using two sections C in the redundancy RAM 3.

Next discussion will be made on an operation of the semiconductor memory device 1 in the case where the normal memory cell array 17 in the normal RAM 2 has a row defect. Herein, "row defect" refers to a case where data can not be read out from or written into a plurality of normal memory cells 16 aligned in the row direction in the normal memory cell array 17 due to a break in the word line or the like.

Herein considered is a case where a row replacement unit (a section B) in the normal RAM 2 defined by the address A<8:1>=the address Xj<8:1> and the address A<14>=the address Zj<0> is replaced by the j-th redundancy section D (j=0 to 3).

First, in the fuse circuit 10aj, (j=0 to 3), a fuse in the unit fuse block 10aa which outputs the enable signal FRjEN is programmed. Then, a fuse in the unit fuse block 10aa which outputs the address FRjXy and a fuse in the unit fuse block 10aa which outputs the address FRjZx are programmed. A value of "y" of the address FRjXy coincides with a value of "y" of the address Xj<x> indicating "1" among the addresses Xj<8:1>. A value of "x" of the address FRjZx coincides with a value of "x" of the address Zj<x> indicating "1" in the address Zj<0>.

For example, in the normal memory cell array 17 of the normal RAM 2b, when the row replacement unit (the section B) hatched in FIG. 12 is replaced by the redundancy section D hatched in FIG. 13, since the address X0<8:1>= (00000010) and the address Z0<0>=0, two fuses, i.e., a fuse in the unit fuse block 10aa which outputs the enable signal FR0EN and a fuse in the unit fuse block 10aa which outputs the address FR0X2, are programmed. Further, a case where the row replacement unit (the section B) hatched in FIG. 12 is replaced by the redundancy section D hatched in FIG. 13 is referred to as "replacement 2".

The redundancy row address comparator circuit 10bj, as discussed above, compares the address A<14, 8:1> with the addresses FRjX1 to FRjX8 and FRjZ0 and outputs "1" when all the addresses coincide. The enable signal FRjEN indicates "1" since the unit fuse block 10aa which outputs the enable signal is programmed. Therefore, the hit signal HITRj becomes "1". The hit signal HITR, which is an operation result of the OR operation of the hit signals HITR0 to HITR3, indicates "1".

On the side of the normal RAM 2, since the hit signal HITR=1, all the enable signal OEN0<3:0> and OEN1<3:0> become "0" and all the outputs from the tristate buffers 5a1 to 5a4 and 5b1 to 5b4 are brought into a high impedance state. Therefore, none of the data DQNA<7:0> and the data DQNB<7:0> are outputted to the outside of the semiconductor memory device 1.

Further, as shown by the alternate long and short dash line of FIG. 4, a signal obtained by inverting the hit signal HITR may be inputted to each of the AND circuits 7c and 7d in the normal RAM selection circuit 7. In this case, the AND circuit 7c performs an AND operation of the inverted signal of the hit signal HITR, the output from the inverter 7a and the address A<14> and outputs the operation result as the chip enable signal CECA. The AND circuit 7d performs an AND operation of the inverted signal of the hit signal HITR, the output from the inverter 7b and the output from the inverter 7a and outputs the operation result as the chip enable signal CECB. Thus, by inputting the inverted signal of the hit signal HITR to each of the AND circuits 7c and 7d of the normal RAM selection circuit 7, both of the normal RAMs 2a and 2b come into a standby state when the hit signal HITR=1, to produce an effect of reducing the power consumption of the semiconductor memory device 1. Furthermore, the circuit indicated by the alternate long and short dash line in FIG. 4 is not needed from the viewpoint of function of the semiconductor memory device 1.

On the side of the redundancy RAM 3, one of the enable signals OERi<k> indicating i=k becomes "1" and the others become "0", regardless of the value of the hit signal HCi<3:0>. The respective tristate buffers to which the enable signals OER1<1>, OER2<2> and OER3<3> are connected are activated. Therefore, all the data DQR<7:0> of the redundancy RAM 3 is outputted to the outside of the semiconductor memory device 1.

Further, since the hit signal HITR=1, all the write signals WECR<3:0> become equivalent to the write signal WECR outputted from the control unit 4. The data input subword selection circuit 12b outputs the data DI<7:0> as the data DIR<7:0>, as indicated on the column of FIG. 16 where the hit signal HITR=1.

The address scramble circuit 12a outputs data indicated on the column of FIG. 15 where the hit signal HITR=1 as the row address XR<7:0> and the column address YR<2:0>. In this case, the encode signal E<1:0> indicates a value indicated in FIG. 14 discussed above. Further, as shown in FIG. 13, since the row address XR<7:0>=128 or more is allocated to the section D of the redundancy memory cell array 18, the row address XR<7> becomes 1. This maps the row replacement unit to the redundancy section D in the address space of the redundancy RAM 3.

In the redundancy row address comparator circuit 10bi, when the address A<14, 8:1> does not coincide with all the addresses FRjX1 to FRjX4 and FRjZ0, all the hit signals HITRj become "0" and the hit signal HITR also becomes "0". The operation in this case is the same as that in the case where the normal RAM 2 has no defect.

Thus, when the normal RAM 2 has a row defect, the row replacement unit including an area t in the normal memory cell array 17 which has a defect is logically replaced by the redundancy section D of the redundancy memory cell array 18 in the redundancy RAM 3. There are four redundancy sections D (j=0 to 3) and any one of them can replace any row replacement unit in the normal RAM 2.

Though a replacement operation in the case where the normal memory cell array 17 has a row defect or a column defect has been discussed above, even when a normal memory cell 16 in the normal memory cell array 17 has a defect, i.e., when the normal memory cell array 17 has a "single bit defect", an area including the defective normal memory cell 16 can be replaced by the redundancy section C or the redundancy section D by the above-discussed column replacement or row replacement.

Further, when the normal memory cell array 17 has both the row and column defects, the normal memory cell array 17 can be relieved by using both the redundancy section C and the redundancy section D. In this case, if the address A<14:0> inputted from the outside of the semiconductor memory device 1 indicates the normal memory cell 16 included in both a column replacement unit (pair of sections A) and a row replacement unit (section B), both the hit signals HITC and HITR become "1". Then, the control unit 4 of the first preferred embodiment performs the row replacement prior to the column replacement when the address A<14:0> indicates the normal memory cell 16 included in both the column replacement unit and the row replacement unit. It is clear from the above discussion that the output from the redundancy control circuit 6 is determined if the hit signal HITR=1, regardless of the value of the hit signal HITC, and therefore, the row replacement is performed prior to the column replacement. The reason why the row replacement is performed prior to the column replacement is that more normal memory cells 16 can be relieved in this case than the case where the column replacement is performed prior to the row replacement. For example, when the row defect covers all the bits of the unit data, if the column replacement is performed prior to the row replacement, only the normal memory cells 16 corresponding to one subword can be relieved. When the row replacement is performed prior to the column replacement, however, all the normal memory cells 16 corresponding to the 8 bits can be relieved.

Thus, in the semiconductor memory device 1 of the first preferred embodiment, the number of bits of the data corresponding to the column replacement unit used for relieving the normal memory cell array 17 is two (bits), which is smaller than the number of bits of the unit data (8 bits) of the normal RAM 2. For example, if the number of bits of the data corresponding to the column replacement unit is eight, instead of replacement on a subword basis, a redundancy section C consisting of the redundancy memory cells 19 arranged in matrix with 128 rows and 64 columns is needed. Providing the redundancy RAM 3 with this four redundancy sections C and four redundancy sections D as discussed above needs a capacity of 34 kbit (128×64×4+8×64×4=34 k), which is about three times as large as the capacity of the redundancy RAM 3 (10 kbit) of the first preferred embodiment.

Accordingly, the semiconductor memory device 1 of the first preferred embodiment allows reduction in circuit scale of the redundancy RAM 3 as compared with a case where the number of bits of the data corresponding to the column replacement unit is equal to the number of bits of the unit data of the normal RAM (8 bits). As a result, it is possible to reduce the percent defective of the redundancy RAM 3 and improve the manufacturing yield of the semiconductor memory device 1.

Further, in the first preferred embodiment, the control unit 4 uses one of a plurality of redundancy sections in the redundancy memory cell array 18 when the normal memory cell array 17 of the normal RAM 2 is replaced by the redundancy memory cell array 18 of the redundancy RAM 3. In other words, when the normal memory cell array 17 has a defect, the replacement unit of the normal memory cell array 17 is replaced by some of a plurality of redundancy memory cells 19 constituting the redundancy memory cell array 18.

In the semiconductor memory device 1 of the first preferred embodiment, the control unit 4 can relieve the defective normal memory cell array by using some of a plurality of redundancy memory cells 19 in the redundancy RAM 3. Therefore, unlike the first background art in which all the memory cells included in the redundancy RAM are used for replacement, it is possible to replace the replacement unit by the redundancy memory cells 19 without using any defective redundancy memory cell 19. As a result, the manufacturing yield of the semiconductor memory device can be improved.

Further, the control unit 4 of the first preferred embodiment outputs the data among the unit data of the normal RAM 2, such as the data DQNA<7:0> and the data DQNB<7:0>, other than the data corresponding to the column replacement unit, at the bit positions thereof without any shift. Then, the control unit 4 outputs the data read out from the redundancy memory cell array 19, instead of the data among the unit data of the normal RAM 2 which corresponds to the column replacement unit, at the bit positions of the data corresponding to the column replacement unit.

For example, in the above replacement 1, the control unit 4 outputs the data among the data DQNB<7:0> of the normal RAM 2 other than the data DQNB<3:2> which corresponds to the column replacement unit, i.e., the data DQNB<0>, DQNB<1> and DQNB<4> to DQNB<7> to the outside of the semiconductor memory device 1 as the data DQ<0>, DQ<1> and DQ<4> to DQ<7>, respectively. Therefore, the data DQNB<0>, DQNB<1> and DQNB<4> to DQNB<7> are outputted to the outside of the semiconductor memory device 1 at the bit positions without any shift.

Instead of the data DQNB<2> among the data DQNB<2> and DQNB<3> which correspond to the column replacement unit, the data DQR<0> read out from the redundancy RAM 3 is outputted to the outside of the semiconductor memory device 1 as the data DQ<2>. Instead of the data DQNB<3>, the data DQR<1> read out from the redundancy RAM 3 is outputted to the outside of the semiconductor memory device 1 as the data DQ<3>. Therefore, the data DQR<0> is outputted to the outside of the semiconductor memory device 1 at the bit position of the data DQNB<2> (the third lowest bit) and the data DQR<1> is outputted to the outside at the bit position of the data DQNB<3> (the fourth lowest bit).

Thus, in the first preferred embodiment, unlike in the above-discussed first background art, not using the I/O shift replacement method for outputting data with its bit position shifted, the data among the unit data of the normal RAM 2 other than the data corresponding to the column replacement unit is outputted at its bit position without any change and instead of the data corresponding to the column replacement unit, the data read out from the redundancy memory cell array 19 is outputted at the bit position of the data corresponding to the column replacement unit. Therefore, it is possible to reduce the time from the data output from the normal RAM 2 or the redundancy RAM 3 until the data output to the outside of the semiconductor memory device 1, as compared with the first background art. As a result, it becomes easier to achieve a desired performance and the manufacturing yield of the semiconductor memory device 1 is improved. Further, since the redundancy RAM 3 usually has a circuit scale smaller than that of the normal RAM 2 and the access time generally becomes shorter as the circuit scale decreases, the delay time until the data output from the redundancy RAM 3 is negligible.

Further, in the first preferred embodiment, both the normal RAMs 2a and 2b can be relieved by one redundancy RAM 3. Therefore, it is possible to reduce the circuit scale of the redundancy RAM 3, as compared with the first background art in which the number of required redundancy RAMs 3 correspond to the number of normal RAMs 2. As a result, the percent defective of the redundancy RAM 3 can be reduced and the manufacturing yield of the semiconductor memory device 1 can be improved.

In the first preferred embodiment, the control unit 4 can performs both the row replacement and the column replacement. Therefore, unlike the second background art where only the column replacement can be performed, even if there is a defect in the normal memory cells 16 aligned in the row direction due to a break of the word line or the like, all the normal memory cells 16 can be relieved. As a result, the manufacturing yield of the semiconductor memory device 1 can be improved as compared with the second background art.

Further, in the first preferred embodiment, the number of bits of the data corresponding to the column replacement unit (2 bits) is smaller than the number of bits of the unit data of the normal RAM 2 (8 bits) and also smaller than the number of bits of the data corresponding to the row replacement unit (8 bits). In many cases, a defect in the normal memory cells 16 aligned in the row direction, i.e., the direction that the word lines extend, covers a plurality of bits of the unit data due to a break of the word line or the like. For this reason, all the defective normal memory cells 16 can not be relieved in some cases when the number of bits of the data corresponding to the row replacement unit is made equal to the number of bits of the data corresponding to the column replacement unit which is smaller than the number of bits of the unit data of the normal RAM 2.

In the first preferred embodiment, since the number of bits of the data corresponding to the row replacement unit is larger than the number of bits of the data corresponding to the column replacement unit which is smaller than the number of bits of the unit data of the normal RAM 2, all the defective normal memory cells 16 can be surely relieved unlike the above case. Further, by using the smaller column replacement unit as compared with the case where the number of bits of the data corresponding to the column replacement unit is equal to the number of bits of the unit data of the normal RAM 2, all the normal memory cells 16 aligned in the column direction can be relieved, like in such a case.

In the first preferred embodiment, the number of bits of the data corresponding to the replacement unit is two (bits), and the replacement is performed on a subword basis. Therefore, the circuit configuration of the control unit 4 can be simplified as compared with the case where the number of bits of the data corresponding to the replacement unit is one (bit) and the replacement is performed on a bit basis. In the case of the replacement on a bit basis, for example, the number of fuses included in the fuse circuits 11ai (i=0 to 3) increases and the circuit of the control unit 4 thereby becomes complicated.

Further, in the first preferred embodiment, the tristate buffer 5W connecting the output terminals 2a1 and 2b1 of the normal RAMs 2a and 2b and the output terminals 3a1 of the redundancy RAM 3 to the output terminal 1a1 of the semiconductor memory device 1 is controlled on activation/inactivation by the number of bits of the data corresponding to the column replacement unit (2 bits), i.e., on a subword basis. Therefore, it is possible to simplify the circuit configuration of the control unit 4 as compared with the case where the tristate buffer 5W is controlled on a bit basis. In the case where the tristate buffer 5W is controlled on a bit basis, the number of enable signals which control the tristate buffer 5W increases, to thereby make the circuit of the control unit 4 complicated.

Though the hit signals HC0<3:0>, HC1<3:0>, HC2<3:0> and HC3<3:0> are inputted to the data input subword selection circuit 12b, as shown in FIG. 9, the hit signals HITC0 to HITC3 and HITB<0> to HITB<3> may be inputted instead. In such a case, the data input subword selection circuit 12b outputs the data indicated in FIG. 17 as the data DIR<7:0> on the basis of the above hit signals, the data DI<7:0> and the hit signal HITR. The data DIR<7:0> outputted from the data input subword selection circuit 12b in this case will be discussed below.

As shown in FIG. 17, when the hit signal HITR=1, the data DIR<7:0> is equal to the data DI<7:0>. In other words, the inputted data DI<7:0> is outputted without any change as the data DIR<7:0>. When the hit signal HITR=0, the data DIR<7:0> takes the following values.

If the hit signal HITC0=1, the data DIR<1:0> is equal to the data DI<1:0> when the hit signal HITB<0>=1, the data DIR<1:0> is equal to the data DI<3:2> when the hit signal HITB<1>=1, the data DIR<1:0> is equal to the data DI<5:4> when the hit signal HITB<2>=1 and the data DIR<1:0> is equal to the data DI<7:6> when the hit signal HITB<3>=1. If the hit signal HITC0=1, the values of the data DIR<7:2> are undefined when the hit signal HITB<k>=1 (k=0 to 3).

If the hit signal HITC1=1, the data DIR<3:2> is equal to the data DI<1:0> when the hit signal HITB<0>=1, the data DIR<3:2> is equal to the data DI<3:2> when the hit signal HITB<1>=1, the data DIR<3:2> is equal to the data DI<5:4> when the hit signal HITB<2>=1 and the data DIR<3:2> is equal to the data DI<7:6> when the hit signal HITB<3>=1. If the hit signal HITC1=1, the values of the data DIR<7:4, 1:0> are undefined when the hit signal HITB<k>=1 (k=0 to 3).

If the hit signal HITC2=1, the data DIR<5:4> is equal to the data DI<1:0> when the hit signal HITB<0>=1, the data DIR<5:4> is equal to the data DI<3:2> when the hit signal HITB<1>=1, the data DIR<5:4> is equal to the data DI<5:4> when the hit signal HITB<2>=1 and the data DIR<5:4> is equal to the data DI<7:6> when the hit signal HITB<3>=1. If the hit signal HITC2=1, the values of the data DIR<7:6, 3:0> are undefined when the hit signal HITB<k>=1 (k=0 to 3).

If the hit signal HITC3=1, the data DIR<7:6> is equal to the data DI<1:0> when the hit signal HITB<0>=1, the data DIR<7:6> is equal to the data DI<3:2> when the hit signal HITB<1>=1, the data DIR<7:6> is equal to the data DI<5:4> when the hit signal HITB<2>=1 and the data DIR<7:6> is equal to the data DI<7:6> when the hit signal HITB<3>=1. If the hit signal HITC3=1, the values of the data DIR<5:0> are undefined when the hit signal HITB<k>=1 (k=0 to 3).

In the case where the data input subword selection circuit 12b outputs the data indicated in FIG. 17, there is the following rule.

For example, when both the hit signals HC0<1> and HC1<2> indicate "1", the hit signals HITC0, HITC1, HITB<0> and HITB<2> all indicate "1". When both the hit signals HC0<2> and HC1<0> indicate "1", the hit signals HITC0, HITC1, HITB<0> and HITB<2> all indicate "1".

Thus, when two column replacement units are replaced at the same time, even if the two column replacement units are replaced by different redundancy sections C, the hit signals HITC(i) and HITB(k) sometimes have the same value and then can not be differentiated. In order to solve this problem needed is a rule that when two column replacement units specified by the address A<14:0> having the same value are replaced at the same time, the column replacement unit having a smaller number is replaced by a redundancy section C having a smaller number.

The Second Preferred Embodiment

FIGS. 18 to 24 are diagrams showing a constitution of a semiconductor memory device 21 in accordance with the second preferred embodiment of the present invention. The semiconductor memory device 21 of the second preferred embodiment is a 256-kbit RAM with 8 bits×32 kwords.

Figure 18:
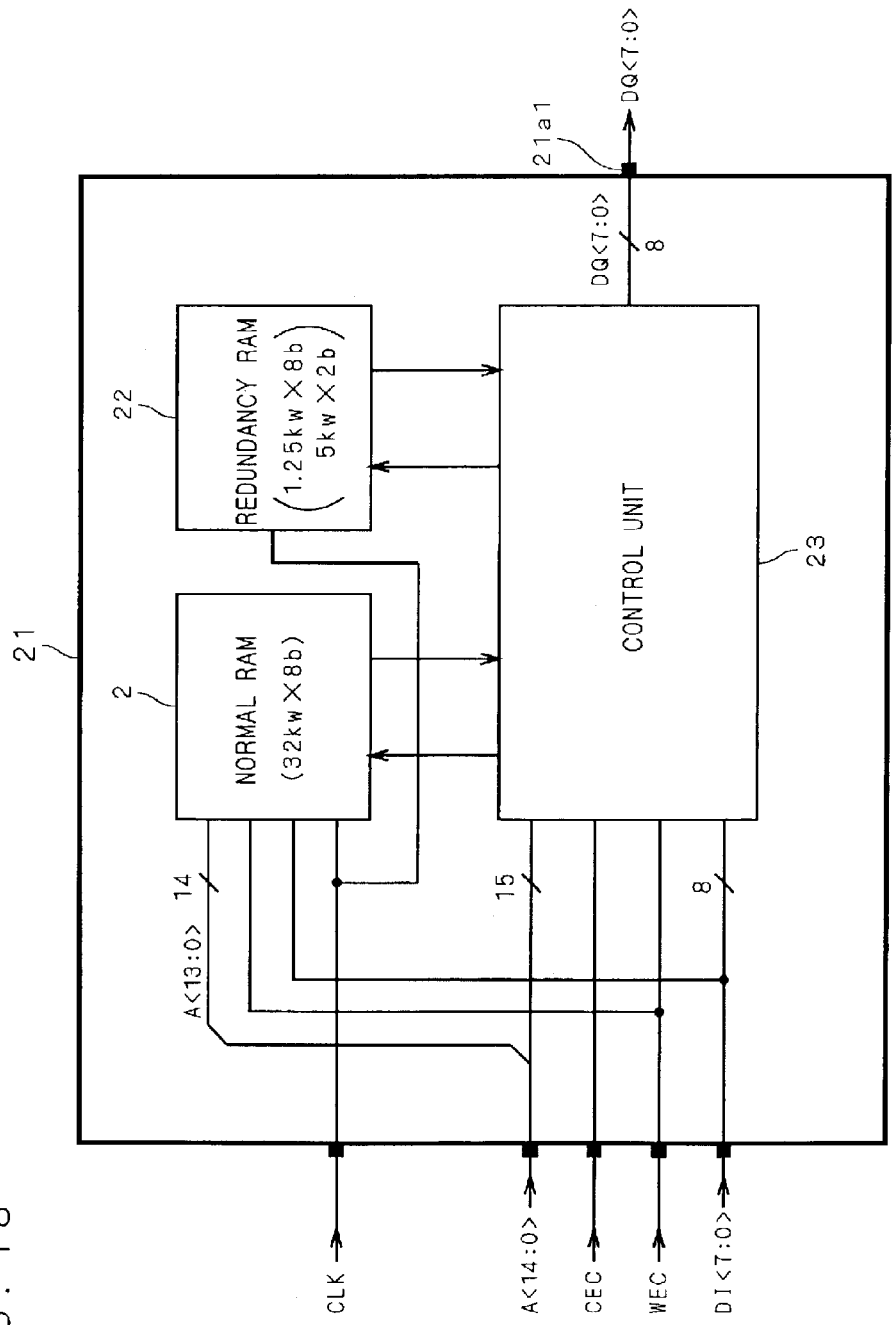
FIGS. 18 to 24 are diagrams showing a constitution of a semiconductor memory device in accordance with a second preferred embodiment of the present invention.

As shown in FIG. 18, the semiconductor memory device 21 of the second preferred embodiment comprises the basic constituents of the semiconductor memory device 1 of the first preferred embodiment and further comprises a control unit 23 instead of the control unit 4 and a redundancy RAM 22 instead of the redundancy RAM 3. The redundancy RAM 22 has the same capacity as the redundancy RAM 3, but works as a 10-kbit RAM with 8 bits×1.25 kwords when an organization change signal OC discussed later indicates "0" and works as a 10-kbit RAM with 2 bits×5 kwords when the organization change signal OC indicates "1". Further, the redundancy RAM 22 has a redundancy memory cell array consisting of a plurality of redundancy memory cells arranged in a matrix with 160 rows and 64 columns, like the redundancy RAM 3.

Figure 19:
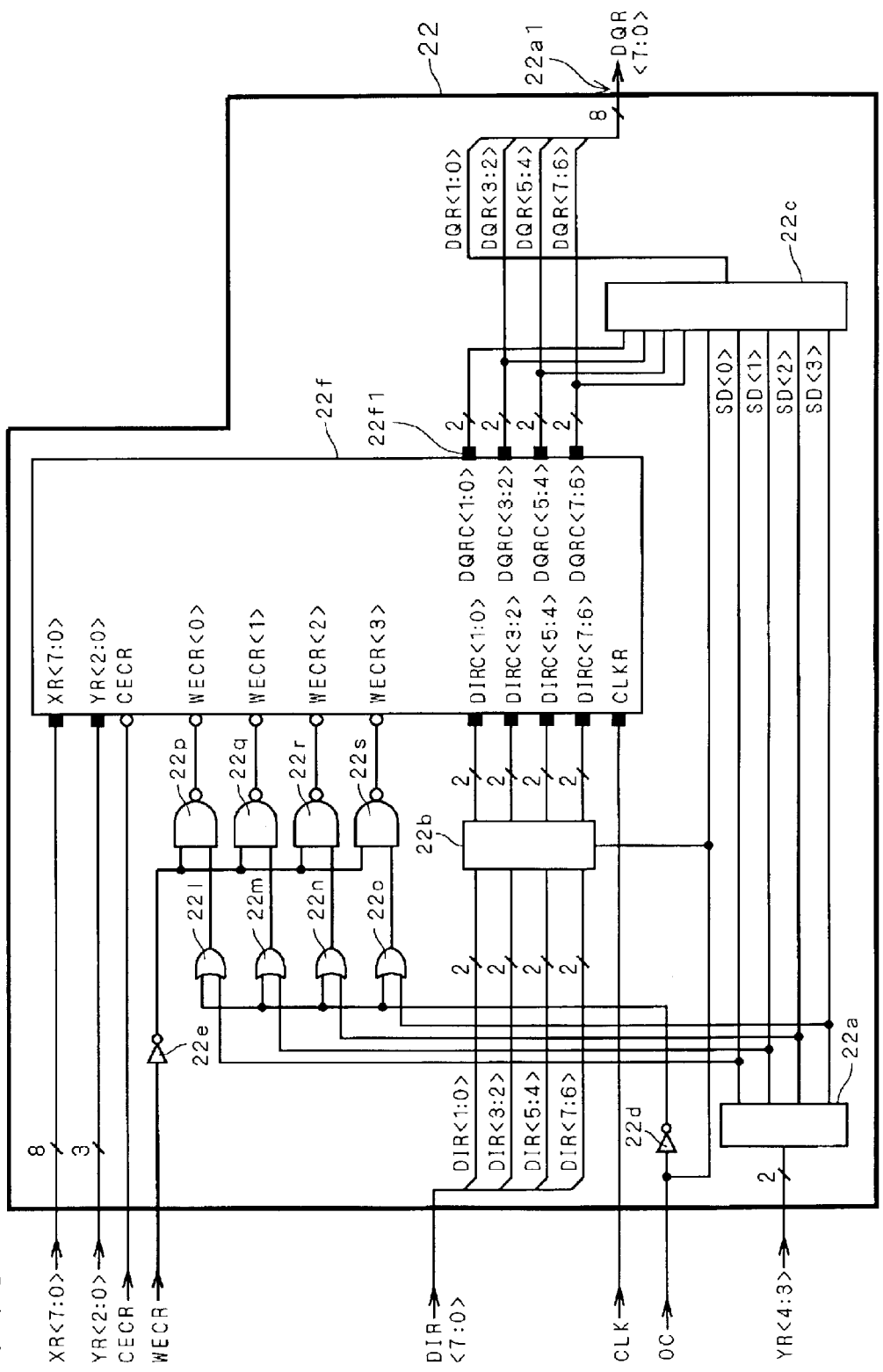

FIG. 19 is a circuit diagram showing a configuration of the redundancy RAM 22. As shown in FIG. 19, the redundancy RAM 22 comprises a decoder 22a, a DI selector 22b, a data output selection circuit 22c, inverters 22d and 22e, a RAM 22f, OR circuits 22l to 22o and NAND circuits 22p to 22s. The RAM 22f is the redundancy RAM 3 with names of I/O data changed. Specifically, the data DIR<7:0> and DQR<7:0> are changed into data DIRC<7:0> and DQRC<7:0>, respectively.

Next discussion will be made on a change in bit/word constitution of the redundancy RAM 22 by a value of the organization change signal OC outputted from the control unit 23, with reference to FIG. 19.

When the organization change signal OC=0, the write signals WECR<0> to WECR<3> are all equal to the write signal WECR, regardless of the value of the address YR<4:3> outputted from the control unit 23. Therefore, 8-bit data is read/written from/into the RAM 22f at the same time.

Outputs of the NAND circuits 22p to 22s are inputted to the RAM 22f as the write signals WECR<0> to WECR<3>, respectively. Outputs of the OR circuits 22l to 22o are inputted to the NAND circuits 22p to 22s, respectively. Further, an output of the inverter 22e which outputs an inverted signal of the write signal WECR is inputted to all the NAND circuits 22p to 22s. The NAND circuits 22p to 22s each perform an NAND operation of the inputted two signals and output the operation result.

Signals SD<0> to SD<3> are inputted to the OR circuits 22l to 22o, respectively. Further, an output of the inverter 22d which outputs an inverted signal of the organization change signal OC is inputted to all the OR circuits 22l to 22o. The OR circuits 22l to 22o each perform an OR operation of the inputted two signals and output the operation result.

Figures 24, 25, 26:
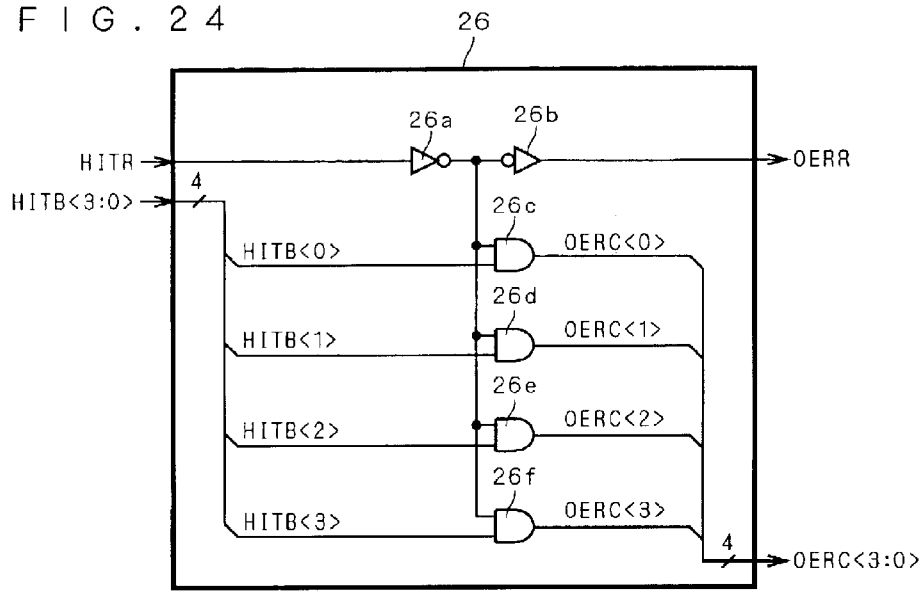
FIG. 25 is a table showing data outputted from a DI selector in accordance with the second preferred embodiment of the present invention.
FIG. 26 is a table showing data outputted from a data output selection circuit 22c in accordance with the second preferred embodiment of the present invention.

When the organization change signal OC=0, the DI selector 22b and the data output selection circuit 22c output data indicated in FIGS. 25 and 26, respectively. The DI selector 22b receives the organization change signal OC and the data DIR<7:0> outputted from the control unit 23 and outputs the data DIRC<7:0> to the RAM 22f. As shown in FIG. 25, when the organization change signal OC=0, the data DIRC<7:0> is equal to the data DIR<7:0> and the DI selector 22b outputs the data D1<7:0> to the RAM 22f without any change.

The data output selection circuit 22c connects a data output terminal 22f1 of the RAM 22f to some of data output terminals 22a1 of the redundancy RAM 22. The data output selection circuit 22 receives the organization change signal OC, the signal SD<3:0> from the decoder 22a and the data DQRC<7:0> from the RAM 22f and outputs the data DQR<1:0> to the control unit 23 through the output terminals 22a1 of the redundancy RAM 22. As shown in FIG. 26, when the organization change signal OC=0, the data DQR<1:0> is equal to the data DQRC<1:0>.

The data DQRC<7:2> outputted from the RAM 22f is outputted to the control unit 23 as the data DQR<7:2>, as shown in FIG. 19. Therefore, when the organization change signal OC=0, the data DQRC<7:0> is equal to the data DQR<7:0>.

When the organization change signal OC=0, the redundancy RAM 22, whose constituent elements perform the above operations, serves as a RAM with 8 bits×1.25 kwords.

When the organization change signal OC=1, the logics of the write signals WECR<0> to WECR<3> depend not only on the logic of the write signal WECR but also on the logic of the output from the decoder 22a. The decoder 22a decodes the address YR<4:3> and outputs the decoded address as the signal SD<3:0>. Specifically, the decoder 22a outputs the signal SD<3:0>=(0001) when the address YR<4:3>=(0, 0), outputs the signal SD<3:0>=(0010) when the address YR<4:3>=(0, 1), outputs the signal SD<3:0>= (0100) when the address YR<4:3>=(1, 0) and outputs the signal SD<3:0>=(1000) when the address YR<4:3>=(1, 1).

Therefore, since the redundancy RAM 22 has the above circuit configuration, when the organization change signal OC=1, the write signal WECR<i> among the write signals WECR<3:0> which has the value of i in the case where the signal SD<i>=1 becomes "0" and the other write signals all become "1". For this reason, it is allowed to write only the data of subword having the number indicated by the address YR<4:3>, more exactly, having the decoded value of the address YR<4:3>, among the data DIRC<7:0> inputted to the RAM 22f, depending on the value of the write signal WECR.

As shown in FIG. 25, when the organization change signal OC=1, the DI selector 22b outputs the data DI<1:0> to the RAM 22f as each of the data DIRC<1:0>, DIRC<3:2>, DIRC<5:4> and DIRC<7:6>. Further, as shown in FIG. 26, when the organization change signal OC=1, the data output selection circuit 22c outputs the data corresponding to the subword having the number indicated by the address YR<4:3> among the data DQRC<7:0> as the data DQR<1:0>. Specifically, the data output selection circuit 22c outputs the data DQRC<1:0> when the signal SD<0>=1, outputs the data DQRC<3:2> when the signal SD<1>=1, outputs the data DQRC<5:4> when the signal SD<2>=1 and outputs the data DQRC<7:6> when the signal SD<3>=1, as the data DQR<1:0>.

When the organization change signal OC=1, the redundancy RAM 22, whose constituent elements perform the above operations, serves as a RAM with 2 bits×5 kwords.

Further, since the RAM 22f is the redundancy RAM 3 of the first preferred embodiment with the names of I/O data changed, the redundancy memory cell array included in the RAM 22f, i.e., the redundancy memory cell array included in the redundancy RAM 22, has the same configuration as that of the redundancy memory cell array 18 shown in FIG. 13. The replacement mapping in replacing the normal RAM 2 by the redundancy RAM 22 is the same as that shown in FIGS. 12 and 13.

Figure 20:
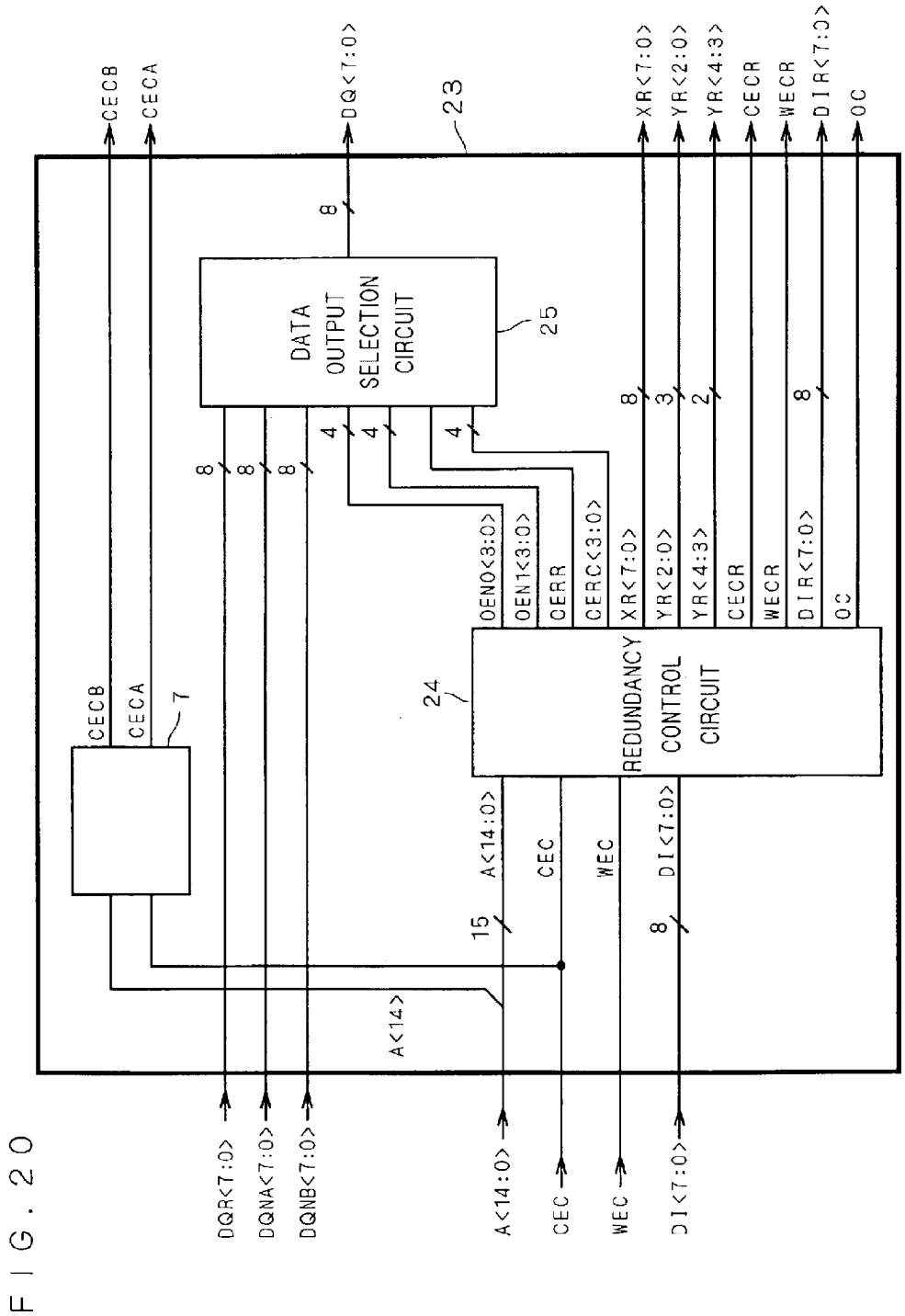

Next, a constitution of the control unit 23 will be discussed. FIG. 20 is a block diagram showing a constitution of the control unit 23. As shown in FIG. 20, the control unit 23 of the second preferred embodiment comprises the basic constituents of the control unit 4 of the above-discussed first preferred embodiment and further comprises a data output selection circuit 25 instead of the data output selection circuit 5 and a redundancy control circuit 24 instead of the redundancy control circuit 6.

Figure 21:
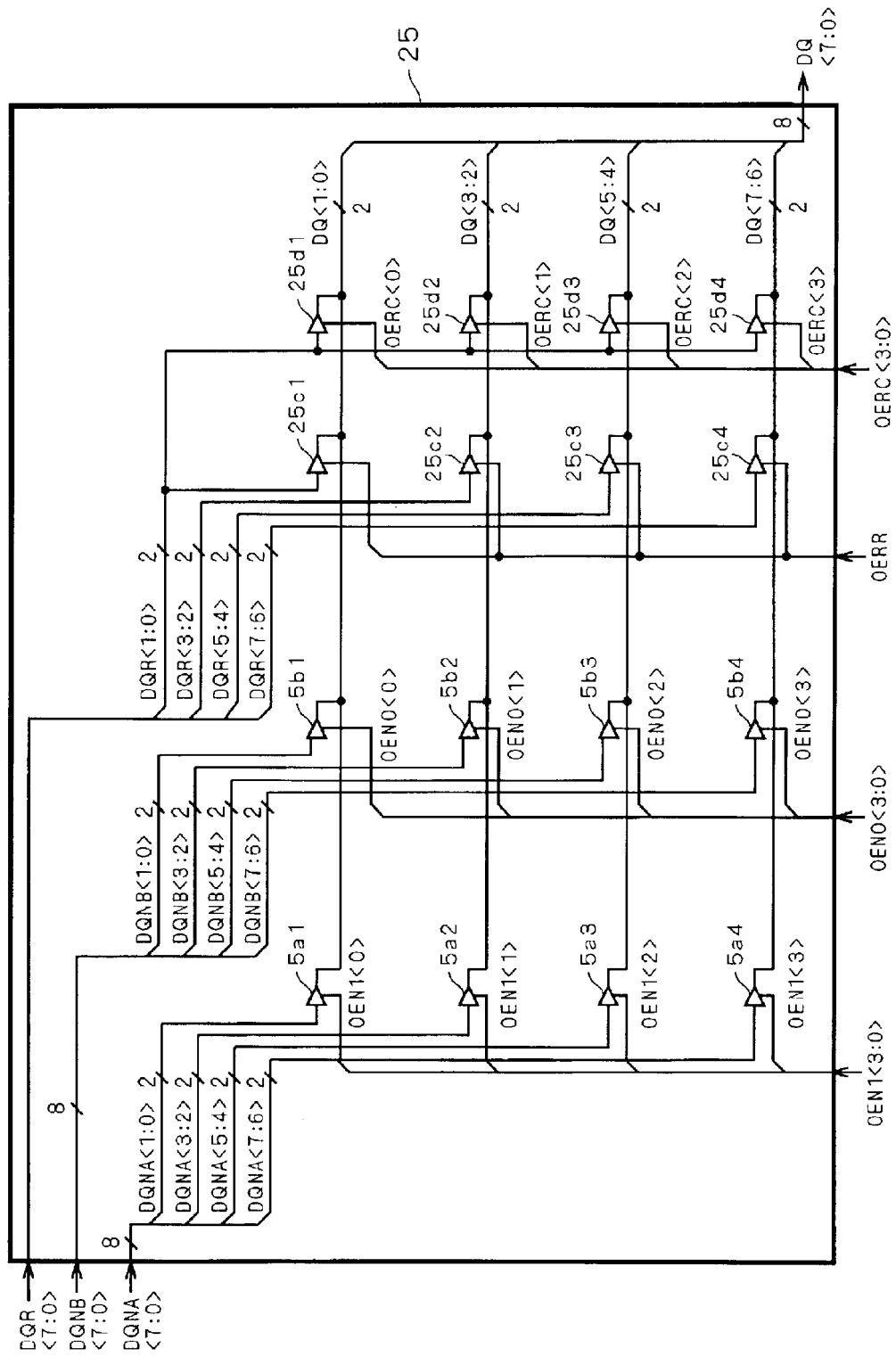

FIG. 21 is a circuit diagram showing a configuration of the data output selection circuit 25. As shown in FIG. 21, the data output selection circuit 25 comprises the basic constituents of the data output selection circuit 5 and further comprises tristate buffers 25c1 to 25c4 and 25d1 to 25d4 instead of the tristate buffers 5c1 to 5c4, 5d1 to 5d4, 5e1 to 5e4 and 5f1 to 5f4.

The tristate buffers 25c1 to 25c4 and 25d1 to 25d4 are buffers for connecting the output terminals 22a1 of the redundancy RAM 22 to the data output terminal 21a1 (shown in FIG. 18) of the semiconductor memory device 21. The tristate buffers 25c1 to 25c4 are controlled on activation/inactivation by the redundancy control circuit 24 when the control unit 23 performs a row replacement, and the tristate buffers 25d1 to 25d4 are controlled on activation/inactivation by the redundancy control circuit 24 when the control unit 23 performs a column replacement.

The data DQR<7:6> outputted from the redundancy RAM 22 is inputted to the tristate buffer 25c4 and the data DQR<5:4> is inputted to the tristate buffer 25c3. Further, the data DQR<3:2> is inputted to the tristate buffer 25c2 and the data DQR<1:0> is inputted to the tristate buffer 25c1 and all the tristate buffers 25d1 to 25d4.

Each of the tristate buffers 25c1 to 25c4 and 25d1 to 25d4 consists of two subtristate buffers. In each of the tristate buffers 25c1 to 25c4 and 25d1 to 25d4, one of the inputted signals is inputted to one subtristate buffer and the other inputted signal is inputted to the other subtristate buffer. For example, the data DQR<1> is inputted to one of the subtristate buffers included in the tristate buffer 25c1 and the data DQR<0> is inputted to the other subtristate buffer.

Among the tristate buffers 5a1, 5b1, 25c1 and 25d1, outputs of the subtristate buffers to which the lower order bit of the inputted data is inputted (lower subtristate buffer) are connected to one another and outputs of the subtristate buffers to which the higher order bit of the inputted data is inputted (higher subtristate buffer) are connected to one another. For example, the output of the subtristate buffer in the tristate buffer 5a1 to which the data DQNA<0> is inputted, the output of the subtristate buffer in the tristate buffer 5b1 to which the data DQNB<0> is inputted, the output of the subtristate buffer in the tristate buffer 25c1 to which the data DQR<0> is inputted and the output of the subtristate buffer in the tristate buffer 25d1 to which the data DQR<0> is inputted are connected to one another.

Similarly, among the tristate buffers 5a2, 5b2, 25c2 and 25d2, outputs of the lower subtristate buffers are connected to one another and outputs of the higher subtristate buffers are connected to one another. Further, among the tristate buffers 5a3, 5b3, 25c3 and 25d3, outputs of the lower subtristate buffers are connected to one another and outputs of the higher subtristate buffers are connected to one another.

Furthermore, among the tristate buffers 5a4, 5b4, 25c4 and 25d4, outputs of the lower subtristate buffers are connected to one another and outputs of the higher subtristate buffers are connected to one another.

The tristate buffers 25c1 to 25c4 are controlled on activation/inactivation in common by one enable signal OERR. The tristate buffers 25d1 to 25d4 are controlled on activation/inactivation by the enable signals OERC<0> to OERC<3>, respectively.

Any one of the tristate buffers 5a1, 5b1, 25c1 and 25d1 is activated, and the output of the lower subtristate buffer of the activated tristate buffer is outputted to the outside of the semiconductor memory device 21 through the output terminal 21a1 thereof as the data DQ<0> and the output of the higher subtristate buffer thereof is outputted to the outside of the semiconductor memory device 21 through the output terminal 21a1 thereof as the data DQ<1>.

Any one of the tristate buffers 5a2, 5b2, 25c2 and 25d2 is activated, and the output of the lower subtristate buffer of the activated tristate buffer is outputted to the outside of the semiconductor memory device 21 through the output terminal 21a1 thereof as the data DQ<2> and the output of the higher subtristate buffer thereof is outputted to the outside of the semiconductor memory device 21 through the output terminal 21a1 thereof as the data DQ<3>.

Any one of the tristate buffers 5a3, 5b3, 25c3 and 25d3 is activated, and the output of the lower subtristate buffer of the activated tristate buffer is outputted to the outside of the semiconductor memory device 21 through the output terminal 21a1 thereof as the data DQ<4> and the output of the higher subtristate buffer thereof is outputted to the outside of the semiconductor memory device 21 through the output terminal 21a1 thereof as the data DQ<5>.

Any one of the tristate buffers 5a4, 5b4, 25c4 and 25d4 is activated, and the output of the lower subtristate buffer of the activated tristate buffer is outputted to the outside of the semiconductor memory device 21 through the output terminal 21a1 thereof as the data DQ<6> and the output of the higher subtristate buffer thereof is outputted to the outside of the semiconductor memory device 21 through the output terminal 21a1 thereof as the data DQ<7>. Further, when the enable signals OEN0<3:0>, OEN1<3:0>, OERR and OERC<3:0> are "1", the tristate buffers are activated and outputs the inputted signal without any change and when these enable signals are "0", the tristate buffers are inactivated and the output thereof comes into a high impedance state.

Figure 22:
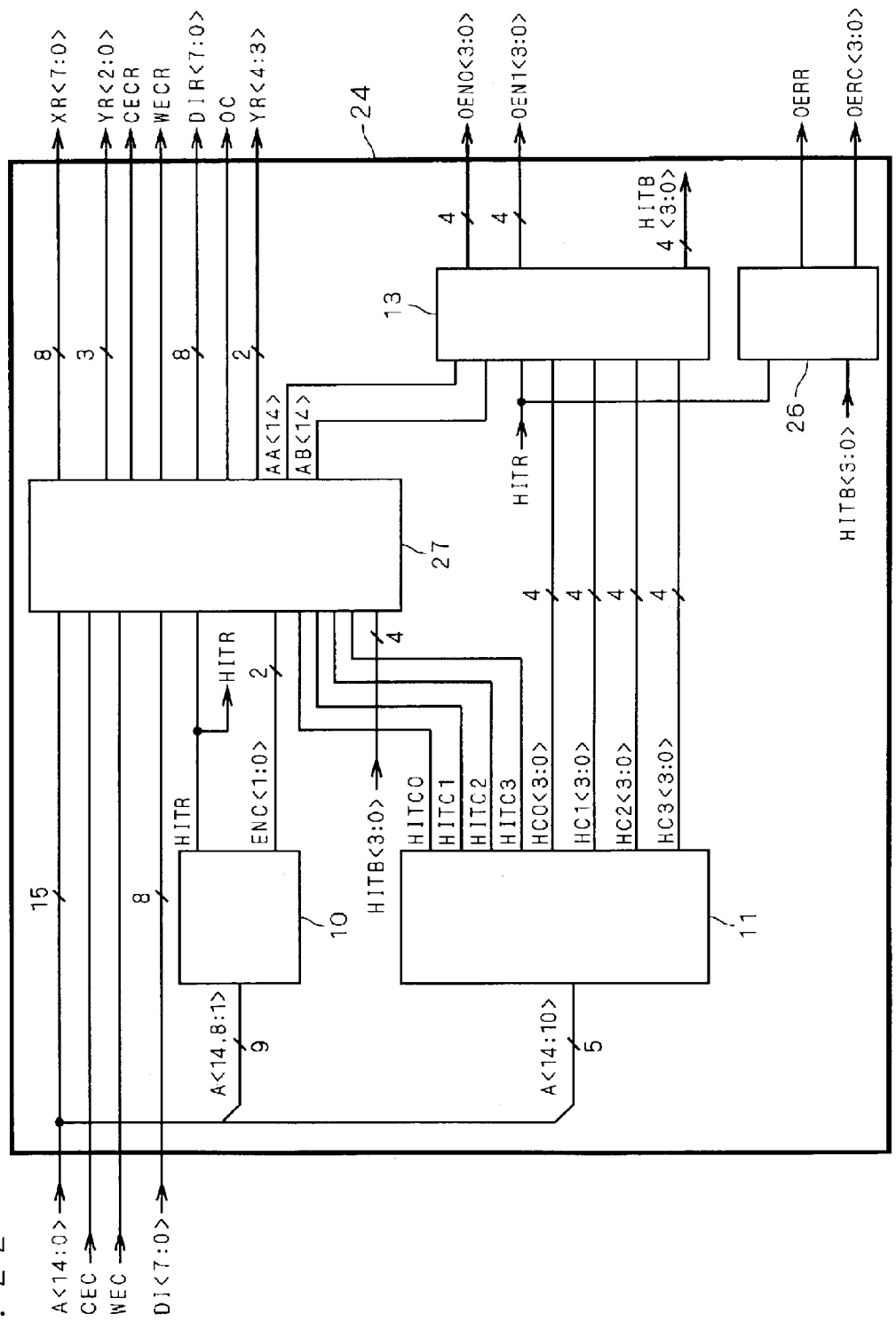

FIG. 22 is a block diagram showing a constitution of the redundancy control circuit 24. As shown in FIG. 22, the redundancy control circuit 24 comprises the basic constituents of the redundancy control circuit 6 and further comprises a redundancy RAM control circuit 27 instead of the redundancy RAM control circuit 12 and an enable signal output circuit 26 instead of the enable signal output circuit 14. Further, in the second preferred embodiment, the hit signal HITB<3:0> generated in the enable signal output circuit 13 is outputted to the outside of the enable signal output circuit 13.

Figure 23:
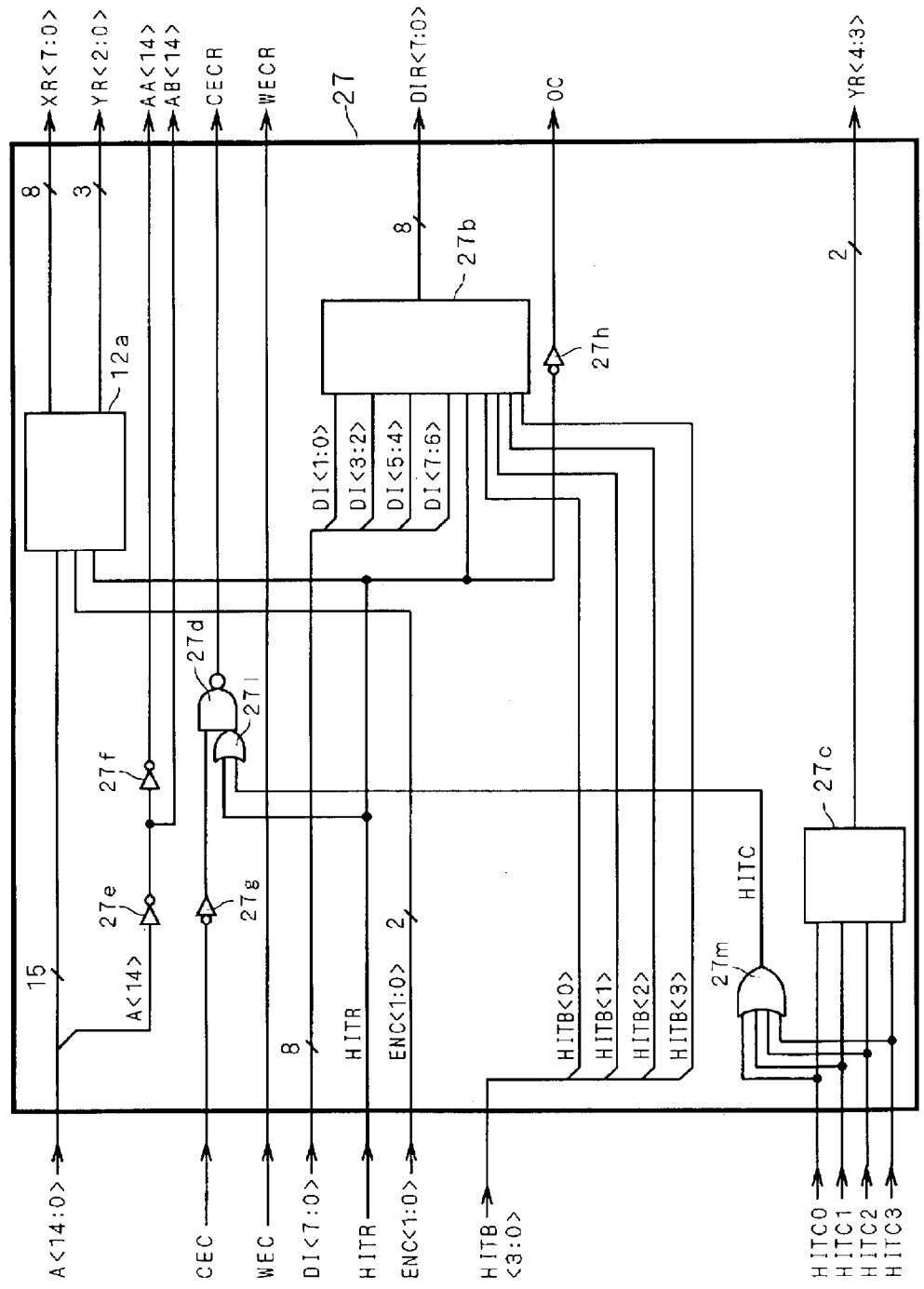

FIG. 23 is a circuit diagram showing a configuration of the redundancy RAM control circuit 27. As shown in FIG. 23, the redundancy RAM control circuit 27 comprises the above-discussed address scramble circuit 12a, a data input subword selection circuit 27b, a redundancy column address encoder 27c, a NAND circuit 27d, inverters 27e to 27h and OR circuits 27l and 27m.

The inverter 27e inverts the address A<14> and outputs the inverted signal to the enable signal output circuit 13 as the address AB<14>. The inverter 27f inverts the output of the inverter 27e and outputs the inverted signal to the enable signal output circuit 13 as the address AA<14>.

The inverter 27g inverts the chip enable signal CEC and outputs the inverted signal to the NAND circuit 27d. The OR circuit 27m performs an OR operation of the hit signals HITC0 to HITC3 and outputs the operation result to the OR circuit 27l as the hit signal HITC. The OR circuit 27l performs an OR operation of the hit signals HITR and HITC and outputs the operation result to the NAND circuit 27d. The NAND circuit 27d performs a NAND operation of the output from the inverter 27g and the output of the OR circuit 27l and outputs the operation result to the RAM 22f of the redundancy RAM 22 as the chip enable signal CECR.

The address scramble circuit 12a outputs the row address XR<7:0> and the column address YR<2:0> to the RAM 22f of the redundancy RAM 22 on the basis of the address A<14:0>, the encode signal ENC<1:0> and the hit signal HITR. Values of the row address XR<7:0> and the column address YR<2:0> are indicated in FIG. 15 as discussed above.

The redundancy column address encoder 27c outputs the address YR<4:3> on the basis of the hit signals HITC0 to HITC3. Specific values of the address YR<4:3> are indicated in FIG. 27. As shown in FIG. 27, when hit signal HITC0=1, the address YR<4:3> is (0, 0). When hit signal HITC0=0 and the hit signal HITC1=1, the address YR<4:3> is (0, 1). When hit signal HITC0=0, the hit signal HITC1=0 and hit signal HITC2=1, the address YR<4:3> is (1, 0). When hit signal HITC0=0, the hit signal HITC1=0, hit signal HITC2=0 and hit signal HITC3=1, the address YR<4:3> is (1, 1). When hit signal HITC0=0, the hit signal HITC1=0, hit signal HITC2=0 and hit signal HITC3=0, the address YR<4:3> is (1, 1).

The data input subword selection circuit 27b outputs the data DIR<7:0> to the redundancy RAM 22 on the basis of the data DI<7:0>, the hit signal HITR and the hit signals HITB<3:0>. Specific values of the data DIR<7:0> are indicated in FIG. 28. As shown in FIG. 28, when the hit signal HITR=1, the data DIR<7:0> is equal to the data DI<7:0>. When the hit signal HITR=0, the data DIR<7:0> takes the following values.

The data DIR<1:0> is equal to the data DI<1:0> when the hit signal HITB<0>=1, the data DIR<1:0> is equal to the data DI<3:2> when the hit signal HITB<1>=1, the data DIR<1:0> is equal to the data DI<5:4> when the hit signal HITB<2>=1 and the data DIR<1:0> is equal to the data DI<7:6> when the hit signal HITB<3>1. When the hit signal HITB<k>=1 (k=0 to 3), the values of the data DIR<7:2> are undefined The inverter 27h inverts the hit signal HITR and outputs the inverted signal to the redundancy RAM 22 as the organization change signal OC. Therefore, the organization change signal OC is an inverted signal of the hit signal HITR.

FIG. 24 is a circuit diagram showing a configuration of the enable signal output circuit 26. As shown in FIG. 24, the enable signal output circuit 26 comprises inverters 26a and 26b and AND circuits 26c to 26f. The inverter 26a inverts the hit signal HITR and outputs the inverted signal. The inverter 26b inverts the output of the inverter 26a and outputs the inverted signal as the enable signal OERR. Therefore, the enable signal OERR is a signal equivalent to the hit signal HITR.

The AND circuit 26c performs an AND operation of the output of the inverter 26a and the hit signal HITB<0> and outputs the operation result as the enable signal OERC<0>. The AND circuit 26d performs an AND operation of the output of the inverter 26a and the hit signal HITB<1> and outputs the operation result as the enable signal OERC<1>. The AND circuit 26e performs an AND operation of the output of the inverter 26a and the hit signal HITB<2> and outputs the operation result as the enable signal OERC<2>. The AND circuit 26f performs an AND operation of the output of the inverter 26a and the hit signal HITB<3> and outputs the operation result as the enable signal OERC<3>.

The other constituents of the semiconductor memory device 21 in the second preferred embodiment are the same as those of the semiconductor memory device 1 in the first preferred embodiment, and description of these constituents will be omitted.

Next, an operation of the semiconductor memory device 21 of the second preferred embodiment will be discussed. First discussion will be made on an operation in the case where the normal memory cell array 17 in each of the normal RAMs 2a and 2b has no defect. In this case, no fuse in the fuse circuits 10aj and 11ai is programmed, and the hit signals HITR, HITC and HITB<3:0> are always "0". The normal RAM 2 in the second preferred embodiment thereby performs the same operation as the normal RAM 2 in the first preferred embodiment.

On the side of the redundancy RAM 22, the chip enable signal CECR becomes "1" and the redundancy RAM 22 is inactivated, and further the enable signals OERR and OERC<3:0> are all "0" and the data DQR<7:0> of the redundancy RAM 22 is not outputted to the outside of the semiconductor memory device 21.

Thus, in the case where the normal RAM 2 has no defect, without using the redundancy RAM 22, the semiconductor memory device 21 of the second preferred embodiment can perform a function of a 256-kbit RAM with 8 bits and 32 kwords. Further, since the enable signal CECR=1, the redundancy RAM 22 uses no extra power consumption.

Next discussion will be made on an operation of the semiconductor memory device 21 in the case where the normal memory cell array 17 in the normal RAM 2 has a column defect. In the second preferred embodiment, like in the above first preferred embodiment, considered is a case where the column replacement unit (the pair of sections A) in the normal RAM 2 defined by the address A<13:10>=the address Yi<4:1>, the address A<14>=the address Zi<0> and subword number SB<1:0>=subword number Bi<1:0> is replaced by the i-th redundancy section C (i=0 to 3). In this case, the subword number SB<1:0> indicates subword No. k (k=0 to 3) and the k-th column replacement unit is replaced by the i-th redundancy section C.

In the case where the normal RAM 2 a column defect, the method of programming the fuse of the fuse circuit 11ai is as discussed above in the first preferred embodiment. Since the fuse of the fuse circuit 10aj in the row replacement selection circuit 10 is not programmed, the hit signal HITR becomes "0" and the organization change signal OC becomes "1", and the redundancy RAM 22 thereby performs a function of a RAM with 2 bits×5 kwords.

The redundancy column address comparator circuit 11bj, as discussed above, compares the address A<14:10> with the addresses FCiY1 to FCiY4 and FCiZ0 and outputs "1" when all the addresses coincide. The enable signal FCiEN indicates "1" since the unit fuse block 11aa which outputs the enable signal is programmed. Therefore, the hit signal HITCi becomes "1". Further, the subword selection signals FCiB0 and FCiB1 are decoded by the redundancy column subword decoder 11ci and the decoded result is inputted to the AND circuit 11ei to 11hi. The hit signal HCi<k> thereby becomes "1". The outputs from one of the OR circuits 13a to 13d to which the hit signal HCi<k> is inputted become "1" and the hit signal HITB<k> becomes "1".

On the side of the normal RAM 2, one of the AND circuits 13l to 13s to which the hit signal HITB<k> is inputted output "0", and the enable signals OEN0<k> and OEN1<k> become "0" regardless of the value of the address A<14> and the outputs of the tristate buffers to which the enable signals are connected are brought into a high impedance state. Therefore, in each of the data DQNA<7:0> and the data DQNB<7:0>, the data corresponding to the k-th subword is not outputted to the outside of the semiconductor memory device 21.

On the side of the redundancy RAM 22, the enable signal OERC<k> corresponding to the hit signal HITB<k> becomes "1" and the tristate buffer to which the enable signal is connected is activated. Therefore, the data DQR<1:0> of the redundancy RAM 22 is outputted to the outside of the semiconductor memory device 21 instead of the output data corresponding to the k-th subword of the normal RAM 2.

The address YR<4:3> is an address which is consequently obtained by encoding the value of "i". Since the address YR<4:3> is decoded again by the decoder 22a of the redundancy RAM 22, access is made to a redundancy memory cell corresponding to the i-th subword in the RAM 22f.

When the column replacement units in the normal memory cell array 17 which are specified by the column addresses YN<4:0> having the same value and correspond to two subwords having different numbers each have a defect, since simultaneous access can not be made to a plurality of sections C in the redundancy RAM 22 in the second preferred embodiment, it is impossible to relieve these column replacement units.

Next discussion will be made on an operation of the semiconductor memory device 21 in the case where the normal memory cell array 17 in the normal RAM 2 has a row defect. Also in the second preferred embodiment, like in the above-discussed first preferred embodiment, considered is a case where a row replacement unit (a section B) in the normal RAM 2 defined by the address A<8:1>=the address Xj<8:1> and the address A<14>=the address Zj<0> is replaced by the j-th redundancy section D (j=0 to 3).

In the case where the normal RAM 2 has a row defect, the method of programming the fuse of the fuse circuit 10aj is as discussed above in the first preferred embodiment.

The redundancy row address comparator circuit 10bj, as discussed above, compares the address A<14, 8:1> with the addresses FRjX1 to FRjX8 and FRjZ0 and outputs "1" when all the addresses coincide. The enable signal FRjEN indicates "1" since the unit fuse block 10aa which outputs the enable signal is programmed. Therefore, the hit signal HITRj becomes "1". The hit signal HITR, which is an operation result of the OR operation of the hit signals HITR0 to HITR3, indicates "1".

The organization change signal OC indicates "0", and the redundancy RAM 22 performs a function of a RAM with 8 bits×1.25 kwords.

On the side of the normal RAM 2, since the hit signal HITR=1, regardless of the values of the address A<14> and the hit signal HITB<3:0>, all the enable signals OEN0<3:0> and OEN1<3:1> become "0" and all the outputs from the tristate buffers 5a1 to 5a4 and 5b1 to 5b4 are brought into a high impedance state. Therefore, none of the data DQNA<7:0> and the data DQNB<7:0> are outputted to the outside of the semiconductor memory device 21.

On the side of the redundancy RAM 22, regardless of the value of the hit signal HITB<3:0>, the enable signal OERR becomes "1" and the enable signal OERC<3:0> becomes (0000) by the output of the inverter 26a, i.e., the inverted signal of the hit signal HITR, and the data DQR<7:0> is outputted to the outside of the semiconductor memory device 21 as the data DQ<7:0>. The operation of the semiconductor memory device 21 other than this is the same as that of the semiconductor memory device 1 in the first preferred embodiment.

In the redundancy row address comparator circuit 10bi, when the address A<14, 8:1> does not coincide with all the addresses FRjX1 to FRjX4 and FRjZ0, all the hit signals HITRj become "0" and the hit signal HITR also becomes "0". The operation in this case is the same as that in the case where the normal RAM 2 has no defect.

Thus, when the normal RAM 2 has a row defect, the row replacement unit including a defective area in the normal memory cell array 17 is logically replaced by the redundancy section D of the redundancy memory cell array in the redundancy RAM 22. There are four redundancy sections D (j=0 to 3) and any one of them can replace any row replacement unit in the normal RAM 2.

Though a replacement operation in the case where the normal memory cell array 17 has a row defect or a column defect has been discussed above, even when the normal memory cell array 17 has a single bit defect, it is possible to relieve the normal memory cell array 17 by replacing the normal memory cell array 17 by the redundancy section C or the redundancy section D.

Further, when the normal memory cell array 17 has both the row and column defects, the normal memory cell array 17 can be relieved by using both the redundancy section C and the redundancy section D. In this case, like in the above-discussed first preferred embodiment, if the address A<14:0> indicates the normal memory cell 16 included in both the column replacement unit and the row replacement unit, the row replacement is performed prior to the column replacement.

In the semiconductor memory device 1 of the above-discussed first preferred embodiment, the number of tristate buffers increases and the circuit scale of the data output selection circuit 5 is thereby enlarged since it is necessary to connect all the output terminals 3a1 of the redundancy RAM 3, i.e., eight output terminals 3a1, to the output terminal 1a1 of the semiconductor memory device 1 by the data output selection circuit 5.

In the second preferred embodiment, the output terminals 22a1 of the redundancy RAM 22 which are connected to the data output selection circuit 22c are those for outputting the data DQR<1:0>, in other words, the number of output terminals 22a1 is two. The number is smaller than the number of output terminals 22f1 (eight) of the RAM 22f. Accordingly, if the operation for the column replacement is considered, only two output terminals 22a1 have to be connected to the output terminal 21a1 of the semiconductor memory device 21 by the data output selection circuit 25. Therefore, as discussed in the second preferred embodiment, it is possible to reduce the number of tristate buffers and reduce the circuit scale of the data output selection circuit as compared with that of the first preferred embodiment. The output terminals 22a1 of the redundancy RAM 22 serve as intermediate connection terminals for transmitting the data DQRC<7:0> from the RAM 22f to the data output selection circuit 25.

Though the data input subword selection circuit 27b of the second preferred embodiment outputs the data indicated in FIG. 28 as discussed above as the data DIR<7:0>, the data input subword selection circuit 27b may output the data indicated by FIG. 29.

As shown in FIG. 29, the data DIR<7:0> is equal to the data DI<7:0> when the hit signal HITR=1, and the value of the data DIR<7:0> depends on the values of the hit signals HITB<0> to HITB<3> when the hit signal HITR=0. The data DIR<1:0>, DIR<3:2>, DIR<5:4> and DIR<7:6> are each equal to the data DI<1:0> when the hit signal HITB<0>=1, and the data DIR<1:0>, DIR<3:2>, DIR<5:4> and DIR<7:6> are each equal to the data DI<3:2> when the hit signal HITB<1>=1. The data DIR<1:0>, DIR<3:2>, DIR<5:4> and DIR<7:6> are each equal to the data DI<5:4> when the hit signal HITB<2>=1, and the data DIR<1:0>, DIR<3:2>, DIR<5:4> and DIR<7:6> are each equal to the data DI<7:6> when the hit signal HITB<3>=1.

The data input subword selection circuit 27b does not need the DI selector 22b when it outputs the data indicated in FIG. 29 and can input the data DIR<7:0> to the RAM 22f as DIRC<7:0> without any change.

The Third Preferred Embodiment

FIGS. 30 to 36 are diagrams showing a constitution of a semiconductor memory device 31 in accordance with the third preferred embodiment of the present invention. The semiconductor memory device 31 of the third preferred embodiment is a 256-kbit RAM with 8 bits×32 kwords.

Figure 30:
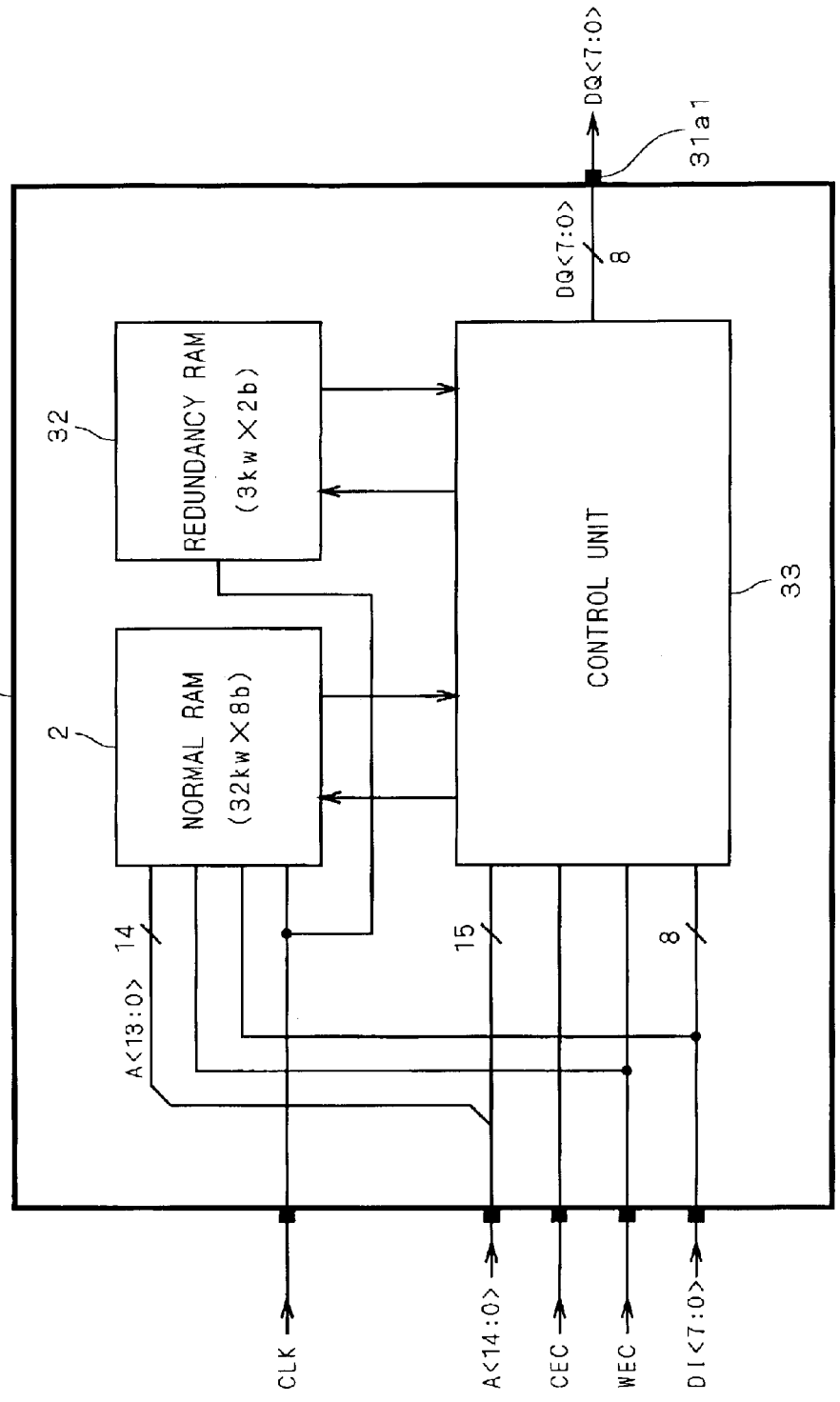

As shown in FIG. 30, the semiconductor memory device 31 of the third preferred embodiment comprises the basic constituents of the semiconductor memory device 21 of the second preferred embodiment and further comprises a control unit 33 instead of the control unit 23 and a redundancy RAM 32 instead of the redundancy RAM 22. The redundancy RAM 32 is a 6-kbit RAM with 2 bits×3 kwords, having a redundancy memory cell array consisting of a plurality of redundancy memory cells arranged in a matrix with 384 rows and 16 columns. Further, the redundancy RAM 32 is provided independently from the normal RAM 2 and performs almost the same operation as the redundancy RAM 22 of the second preferred embodiment does when the organization change signal OC=1, i.e., for column replacement.

FIG. 31 is a diagram showing input and output signals to/from the redundancy RAM 32. The unit data with which the redundancy RAM 32 deals, i.e., the I/O data has two bits. To the redundancy RAM 32, 9-bit row address XR<8:0>, 3-bit column address YR<2:0>, the chip enable signal CECR, the write signal WECR and 2-bit data DIR<1:0> are inputted from the control unit 33. Further, the clock CLK is inputted to the redundancy RAM 32 as the clock CLKR from the outside of the semiconductor memory device 31. The redundancy RAM 32 outputs 2-bit data DQR<1:0> to the control unit 33 through its output terminals 32a1.

Figure 38:
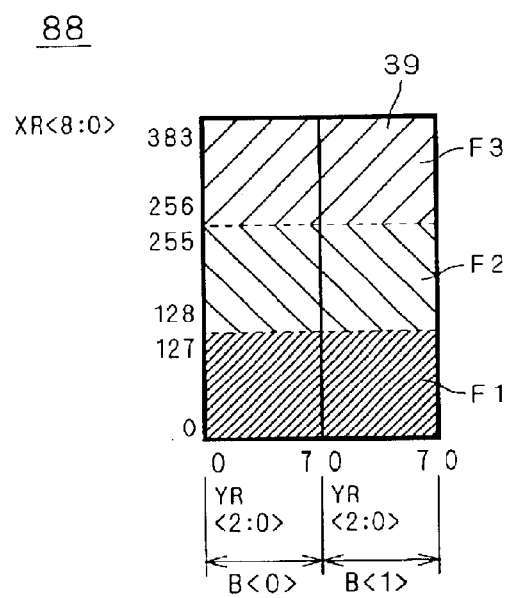
FIG. 38 is a diagram showing a constitution of a redundancy memory cell array in accordance with the third preferred embodiment of the present invention.

FIG. 38 is a schematic diagram showing a constitution of a redundancy memory cell array 88 included in the redundancy RAM 32. As shown in FIG. 38, a plurality of redundancy memory cells 39 arranged in a matrix with 384 rows and 8 columns correspond to one bit of the unit data (2 bits) in the redundancy RAM 32. In FIG. 38, bits B<0> and B<1> represent the bits of the unit data in the redundancy RAM 32 and the bit B<0> represents the least significant bit. Further, the respective redundancy memory cells 39 corresponding to the bits B<0> and B<1> are referred to as redundancy memory cell groups 88a and 88b.

Next, an operation of the redundancy RAM 32 will be discussed. The redundancy RAM 32 performs read and write of data in synchronization with the clock CLKR. The redundancy RAM 32 decodes the inputted row address XR<8:0> to select one out of the 384 rows, which is indicated by the decoded result. Then, the redundancy RAM 32 decodes the column address YR<2:0> to select one out of the 8 columns in each of the redundancy memory cell groups 88a and 88b, which is indicated by the decoded result. The redundancy memory cell 39 specified by the row address XR<8:0> and the column address YR<2:0> is thereby selected in each of the memory cell groups 88a and 88b.

When the chip enable signal CECR=0 and the write signal WECR=1, data is read out from the selected redundancy memory cell 39 in each of the memory cell groups 88a and 88b and outputted to the control unit 33 as the 2-bit data DQR<1:0>.

When the chip enable signal CECR=0 and the write signal WECR=0, the data DIR<1:0> from the control unit 33 is written into the selected redundancy memory cell 39.

The redundancy RAM 32 having the above constitution does not have a redundancy circuit therein for replacement of the memory cells thereof and can be automatically generated by a general module generator.

Figure 37:
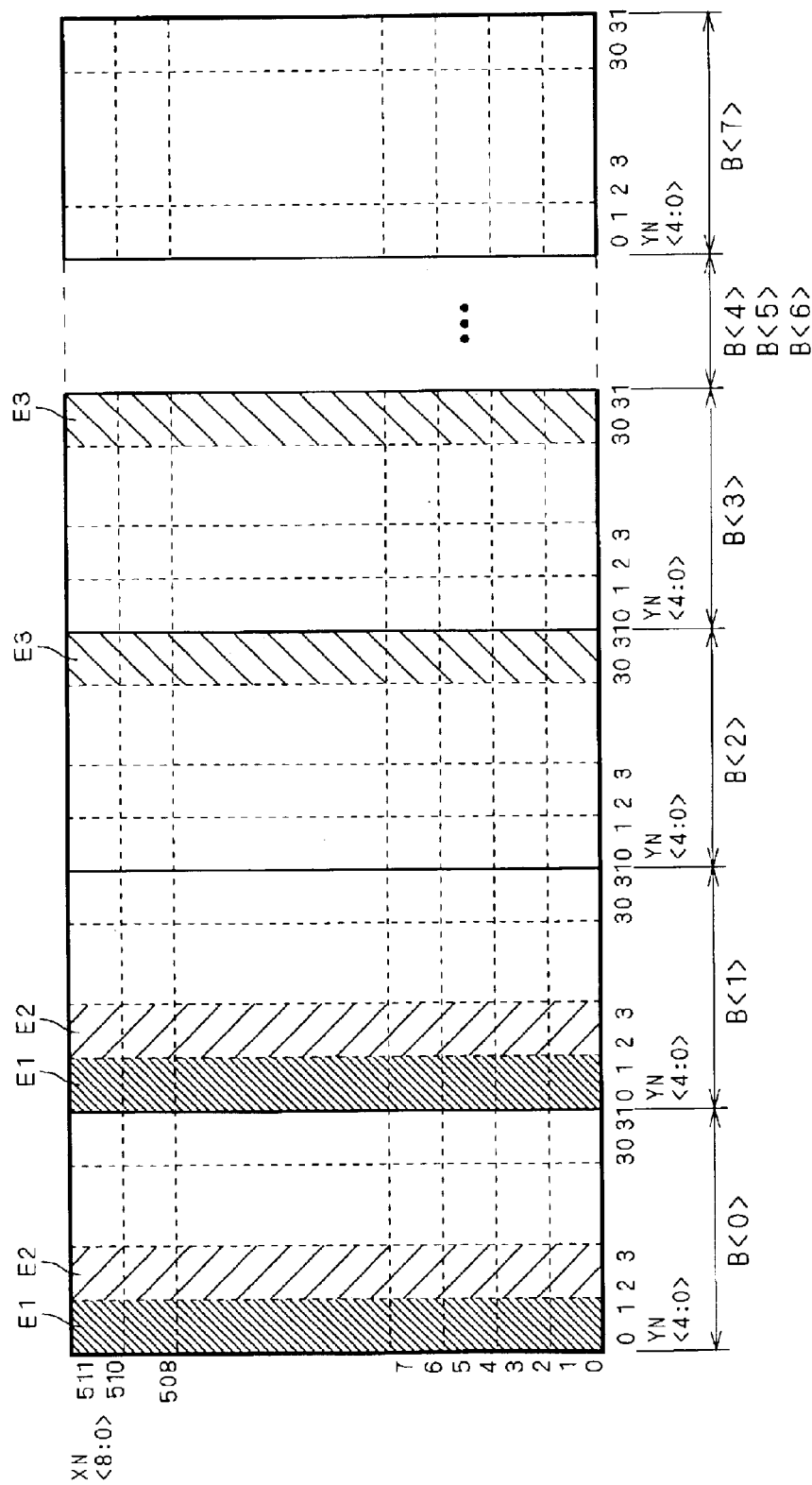
FIG. 37 is a diagram showing a constitution of a normal memory cell array in accordance with the third preferred embodiment of the present invention.

Next, discussion will be made on a method of replacing the normal memory cell array 17 in the normal RAMs 2a and 2b by the redundancy memory cell array 88 in the redundancy RAM 32. FIGS. 37 and 38 show a replacement mapping in replacing the normal RAMs 2a and 2b by the redundancy RAM 32, and the following discussion will be made referring to these figures.

FIG. 37 shows the normal memory cell array 17 in each of the normal RAM 2a and 2b which is the same as that shown in FIG. 12. In FIG. 37, a pair of sections E1, a pair of sections E2 and a pair of sections E3 each show a column replacement unit of the normal memory cell array 17, and the sections A constituting the column replacement unit are shown as the sections E1 to E3, for convenience of illustration. Further, in the normal memory cell array 17 of the third preferred embodiment, no row replacement unit (section B) is not defined in advance and only the column replacement unit is defined by the control unit 33.

As shown in FIG. 38, the redundancy memory cell array 88 of the redundancy RAM 32 is logically divided in advance into three redundancy sections F1 to F3. These redundancy sections F1 to F3 are used for the column replacement by the control unit 33. Further, the redundancy RAM 32 has no redundancy section used for the row replacement.

Each of the redundancy sections F1 to F3 is constituted of a plurality of redundancy memory cells 39 arranged in a matrix with 128 rows and 16 columns. A plurality of redundancy memory cells 39 arranged in the rows specified by a range of the row address XR<8:0>=0 to 127 (in decimal) constitute the redundancy section F1, a plurality of redundancy memory cells 39 arranged in the rows specified by a range of the row address XR<8:0>=129 to 255 (in decimal) constitute the redundancy section F2 and a plurality of redundancy memory cells 39 arranged in the rows specified by a range of the row address XR<8:0>=256 to 383 (in decimal) constitute the redundancy section F3. In some cases, the redundancy sections F1, F2 and F3 are referred to as "the zeroth redundancy section F", "the first redundancy section F" and "the second redundancy section F", respectively. The control unit 33 defines these redundancy sections F1 to F3 in advance with respect to the redundancy memory cell area 38.

In the semiconductor memory device 31 of the third preferred embodiment, when the normal memory cell array 17 has a defect and a column replacement is performed, it is possible to replace the column replacement unit in the normal memory cell array 17 corresponding to the defective portion by arbitrary one of the redundancy sections F1 to F3 in the redundancy memory cell array 88 by a control of the control unit 33. For example, the pair of sections E1 in the normal memory cell array 17 can be replaced by the redundancy section F1 in the redundancy memory cell array 88, the pair of sections E2 in the normal memory cell array 17 can be replaced by the redundancy section F2 in the redundancy memory cell array 88 and the pair of sections E3 in the normal memory cell array 17 can be replaced by the redundancy section F3 in the redundancy memory cell array 88.

Figure 32:
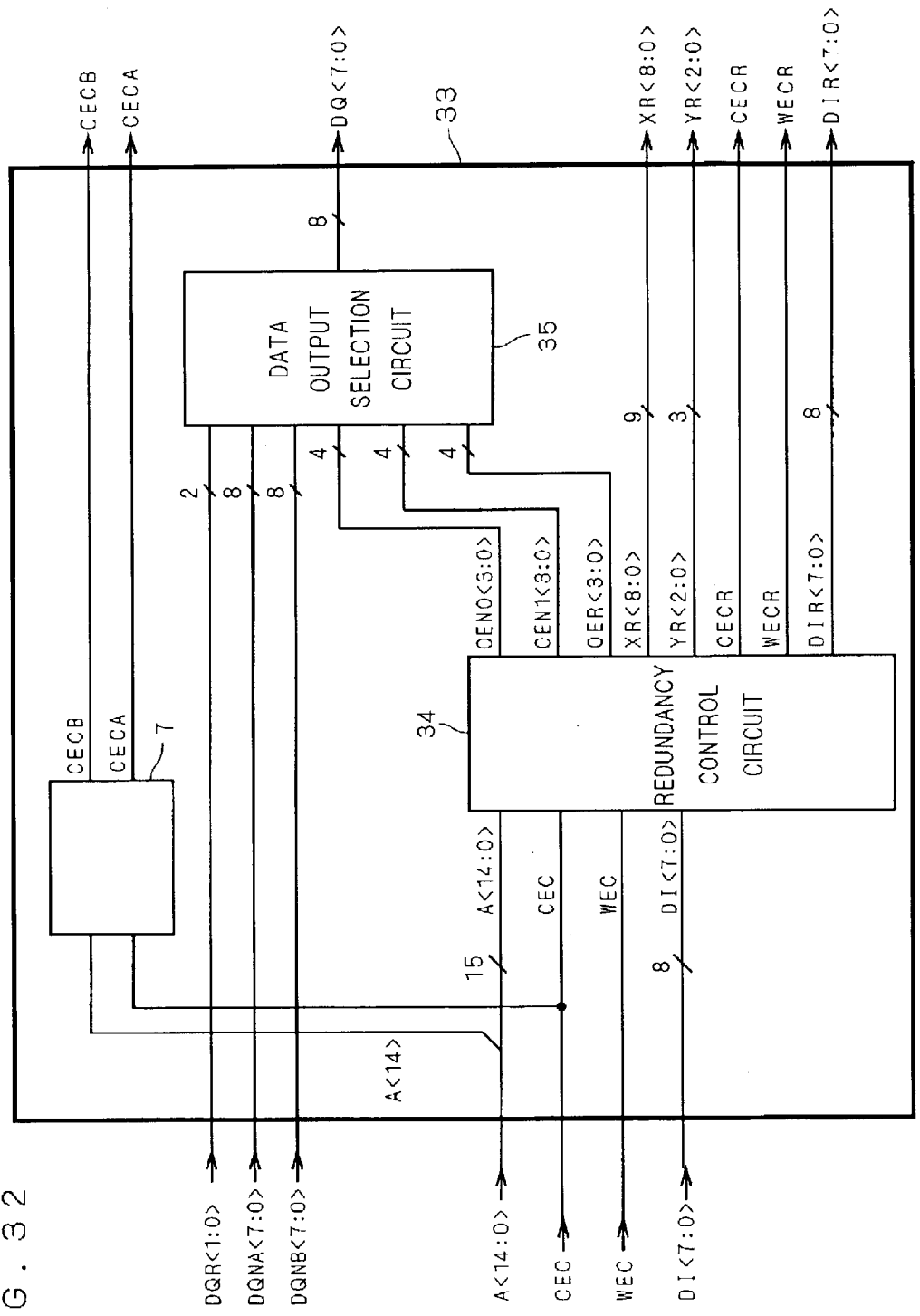

Next discussion will be made on an internal constitution of the control unit 33 for performing such a replacement. FIG. 32 is a block diagram showing a constitution of the control unit 33. As shown in FIG. 32, the control unit 33 of the third preferred embodiment comprises the basic constituents of the control unit 23 of the second preferred embodiment and further comprises a data output selection circuit 35 instead of the data output selection circuit 25 and a redundancy control circuit 34 instead of the redundancy control circuit 24.

Figure 33:
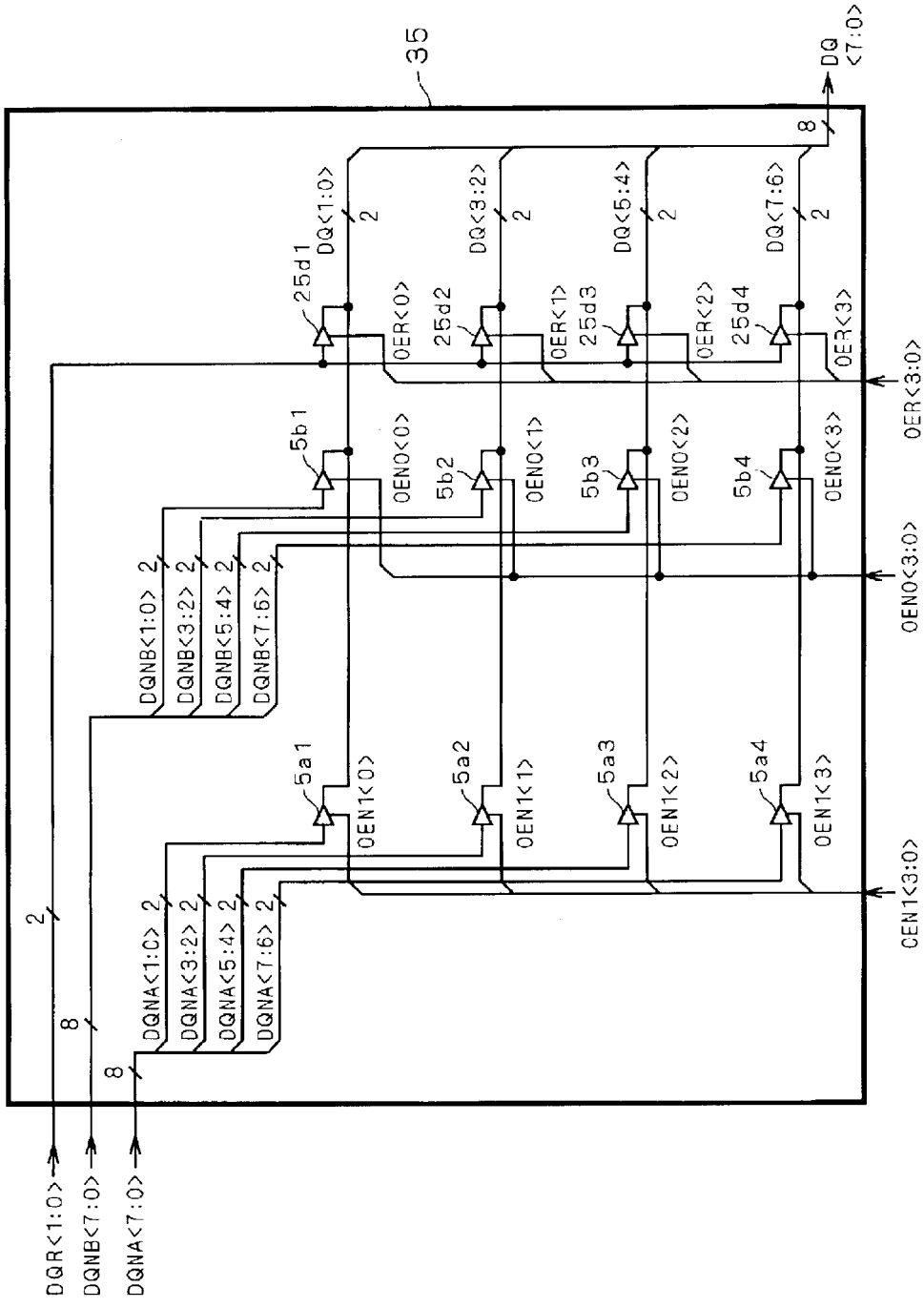

FIG. 33 is a circuit diagram showing a configuration of the data output selection circuit 35. As shown in FIG. 33, the data output selection circuit 35 basically has a configuration of the above data output selection circuit 25 without the tristate buffers 25c1 to 25c4.

The tristate buffers 25d1 to 25d4 are buffers for connecting the output terminals 32a1 of the redundancy RAM 32 to the data output terminal 31a1 (shown in FIG. 30) of the semiconductor memory device 31. The data DQR<1:0> outputted from the redundancy RAM 32 is inputted to all the tristate buffers 25d1 to 25d4.

The tristate buffers 25d1 to 25d4 are controlled on activation/inactivation by the enable signals OER<0> to OER<3>, respectively, and each output the inputted signal without any change when the enable signals OER<0> to OER<3> indicate "1" and their respective outputs come into a high impedance state when the enable signals indicate "0".

Figure 34:
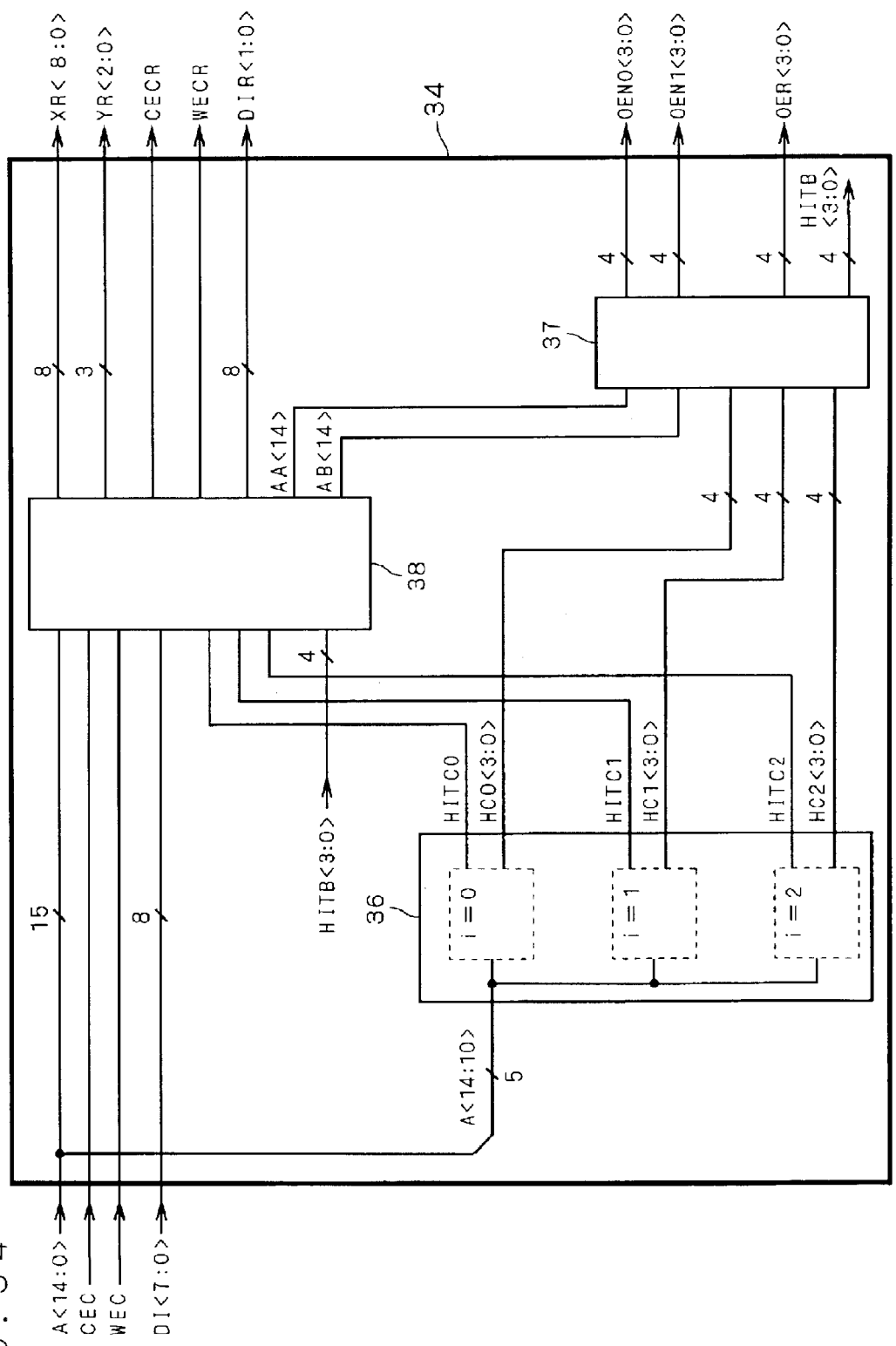

FIG. 34 is a block diagram showing a constitution of the redundancy control circuit 34. As shown in FIG. 34, the redundancy control circuit 34 comprises a column replacement selection circuit 36, an enable signal output circuit 37 and a redundancy RAM control circuit 38. The column replacement selection circuit 36 has a constitution of the column replacement selection circuit 11 shown in FIG. 8 without the fuse circuit 11a3, the redundancy column address comparator circuit 11b3, the redundancy column subword decoder 11c3 and the AND circuits 11d3, 11e3, 11f3, 11g3 and 11h3. In other words, the column replacement selection circuit 36 comprises the fuse circuits 11ai (i=0 to 2), the redundancy column address comparator circuits 11bi (i=0 to 2), the redundancy column subword decoders 11ci (i=0 to 2) and the AND circuits 11di, 11ei, 11fi, 11gi and 11hi (i=0 to 2). Therefore, as shown in FIG. 34, the column replacement selection circuit 36 receives the address A<14:10> and outputs the hit signals HITC0 to HITC2, HC0<3:0>, HC1<3:0> and HC2<3:0>.

Figure 35:
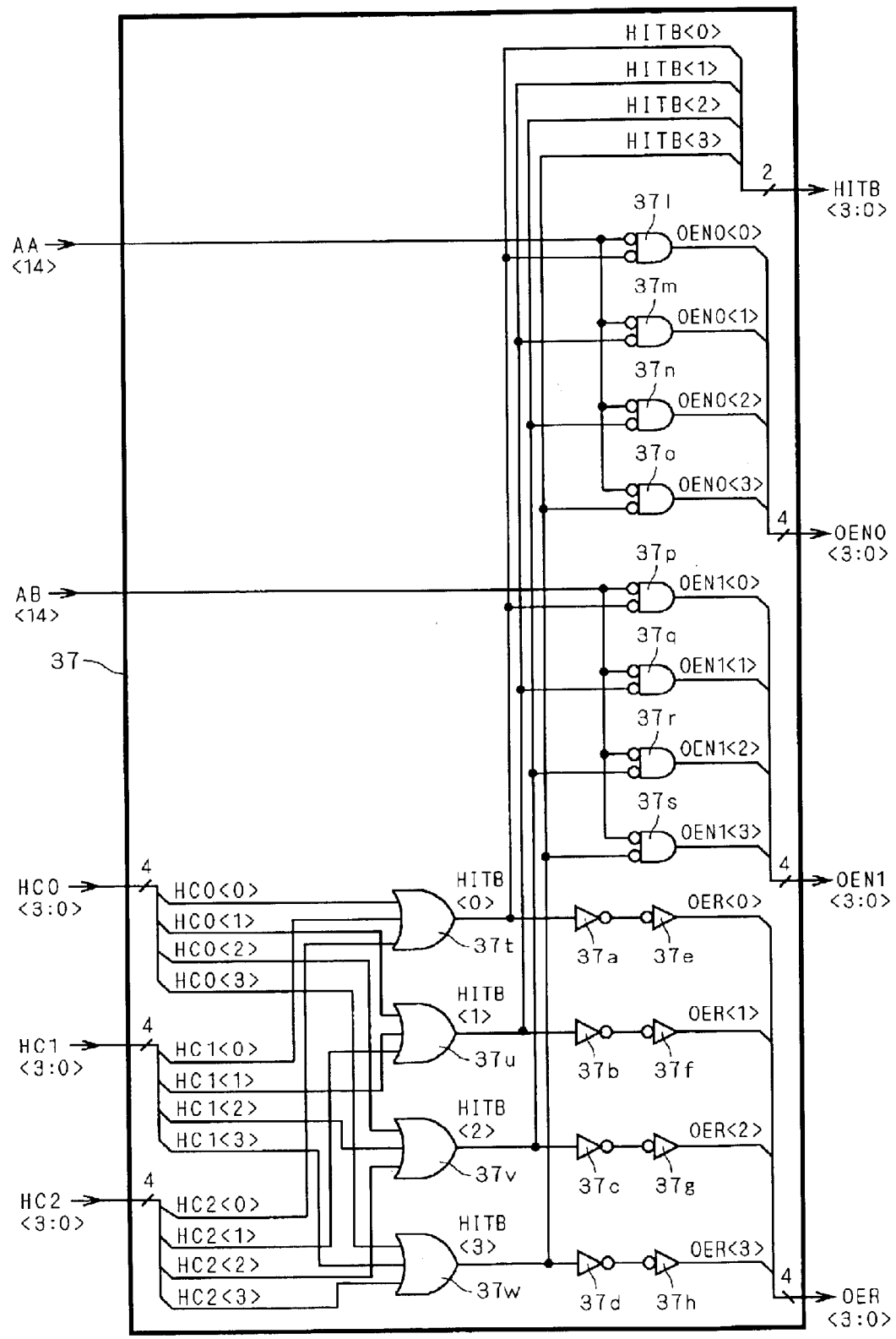

FIG. 35 is a circuit diagram showing a configuration of the enable signal output circuit 37. As shown in FIG. 35, the enable signal output circuit 37 comprises inverters 37a to 37h and NAND circuits 37l to 37s and OR circuits 37t to 37w. The hit signals HCi<0>, HCi<1>, HCi<2> and HCi<3> (i=0 to 3) are inputted to the OR circuits 37t to 37w, respectively. The OR circuits 37t to 37w each perform an OR operation of the inputted three signals and output the hit signals HITB<0> to HITB<3>.

The inverters 37a to 37d each invert the hit signals HITB<0> to HITB<3> and output the inverted signal. The inverters 37e to 37h invert the outputs of the inverters 37a to 37d, respectively, and output the inverted signals. The outputs of the inverters 37e to 37h are inputted to the data output selection circuit 35 as the enable signals OER<0> to OER<3>, respectively.

The address AA<14> from the redundancy RAM control circuit 38 is inputted to all the NAND circuits 37l to 37o. Further, the hit signals HITB<0> to HITB<3> are inputted to the NAND circuits 37l to 37o, respectively. The NAND circuits 37l to 37o each perform an NAND operation of the inputted two signals and output the operation result. The outputs of the NAND circuits 37l to 37o are inputted to the data output selection circuit 35 as the enable signals OEN0<0> to OEN0<3>, respectively.

The address AB<14> from the redundancy RAM control circuit 38 is inputted to all the NAND circuits 37p to 37s. Further, the hit signals HITB<0> to HITB<3> are inputted to the NAND circuits 37p to 37s, respectively. The NAND circuits 37p to 37s each perform an NAND operation of the inputted two signals and output the operation result. The outputs of the NAND circuits 37p to 37s are inputted to the data output selection circuit 35 as the enable signals OEN1<0> to OEN1<3>, respectively. Further, the hit signals HITB<3:0> generated by the OR circuits 37t to 37w are also inputted to the redundancy RAM control circuit 38.

Figure 36:
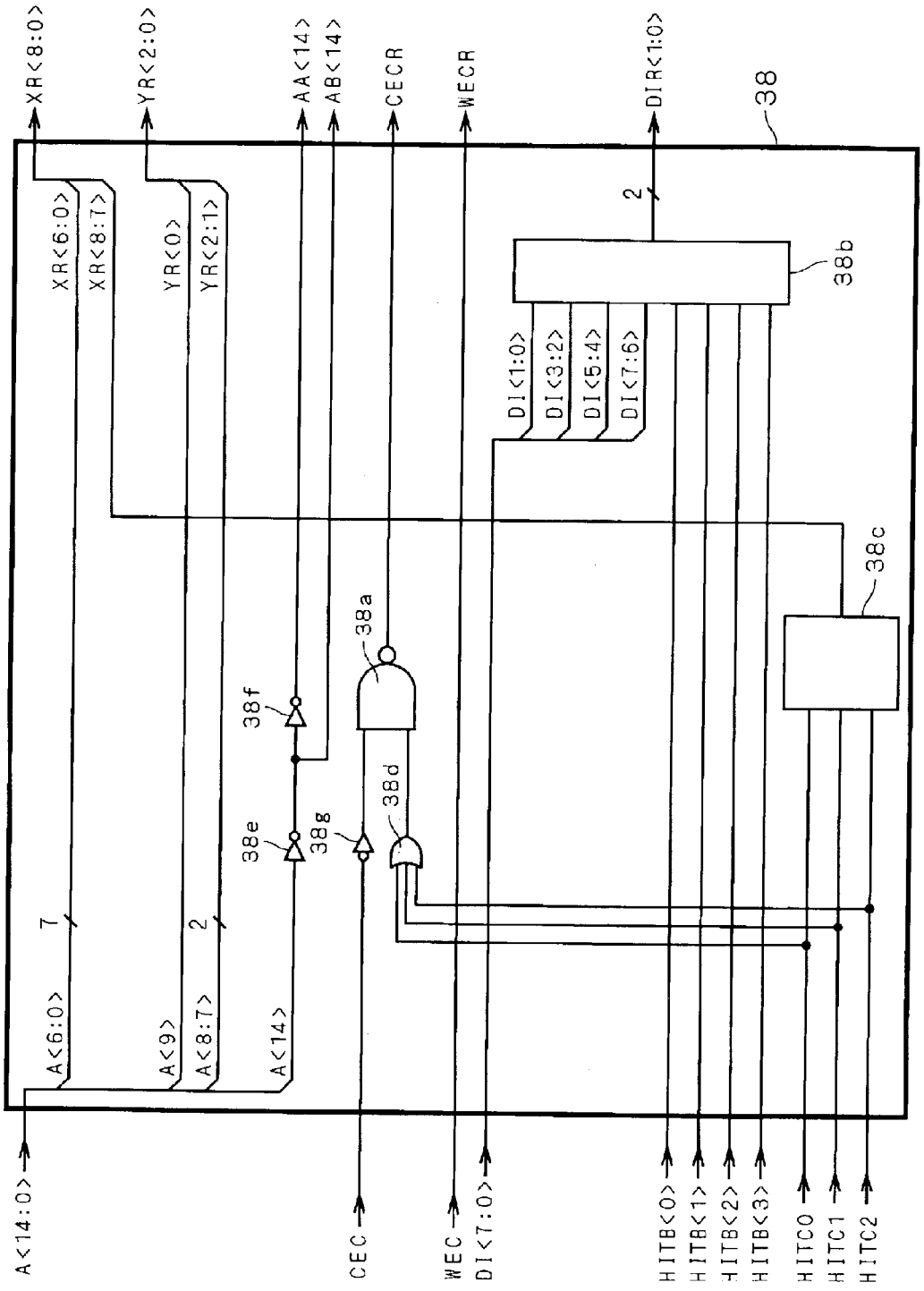

FIG. 36 is a circuit diagram showing a configuration of the redundancy RAM control circuit 38. As shown in FIG. 36, the redundancy RAM control circuit 38 comprises a NAND circuit 38a, a data input subword selection circuit 38b, a redundancy column address encoder 38c, an OR circuit 38d and inverters 38e to 38g.

The inverter 38e inverts the address A<14> and outputs the inverted signal to the enable signal output circuit 37 as the address AB<14>. The inverter 38f inverts the output of the inverter 38e and outputs the inverted signal to the enable signal output circuit 37 as the address AA<14>.

The inverter 38g inverts the chip enable signal CEC and outputs the inverted signal to the NAND circuit 38a. The OR circuit 38d performs an OR operation of the hit signals HITC0 to HITC2 and outputs the operation result to the NAND circuit 38a. The NAND circuit 38a performs a NAND operation of the output of the inverter 38g and the output of the OR circuit 38d and outputs the operation result to the redundancy RAM 32 as the chip enable signal CECR.

The redundancy column address encoder 38c encodes the hit signals HITC0 to HITC2 and outputs the address XR<8:7>. The address XR<8:7> is (0, 0) when the hit signal HITC0=1, and the address XR<8:7> is (0, 1) when the hit signal HITC0=0 and the hit signal HITC1=1. The address XR<8:7> is (1, 0) when the hit signal HITC0=0, the hit signal HITC1=0 and the hit signal HITC2=1.

The data input subword selection circuit 38b outputs the data DIR<1:0> to the redundancy RAM 32 on the basis of the data DI<7:0> and the hit signals HITB<3:0>. The data DIR<1:0> is equal to the data DI<1:0> when the hit signal HITB<0>=1, the data DIR<1:0> is equal to the data DI<3:2> when the hit signal HITB<1>=1, the data DIR<1:0> is equal to the data DI<5:4> when the hit signal HITB<2>=1 and the data DIR<1:0> is equal to the data DI<7:6> when the hit signal HITB<3>=1. The write signal WEC inputted from the outside of the semiconductor memory device 31 is inputted to the redundancy RAM 32 as the write signal WECR.

The other constituents of the semiconductor memory device 31 in the third preferred embodiment are the same as those of the semiconductor memory device 21 in the second preferred embodiment, and description of these constituents will be omitted.

Next, an operation of the semiconductor memory device 31 of the third preferred embodiment will be discussed. First discussion will be made on an operation in the case where the normal memory cell array 17 in each of the normal RAMs 2a and 2b has no defect. In this case, no fuse of the fuse circuits 11ai (i=0 to 2) in the column replacement selection circuit 36 is programmed, and the hit signals HITB<3:0> are all always "0". The normal RAM 2 in the third preferred embodiment thereby performs the same operation as the normal RAM 2 in the second preferred embodiment.

On the side of the redundancy RAM 32, the chip enable signal CECR becomes "1" and the redundancy RAM 32 is inactivated, and further the enable signals OER<3:0> are all "0" and the data DQR<1:0> of the redundancy RAM 32 is not outputted to the outside of the semiconductor memory device 31.

Next discussion will be made on an operation of the semiconductor memory device 31 in the case where the normal memory cell array 17 in the normal RAM 2 has a column defect. In the third preferred embodiment, considered is a case where the column replacement unit in the normal RAM 2 defined by the address A<13:10>=the address Yi<4:1>, the address A<14>=the address Zi<0> and subword number SB<1:0>=subword number Bi<1:0> is replaced by the i-th redundancy section F (i=0 to 2). In this case, the subword number SB<1:0> indicates subword No. k (k=0 to 3) and the k-th column replacement unit is replaced by the i-th redundancy section F.

In the case where the normal RAM 2 has a column defect, the method of programming the fuse of the fuse circuit 11ai is as discussed above in the first preferred embodiment. The redundancy column address comparator circuit 11bj, as discussed above, compares the address A<14:10> with the addresses FCiY1 to FCiY4 and FCiZ0 and outputs "1" when all the addresses coincide. The enable signal FCiEN indicates "1" since the unit fuse block 11aa which outputs the enable signal is programmed. Therefore, the hit signal HITCi becomes "1".

Further, the subword selection signals FCiB0 and FCiB1 are decoded by the redundancy column subword decoder 11ci and the decoded result is inputted to the AND circuit 11ei to 11hi. The hit signal HCi<k> thereby becomes "1". The outputs from one of the OR circuits 37t to 37w in the enable signal output circuit 37 to which the hit signal HCi<k> is inputted become "1" and the hit signal HITB<k> becomes "1".

On the side of the normal RAM 2, one of the AND circuits 37l to 37s to which the hit signal HITB<k> is inputted output "0", and the enable signals OEN0<k> and OEN1<k> become "0" regardless of the value of the address A<14> and the outputs of the tristate buffers to which the enable signals are connected are brought into a high impedance state. Therefore, in each of the data DQNA<7:0> and DQNB<7:0>, the data corresponding to the k-th subword is not outputted to the outside of the semiconductor memory device 31.

On the side of the redundancy RAM 32, the enable signal OER<k> corresponding to the hit signal HITB<k> becomes "1" and the tristate buffer to which the enable signal is connected is activated. Therefore, the data DQR<1:0> of the redundancy RAM 32 is outputted to the outside of the semiconductor memory device 31 instead of the output data corresponding to the k-th subword of the normal RAM 2.

As discussed above, since the number of bits of the data corresponding to the column replacement unit is two (bits) in the semiconductor memory device 31 of the third preferred embodiment, in other words, since a replacement is performed on a subword basis, the redundancy RAM 32 in which the number of bits of the unit data is smaller than that of the normal RAM 2 can be adopted.

Figure 39:
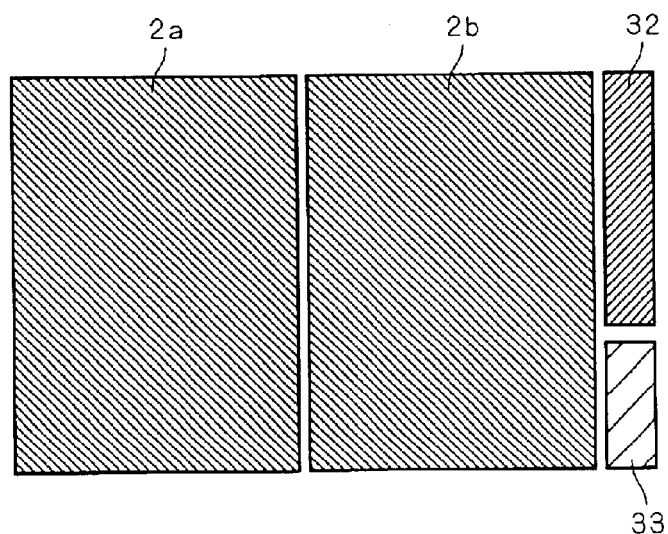
FIG. 39 is a view showing an exemplary floor plan of the semiconductor memory device in accordance with the third preferred embodiment of the present invention.

Further, since the redundancy RAM 32 whose unit data consists of two bits is adopted as a redundancy circuit of the normal RAM 2, an efficient layout is achieved in the semiconductor memory device 31 on the whole. FIG. 39 is a view showing an exemplary floor plan of the semiconductor memory device 31. Since the number of columns in the redundancy RAM 32 is smaller than that in the first and second preferred embodiments, the increase in area of the width in a case of lateral alignment of the normal RAM 2 and the redundancy RAM 32 is smaller than that in the first and second preferred embodiments. Furthermore, since the number of rows in the redundancy RAM 32 is smaller that in the normal RAM 2, if the control unit 33 is disposed below the redundancy RAM 32, it is possible to uniformize the length of the semiconductor memory device 31.

The Fourth Preferred Embodiment

Figure 40:
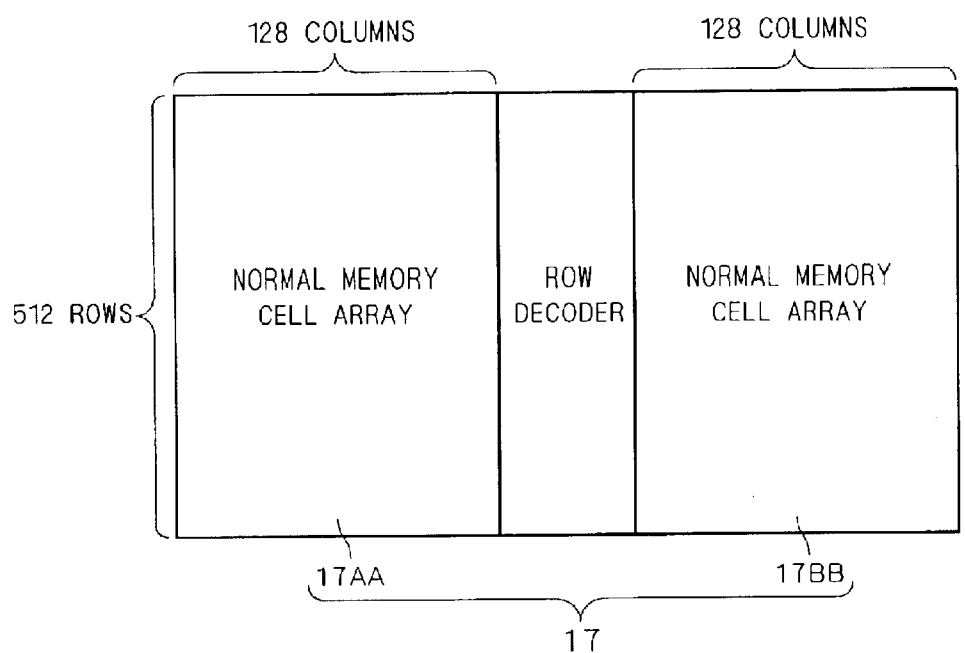
FIGS. 40 and 41 are diagrams each showing a general constitution of a normal RAM.
Figure 41:
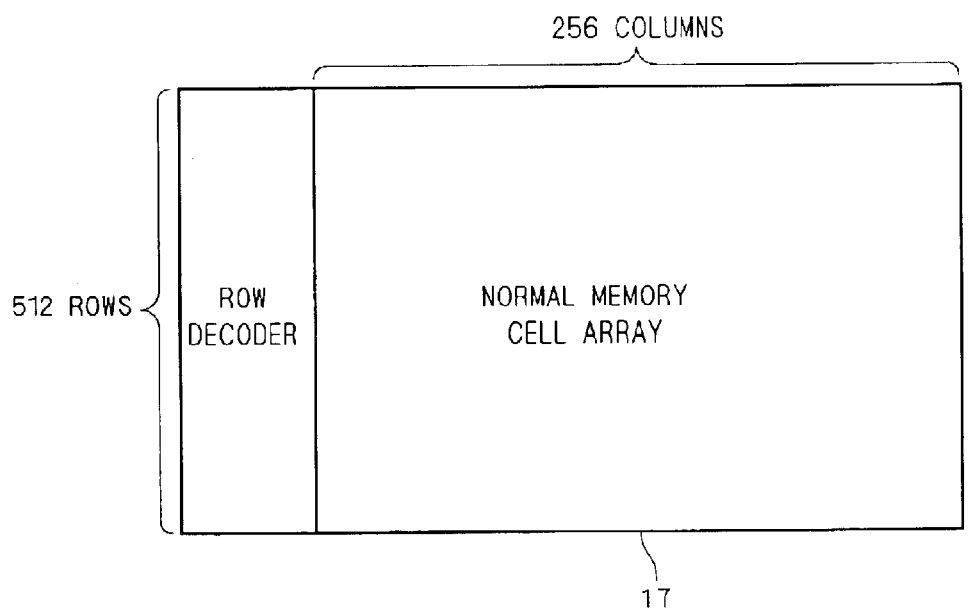

The above-discussed normal RAMs 2a and 2b each comprise the normal memory cell array 17 consisting of a plurality of normal memory cells 16 arranged in a matrix with 512 rows and 256 columns. The normal memory cell array 17 is sometimes divided into two by a row decoder disposed at the center thereof as shown in FIG. 40. In FIG. 40, one normal memory cell array 17 consists of a plurality of normal memory cells 16 arranged in a matrix with 512 rows and 128 columns, and the number of bits of the data corresponding thereto is four (bits). Further, there is another case, as shown in FIG. 41, where the normal memory cell array 17 is not divided, being provided as a unit. Furthermore, in the case where the normal memory cell array 17 is divided into two, one of the two normal memory cell arrays is referred to a "sub-normal memory cell array". In the fourth preferred embodiment, one of the normal memory cell arrays 17 shown in FIG. 40 is referred to as a "sub-normal memory cell array 17AA" and the other normal memory cell array 17 is referred to as a "sub-normal memory cell array 17BB".

As shown in FIG. 40. when the row decoder is disposed at the center of the normal memory cell array 17, the word line of the sub-normal memory cell array 17AA and that of the sub-normal memory cell array 17BB which are specified by the row addresses having the same value are separated from each other. For this reason, for example, when a column defect is caused by a break of the word line in the sub-normal memory cell array 17AA, the column defect hardly extends to the sub-normal memory cell array 17BB. Therefore, when one of the sub-normal memory cell arrays has a column defect, it is possible to surely relieve the normal memory cell array 17 by replacing only the sub-normal memory cell array by a redundancy circuit.

Then, in the case where the normal memory cell array 17 is divided into two, in other words, where a word line specified by a row address is divided, the fourth preferred embodiment makes it possible to provide a semiconductor memory device in which the normal memory cell array 17 can be surely relieved by a redundancy circuit having smaller capacity.

FIGS. 42 to 49 are diagrams showing a constitution of a semiconductor memory device 41 in accordance with the fourth preferred embodiment of the present invention. The semiconductor memory device 41 of the fourth preferred embodiment is a 256-kbit RAM with 8 bits×32 kwords.

Figure 42:
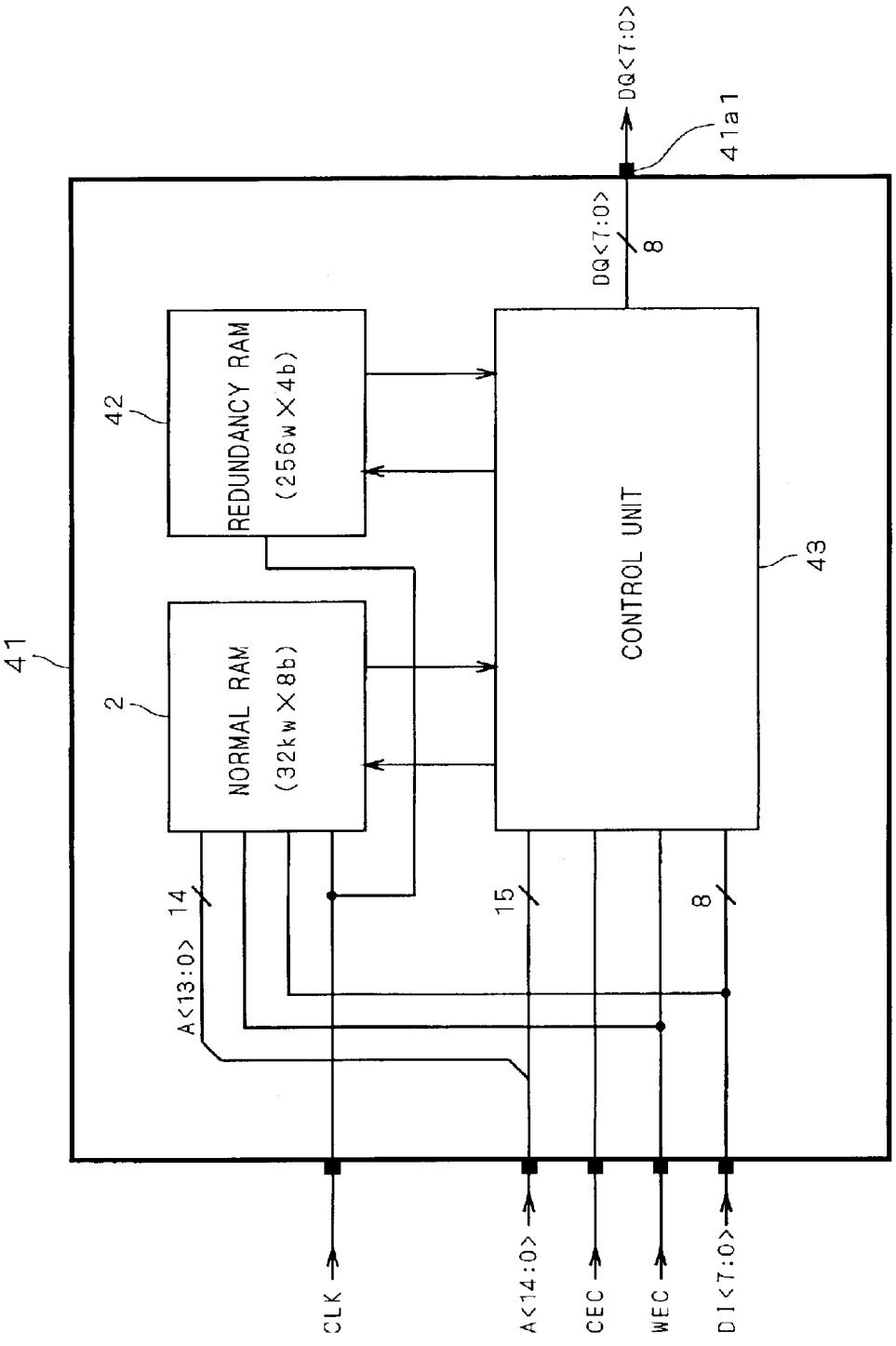

As shown in FIG. 42, the semiconductor memory device 41 of the fourth preferred embodiment comprises the basic constituents of the semiconductor memory device 21 of the second preferred embodiment and further comprises a control unit 43 instead of the control unit 23 and a redundancy RAM 42 instead of the redundancy RAM 22. The redundancy RAM 42 is a 1-kbit RAM with 4 bits×256 words, having a redundancy memory cell array consisting of a plurality of redundancy memory cells arranged in a matrix with 32 rows and 32 columns. Further, the redundancy RAM 42 is provided independently from the normal RAM 2. The normal memory cell array 17 in each of the normal RAMs 2a and 2b is divided into two by a row decoder as shown in FIG. 40.

FIG. 43 is a diagram showing input and output signals to/from the redundancy RAM 42. The unit data with which the redundancy RAM 42 deals, i.e., the I/O data has four bits. To the redundancy RAM 42, 5-bit row address XR<4:0>, 3-bit column address YR<2:0>, the chip enable signal CECR, the write signal WECR and 4-bit data DIR<3:0> are inputted from the control unit 43. Further, the clock CLK is inputted to the redundancy RAM 42 as the clock CLKR from the outside of the semiconductor memory device 41. The redundancy RAM 42 outputs 4-bit data DQR<3:0> to the control unit 43 through its output terminals 42a1.

Figure 51:
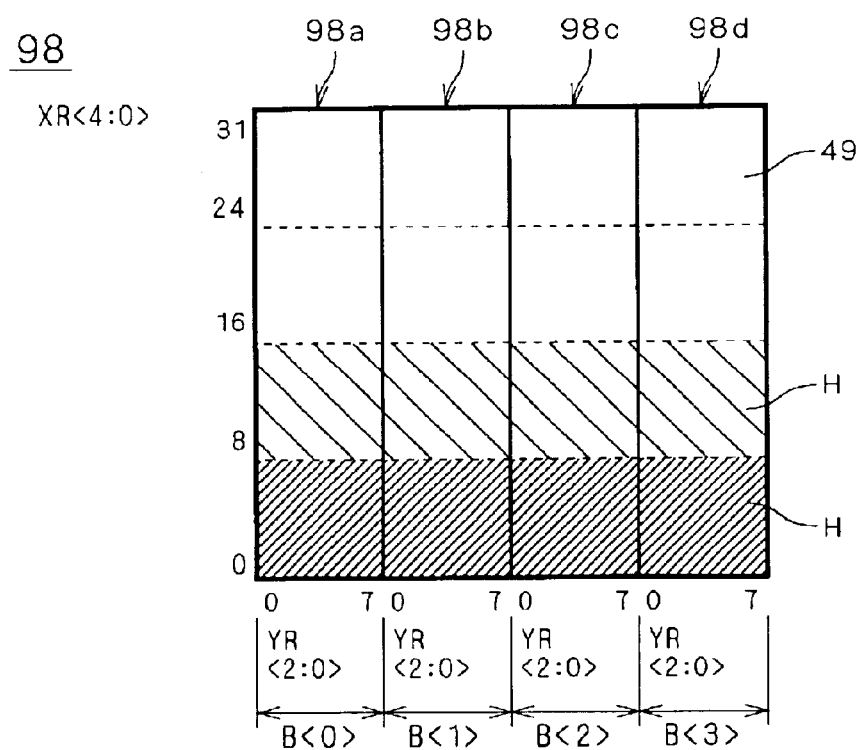
FIG. 51 is a diagram showing a constitution of a redundancy memory cell array in accordance with the fourth preferred embodiment of the present invention.

FIG. 51 is a schematic diagram showing a constitution of a redundancy memory cell array 98 included in the redundancy RAM 42. As shown in FIG. 51, a plurality of redundancy memory cells 49 arranged in a matrix with 32 rows and 8 columns correspond to one bit of the unit data (4 bits) in the redundancy RAM 42. In FIG. 51, bits B<0> to B<3> represent the bits of the unit data in the redundancy RAM 42, and the bit B<0> represents the least significant bit and the bit B<3> represents the most significant bit. Further, groups of the redundancy memory cells 49 arranged in a matrix with 32 rows and 8 columns which correspond to the bits B<0> to B<3> are referred to as redundancy memory cell groups 98a to 98d, respectively.

Next, an operation of the redundancy RAM 42 will be discussed. The redundancy RAM 42 performs read and write of data in synchronization with the clock CLKR. The redundancy RAM 42 decodes the inputted row address XR<4:0> to select one out of the 32 rows, which is indicated by the decoded result. Then, the redundancy RAM 42 decodes the column address YR<2:0> to select one out of the 8 columns in each of the redundancy memory cell groups 98a to 98d, which is indicated by the decoded result. The redundancy memory cell 49 specified by the row address XR<4:0> and the column address YR<2:0> is thereby selected in each of the memory cell groups 98a to 98d.

When the chip enable signal CECR=0 and the write signal WECR=1, data is read out from the selected redundancy memory cell 49 in each of the memory cell groups 98a to 98d and outputted to the control unit 43 as the 4-bit data DQR<3:0>.

When the chip enable signal CECR=0 and the write signal WECR=0, the data DIR<3:0> from the control unit 43 is written into the selected redundancy memory cell 49.

The normal RAMs 2a and 2b and the redundancy RAM 42 which have the above constitutions do not have a redundancy circuit therein for replacement of the memory cells thereof and can be automatically generated by a general module generator.

Figure 50:
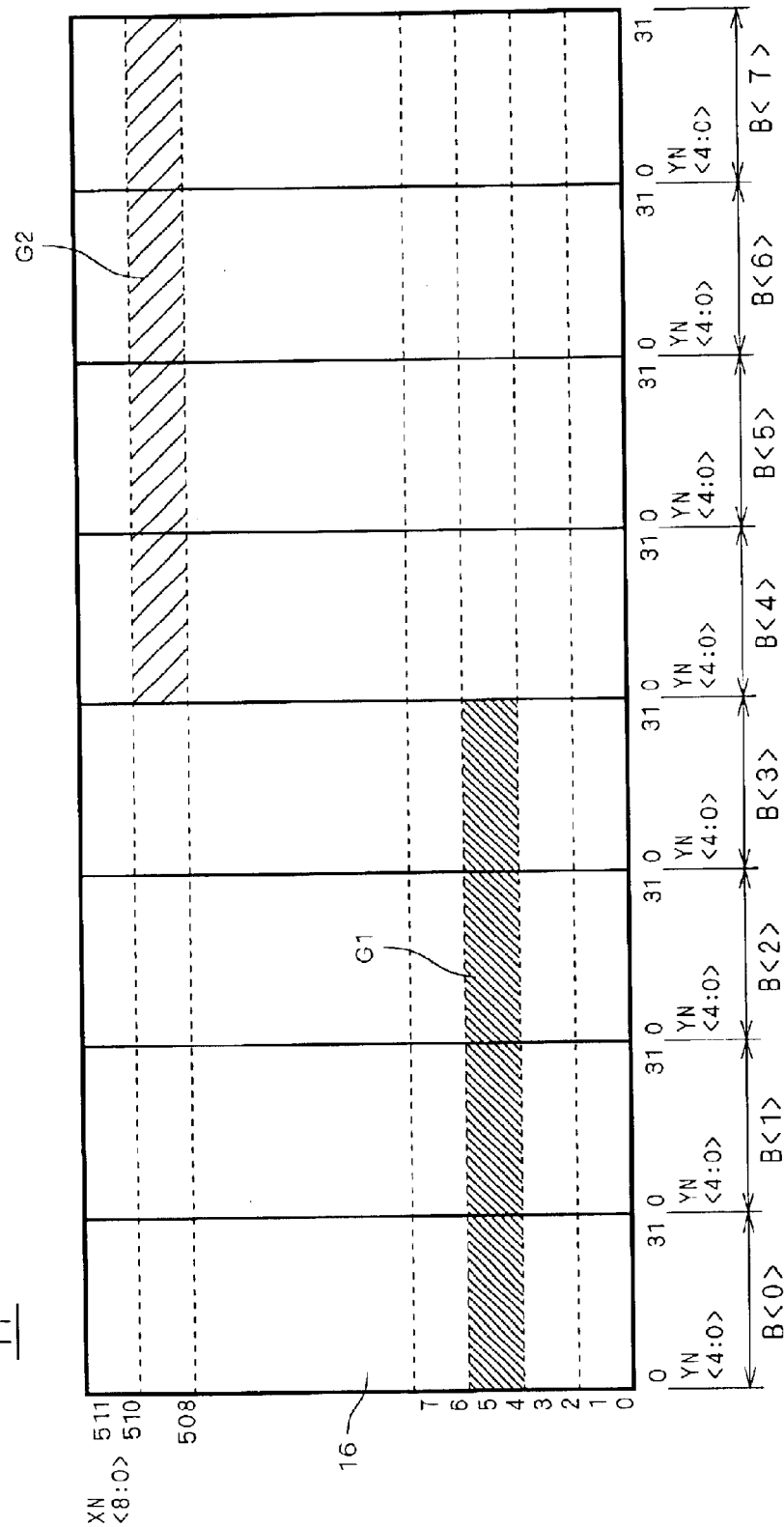
FIG. 50 is a diagram showing a constitution of a normal memory cell array in accordance with the fourth preferred embodiment of the present invention.

Next, discussion will be made on a method of replacing the normal memory cell array 17 in each of the normal RAMs 2a and 2b by the redundancy memory cell array 98 in the redundancy RAM 42. FIGS. 50 and 51 show a replacement mapping in replacing the normal RAMs 2a and 2b by the redundancy RAM 42, and the following discussion will be made referring to these figures.

FIG. 50 shows the normal memory cell array 17 in each of the normal RAM 2a and 2b which is the same as that shown in FIG. 12.

As indicated by the broken line in FIG. 50, the normal memory cell array 17 in each of the normal RAMs 2a and 2b is logically divided in advance into a plurality of sections G1 and G2 extending in the row direction. Each of the sections G1 and G2 is a row replacement unit used for a row replacement, being constituted of a plurality of normal memory cells 16 arranged in the row direction, specifically, a plurality of normal memory cells 16 arranged in a matrix with 2 rows and 128 columns.

The section G1 is constituted of a plurality of normal memory cells 16 arranged in two adjacent rows, corresponding to the bit B<3:0>. The section G2 is constituted of a plurality of normal memory cells 16 arranged in two adjacent rows, corresponding to the bit B<7:4>. Accordingly, the number of bits of the data corresponding to each of the sections G1 and G2 (4 bits) is equal to the number of bits of the data corresponding to one sub-normal memory cell array (4 bits). Further, in some cases, the section G1 is referred to as "the zeroth section G" and the section G2 is referred to as "the first section G".

The normal memory cell array 17 in each of the normal RAMs 2a and 2b has 256 sections G1 and 256 sections G2, and the normal RAM 2 has 512 sections G1 and 512 sections G2 on the whole. Further, in the normal memory cell array 17 of the fourth preferred embodiment, no column replacement unit (a pair of sections A) is defined in advance and only the row replacement unit (the section G) is defined by the control unit 43.

The redundancy memory cell array 98 of the redundancy RAM 42 is logically divided in advance into four redundancy sections H, as shown in FIG. 51. One redundancy section H is constituted of a plurality of redundancy memory cells 49 arranged in a matrix with 8 rows and 32 columns. The redundancy section H corresponding to the rows specified by a range of the row address XR<4:0>=0 to 7 (in decimal) is referred to as the zeroth redundancy section H, the redundancy section H corresponding to the rows specified by a range of the row address XR<4:0>=8 to 15 (in decimal) is referred to as the first redundancy section H, the redundancy section H corresponding to the rows specified by a range of the row address XR<4:0>=16 to 23 (in decimal) is referred to as the second redundancy section H and the redundancy section H corresponding to the rows specified by a range of the row address XR<4:0>=24 to 31 (in decimal) is referred to as the fourth redundancy section H. The control unit 43 defines these redundancy sections H in advance with respect to the redundancy memory cell area 98.

In the semiconductor memory device 41 of the fourth preferred embodiment, when the normal memory cell array 17 has a defect and a row replacement is performed, it is possible to replace the row replacement unit (the section G1, G2) in the normal memory cell array 17 corresponding to the defective portion by arbitrary one of the redundancy sections H in the redundancy memory cell array 98 by a control of the control unit 43. For example, the section G1 in the normal memory cell array 17 finely hatched in FIG. 50 can be replaced by the zeroth redundancy section H in the redundancy memory cell array 98 and the section G2 in the normal memory cell array 17 roughly hatched in FIG. 50 can be replaced by the first redundancy section H in the redundancy memory cell array 98.

Figure 44:
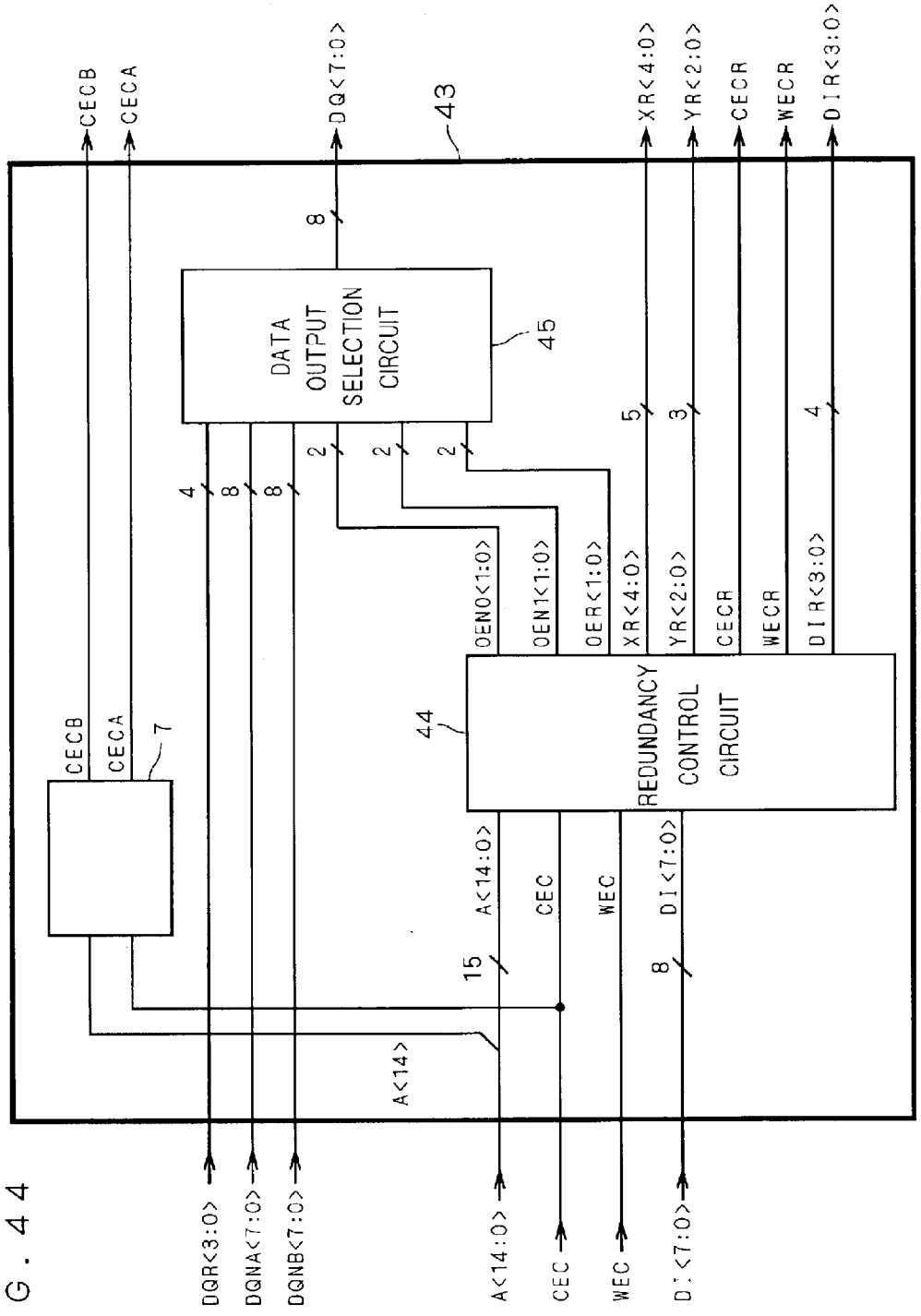

Next discussion will be made on an internal constitution of the control unit 43 for performing such a replacement. FIG. 44 is a block diagram showing a constitution of the control unit 43. As shown in FIG. 44, the control unit 43 of the fourth preferred embodiment comprises the basic constituents of the control unit 23 of the second preferred embodiment and further comprises a data output selection circuit 45 instead of the data output selection circuit 25 and a redundancy control circuit 44 instead of the redundancy control circuit 24.

Figure 45:
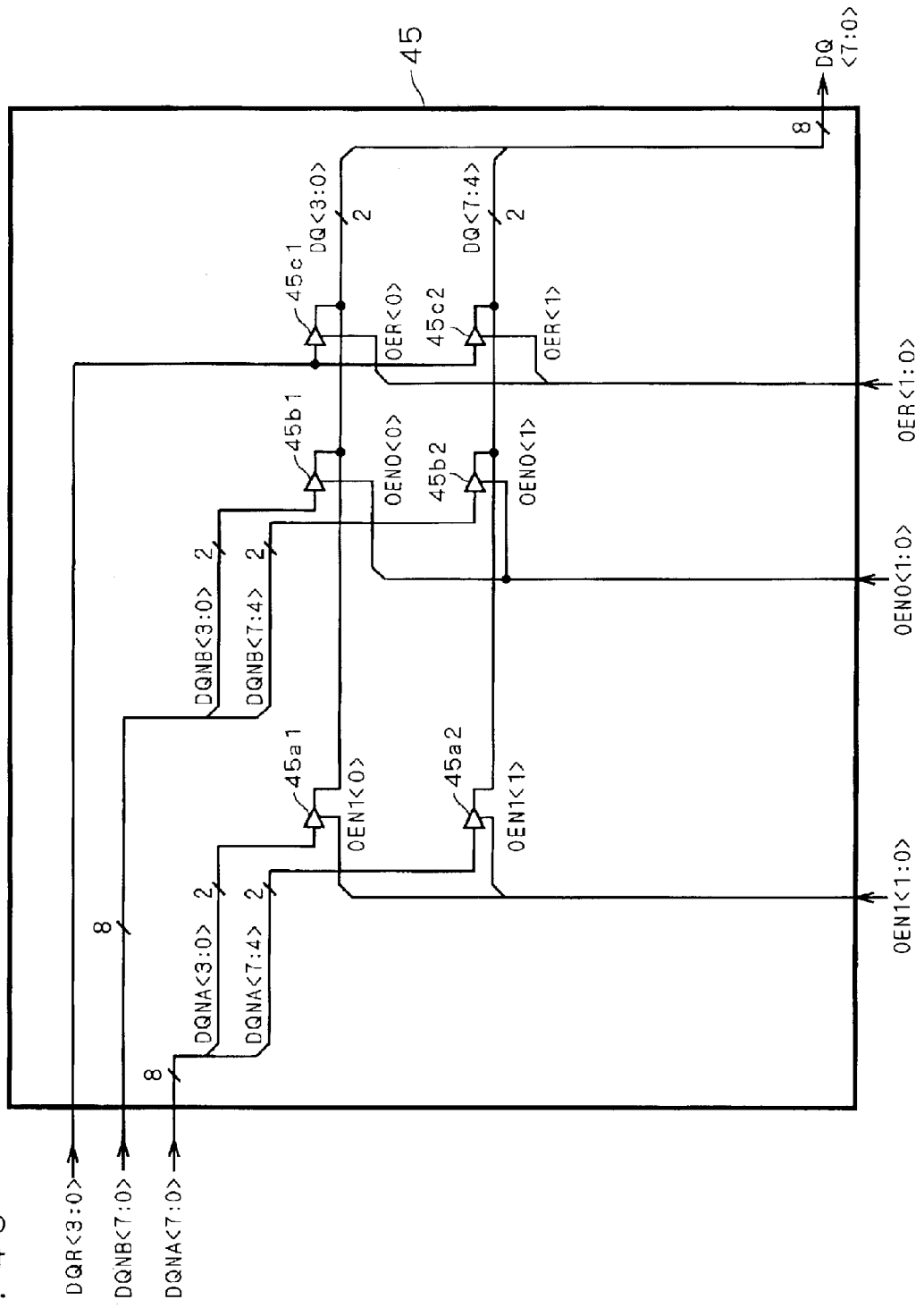

FIG. 45 is a circuit diagram showing a configuration of the data output selection circuit 45. As shown in FIG. 45, the data output selection circuit 45 comprises tristate buffers 45a1 and 45a2 for connecting the data output terminals 2a1 of the normal RAM 2a to the data output terminal 41a1 (shown in FIG. 42) of the semiconductor memory device 41, tristate buffers 45b1 and 45b2 for connecting the data output terminals 2b1 of the normal RAM 2b to the data output terminal 41a1 of the semiconductor memory device 41 and tristate buffers 45c1 and 45c2 for connecting the data output terminals 42a1 of the redundancy RAM 42 to the data output terminal 41a1 of the semiconductor memory device 41. The tristate buffers 45a1, 45a2, 45b1, 45b2, 45c1 and 45c2 are sometimes referred to collectively as "tristate buffer 45W".

Data DQNA<3:0> and DQNA<7:4> outputted from the normal RAM 2a are inputted to the tristate buffers 45a1 and 45a2, respectively. Data DQNB<3:0> and DQNB<7:4> outputted from the normal RAM 2b are inputted to the tristate buffers 45b and 45b2, respectively. Data DQR<3:0> outputted from the redundancy RAM 42 are inputted to both the tristate buffers 45c1 and 45c2. Each of the tristate buffers 45W consists of four subtristate buffers, and one of the inputted data is inputted to one subtristate buffer.

The tristate buffers 45b1 and 45b2 are controlled on activation/inactivation by the enable signals OEN0<0> and OEN0<1>, respectively. Therefore, the four subtristate buffers included in each of the tristate buffers 45b1 and 45b2 are controlled by common enable signals.

The tristate buffers 45c1 and 45c2 are controlled on activation/inactivation by the enable signals OER<0> and OER<1>, respectively. Therefore, the four subtristate buffers included in each of the tristate buffers 45c1 and 45c2 are controlled by common enable signals.

Among the tristate buffers 45a1, 45b1 and 45c1, outputs of the subtristate buffers whose inputted data have the same bit position are connected to one another. For example, an output of the subtristate buffer to which the data DQNA<0> is inputted, an output of the subtristate buffer to which the data DQNB<0> is inputted and an output of the subtristate buffer to which the data DQR<0> is inputted are connected to one another. Any one of the tristate buffers 45a1, 45b1 and 45c1 is activated, and the output of the subtristate buffer of the activated tristate buffer is outputted to the outside of the semiconductor memory device 41 through the output terminal 41a1 thereof as the data DQ<3:0>. For example, the data DQNA<0> to DQNA<3> are outputted to the outside of the semiconductor memory device 41 as the data DQ<0> to DQ<3>, respectively.

Among the tristate buffers 45a2, 45b2 and 45c2, the subtristate buffer to which the data DQNA<4> is inputted, the subtristate buffer to which the data DQNB<4> is inputted and the subtristate buffer to which the data DQR<0> is inputted are connected to one another, and the subtristate buffer to which the data DQNA<5> is inputted, the subtristate buffer to which the data DQNB<5> is inputted and the subtristate buffer to which the data DQR<1> is inputted are connected to one another. Further, the subtristate buffer to which the data DQNA<6> is inputted, the subtristate buffer to which the data DQNB<6> is inputted and the subtristate buffer to which the data DQR<2> is inputted are connected to one another, and the subtristate buffer to which the data DQNA<7> is inputted, the subtristate buffer to which the data DQNB<7> is inputted and the subtristate buffer to which the data DQR<3> is inputted are connected to one another. Any one of the tristate buffers 45a2, 45b2 and 45c2 is activated, and the output of the subtristate buffer of the activated tristate buffer is outputted to the outside of the semiconductor memory device 41 through the output terminal 41a1 thereof as the data DQ<7:4>. For example, the data DQNA<4> to DQNA<7> are outputted to the outside of the semiconductor memory device 41 as the data DQ<4> to DQ<7>, respectively.

Further, when the enable signals OEN0<1:0>, OEN1<1:0> and OER<1:0> are "1", the tristate buffers are activated and output the inputted signals without any change, and when these enable signals are "0", the tristate buffers are inactivated and the outputs thereof come into a high impedance state.

Figure 46:
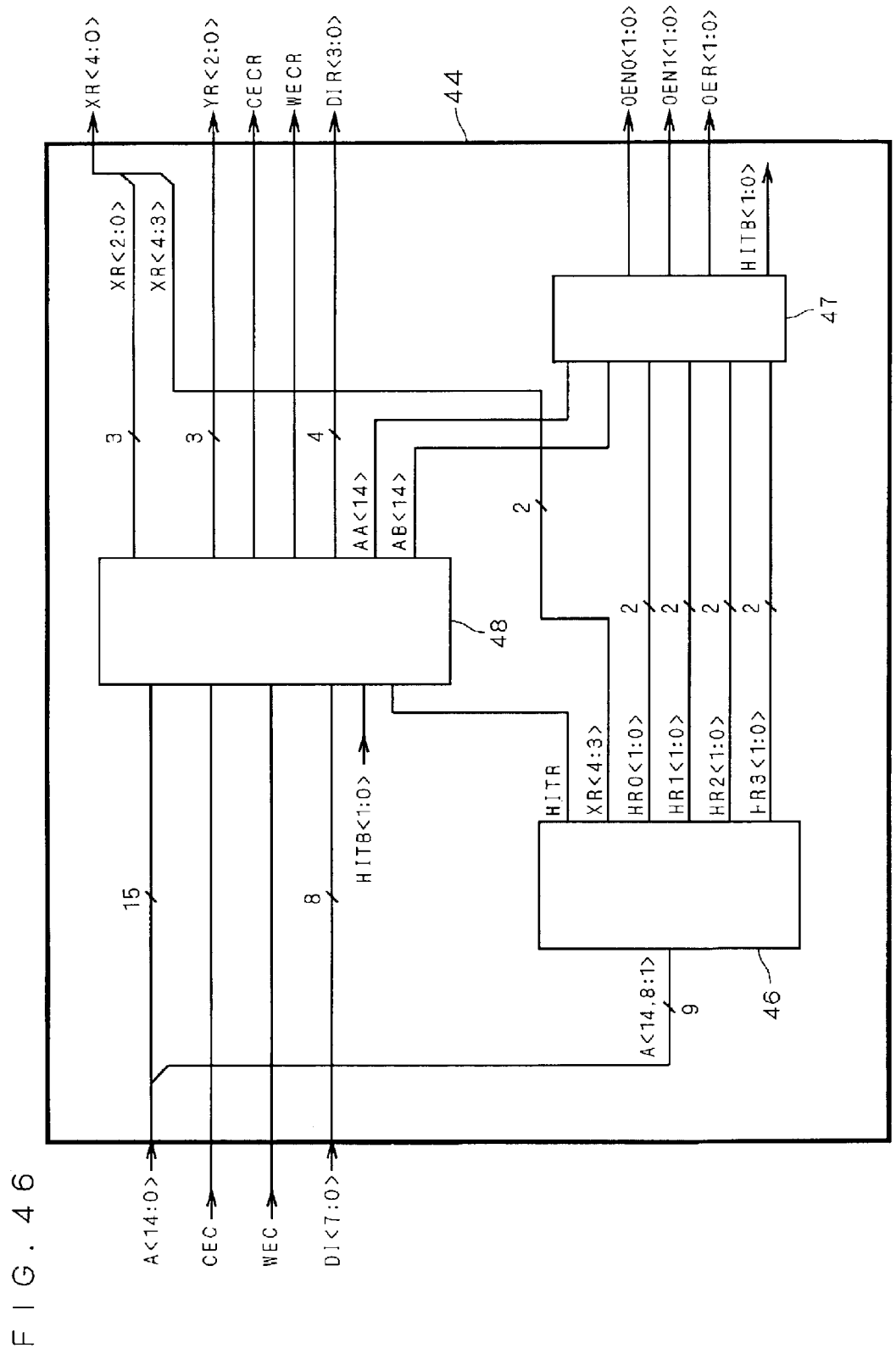

FIG. 46 is a block diagram showing a constitution of the redundancy control circuit 44. As shown in FIG. 46, the redundancy control circuit 44 comprises a row replacement selection circuit 46, an enable signal output circuit 47 and a redundancy RAM control circuit 48.

Figure 47:
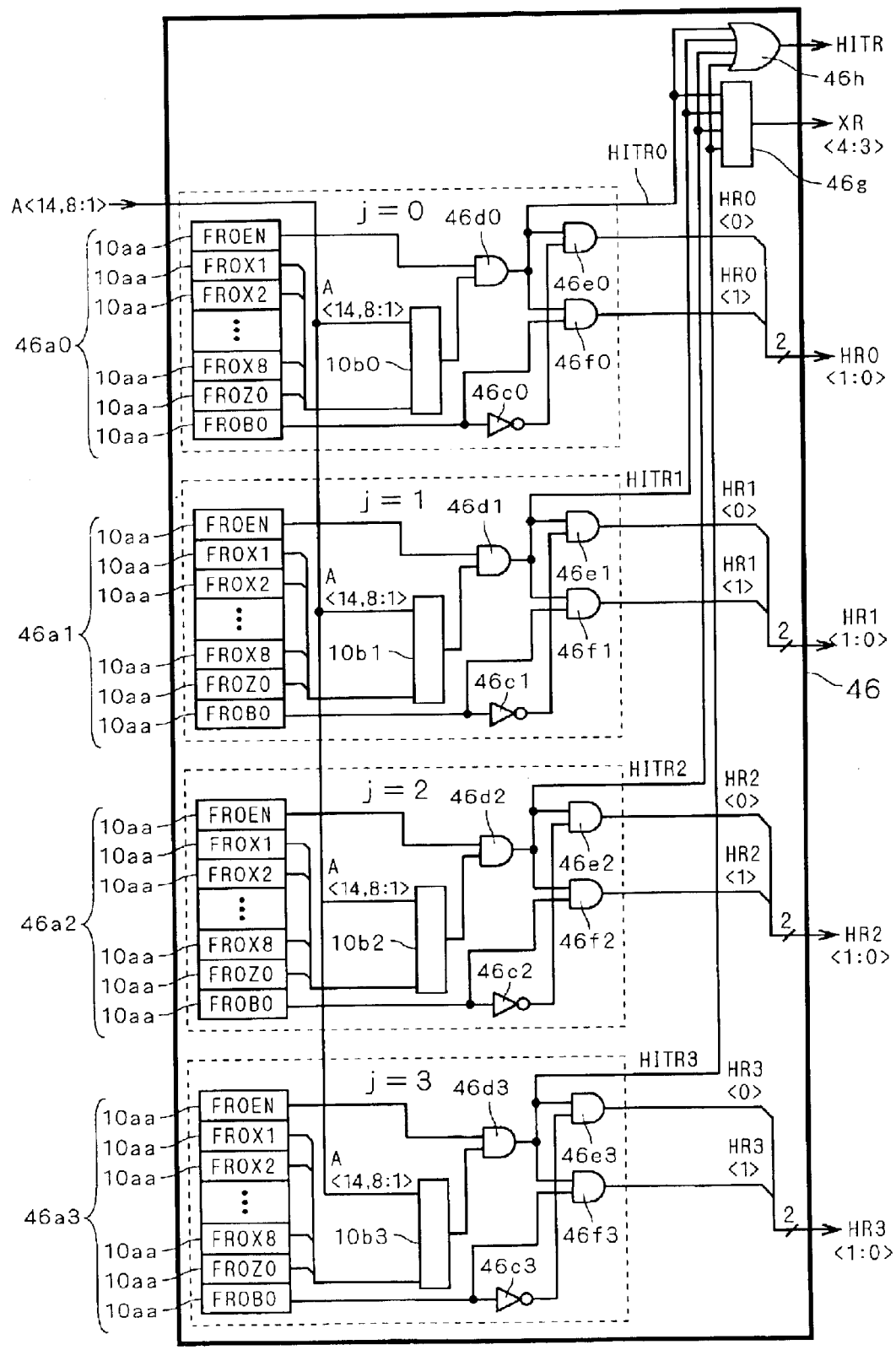

FIG. 47 is a circuit diagram showing a configuration of the row replacement selection circuit 46. As shown in FIG. 47, the row replacement selection circuit 46 comprises fuse circuits 46aj (j=0 to 3), the above-described redundancy row address comparator circuits 10bj (j=0 to 3), inverters 46cj (j=0 to 3), AND circuits 46dj to 46fj (j=0 to 3), an OR circuit 46h and a redundancy row address encoder 46g.

The fuse circuit 46aj comprises the basic constituents of the above-discussed 10aj and further comprises another unit fuse block 10aa for outputting a subword selection signal FRjB0. The subword selection signal FRjB0 indicates "1" when the fuse on which whether there is a break or not is judged by the fuse judgment circuit which outputs the subword selection signal is broken by laser trimming or application of high voltage and indicates "0" when the fuse is not broken.

The redundancy row address comparator circuit 10bj, as discussed above, compares the address A<14, 8:1> with the addresses FRjX1 to FRjX8 and FRjZ0 and outputs "1" when all the addresses coincide and outputs "0" otherwise.

The AND circuit 46dj performs an AND operation of the output from the redundancy row address comparator circuit 10bj and the enable signal FRjEN and outputs the operation result as the hit signal HITRj (j=0 to 3). The OR circuit 46h performs an OR operation of the inputted hit signals HITR0 to HITR3 and outputs the operation result to the redundancy RAM control circuit 48 as the hit signal HITR.

The inverter 46cj inverts the subword selection signal FRjB0 and outputs the inverted signal. The AND circuit 46ej performs an AND operation of the output of the inverter 46cj and the hit signal HITRj and outputs the operation result to the enable signal output circuit 47 as a hit signal HRj<0>. The AND circuit 46fj performs an AND operation of the output of the AND circuit 46dj and the subword selection signal FRjB0 and outputs the operation result to the enable signal output circuit 47 as a hit signal HRj<1>.

The redundancy row address encoder 46g encodes the inputted hit signals HITR0 to HITR3 and outputs a 2-bit address XR<4:3> to the redundancy RAM 42. The address XR<4:3> is (0, 0) when the hit signal HITR0=1, the address XR<4:3> is (0, 1) when the hit signal HITR0=0 and the hit signal HITR1=1, the address XR<4:3> is (1, 0) when the hit signal HITR0=0, the hit signal HITR1=0 and the hit signal HITR2=1. Further, the address XR<4:3> is (1, 1) when the hit signal HITR0=0, the hit signal HITR1=0, the hit signal HITR2=0 and the hit signal HITR3=1 or when all the hit signals HITR0 to HITR3 are "0".

FIG. 48 is a circuit diagram showing a configuration of the enable signal output circuit 47. As shown in FIG. 47, the enable signal output circuit 47 comprises OR circuits 47a and 47b, NAND circuits 47c to 47f and inverters 47l to 47o. The OR circuit 47a performs an OR operation of the hit signals HR0<0>, HR1<0>, HR2<0> and HR3<0> and outputs the operation result, and the OR circuit 47b performs an OR operation of the hit signals HR0<1>, HR1<1>, HR2<1> and HR3<1> and outputs the operation result. The inverter 47n inverts the output of the OR circuit 47a which is inverted by the inverter 47l and outputs the inverted signal to the data output selection circuit 45 as the enable signal OER<0>. The inverter 47o inverts the output of the OR circuit 47b which is inverted by the inverter 47m and outputs the inverted signal to the data output selection circuit 45 as the enable signal OER<1>. Further, the outputs of the OR circuits 47a and 47b are outputted to the redundancy RAM control circuit 48 as the hit signals HITB<0> and HITB<1>, respectively.

The address AA<14> is inputted to each of the NAND circuits 47c and 47d, and the address AB<14> is inputted to each of the NAND circuits 47e and 47f. The output of the OR circuit 47a is inputted to each of the NAND circuits 47c and 47e, and the output of the OR circuit 47b is inputted to each of the NAND circuits 47d and 47f. Each of the NAND circuits 47c to 47f performs a NAND operation of the two inputted signals and outputs the operation result. The outputs of the NAND circuits 47c to 47f are inputted to the data output selection circuit 45 as the enable signals OEN0<0>, OEN0<1>, OEN1<0> and OEN1<1>, respectively.

Figure 49:
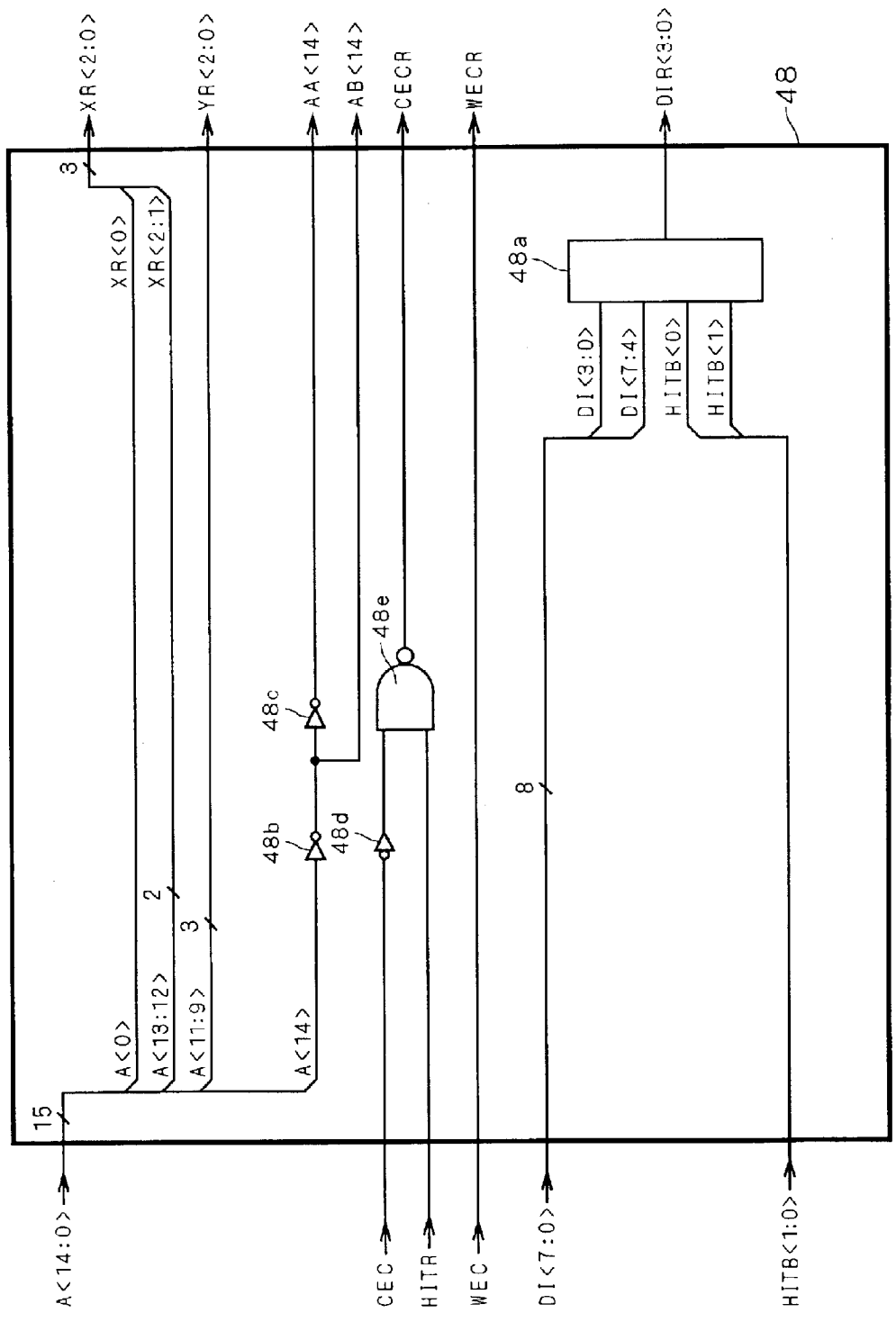

FIG. 49 is a circuit diagram showing a configuration of the redundancy RAM control circuit 48. As shown in FIG. 49, the redundancy RAM control circuit 48 comprises a data input subword selection circuit 48a, inverters 48b to 48d and a NAND circuit 48e.

The inverter 48b inverts the address A<14> and outputs the inverted signal to the enable signal output circuit 47 as the address AB<14>. The inverter 48c inverts the output of the inverter 48b and outputs the inverted signal to the enable signal output circuit 47 as the address AA<14>.

The inverter 48d inverts the chip enable signal CEC and outputs the inverted signal to the NAND circuit 48e. The NAND circuit 48e performs a NAND operation of the output from the inverter 48d and the hit signal HITR and outputs the operation result to the redundancy RAM 42 as the chip enable signal CECR.

The addresses A<0>, A<13:12> and A<11:9> are outputted to the redundancy RAM 42 as the column addresses XR<0> and XR<2:1> and the row address YR<2:3>, respectively. The data input subword selection circuit 48a outputs the data DIR<3:0> to the redundancy RAM 42 on the basis of the data DI<7:0> and the hit signal HITB<1:0>. The data DIR<3:0> is equal to the data DI<3:0> when the hit signal HITB<0>=1, and the data DIR<3:0> is equal to the data DI<7:4> when the hit signal HITB<1>=1. The write signal WEC inputted from the outside of the semiconductor memory device 41 is inputted to the redundancy RAM 42 without any change as the write signal WECR.

The other constituents of the semiconductor memory device 41 in the fourth preferred embodiment are the same as those of the semiconductor memory device 21 in the second preferred embodiment, and description of these constituents will be omitted.

Next, an operation of the semiconductor memory device 41 of the fourth preferred embodiment will be discussed. First discussion will be made on an operation in the case where the normal memory cell array 17 in each of the normal RAMs 2a and 2b has no defect. In this case, no fuse of the fuse circuits 46ai (i=0 to 3) in the row replacement selection circuit 46 is programmed, and the hit signals HRj<1:0>, HITR and HITB<1:0> are all always "0". The normal RAM 2 in the fourth preferred embodiment thereby performs the same operation as the normal RAM 2 in the second preferred embodiment.

On the side of the redundancy RAM 42, the chip enable signal CECR becomes "1" and the redundancy RAM 42 is inactivated, and further the enable signals OER<1:0> are all "0" and the data DQR<3:0> of the redundancy RAM 42 is not outputted to the outside of the semiconductor memory device 41.

Next discussion will be made on an operation of the semiconductor memory device 41 in the case where the normal memory cell array 17 in the normal RAM 2 has a row defect. In the fourth preferred embodiment, considered is a case where the row replacement unit (the sections G1, G2) in the normal RAM 2 defined by the address A<8:1>=the address Xj<8:1>, the address A<14>=the address Zj<0> and subword number SB<0>=subword number Bi<0> is replaced by the j-th redundancy section H (j=0 to 3). In this case, the subword number SB<0> indicates number of the section G. The subword number SB<0> indicates the zeroth section G (section G1) when the subword number SB<0>=0, and the subword number SB<0> indicates the first section G (section G2) when the subword number SB<0>=1. Herein, the subword number SB<0> indicates the k-th section G (k=0, 1), and considered is a case where the k-th section G is replaced by the j-th redundancy section H.

In the case where the normal RAM 2 has a row defect, the method of programming the fuse of the fuse circuit 46aj, other than that included in the unit fuse block 10aa which outputs the subword selection signal FRjB0, is as discussed above in the first preferred embodiment. The fuse included in the unit fuse block 10aa which outputs the subword selection signal FRjB0 is programmed when k=1 and not programmed when k=0.

The redundancy row address comparator circuit 10bj, as discussed above, compares the address A<14, 8:1> with the addresses FRjX1 to FRjX8 and FRjZ0 and outputs "1" when all the addresses coincide. The enable signal FRjEN indicates "1" since the fuse in the unit fuse block 10aa which outputs the enable signal is programmed. Therefore, the hit signal HITRj becomes "1". The hit signal HITR, which is an operation result of the OR operation of the hit signals HITR0 to HITR3, indicates "1". Further, the hit signal HRj<k> becomes "1" and the hit signal HITB<k> becomes "1".

On the side of the normal RAM 2, one of the AND circuits 47c to 47f in the enable signal output circuit 47 to which the hit signal HITB<k> is inputted output "0", and the enable signals OEN0<k> and OEN1<k> become "0" regardless of the value of the address A<14> and the outputs of the tristate buffers to which the enable signals are connected are brought into a high impedance state. Therefore, in each of the data DQNA<7:0> and DQNB<7:0>, the data corresponding to the k-th section G is not outputted to the outside of the semiconductor memory device 41.

On the side of the redundancy RAM 42, the enable signal OER<k> corresponding to the hit signal HITB<k> becomes "1" and the tristate buffer to which the enable signal is connected is activated. Therefore, the data DQR<3:0> of the redundancy RAM 42 is outputted to the outside of the semiconductor memory device 41 instead of the output data corresponding to the k-th section G of the normal RAM 2.

In the semiconductor memory device 41 of the fourth preferred embodiment, as discussed above, the number of bits of the data corresponding to the row replacement unit (the section G1, G2) used for the row replacement (4 bits) is smaller than the number of bits of the unit data in the normal RAM 2 (8 bits). For this reason, in the case where the normal memory cell array 17 is divided into two, it is possible to make the number of bits of the data corresponding to the row replacement unit equal to the number of bits of the data corresponding to the one sub-normal memory cell array. In other words, when the word line of the normal memory cell array 17 specified by a row address is divided, it is possible to make the number of bits of the data corresponding to the row replacement unit equal to the number of bits of the data corresponding to the one divided word line. Therefore, it is possible to relieve the normal memory cell array 17 by the redundancy RAM having smaller capacity as compared with the case where the number of bits of the data corresponding to the row replacement unit (section D) is equal to the number of bits of the unit data of the normal RAM 2, like in the first and second preferred embodiments.

The Fifth Preferred Embodiment

FIGS. 52 to 55 are diagrams showing a constitution of a semiconductor memory device 51 in accordance with the fifth preferred embodiment of the present invention. The semiconductor memory device 51 of the fifth preferred embodiment is a 256-kbit RAM with 8 bits×32 kwords.

Figure 52:
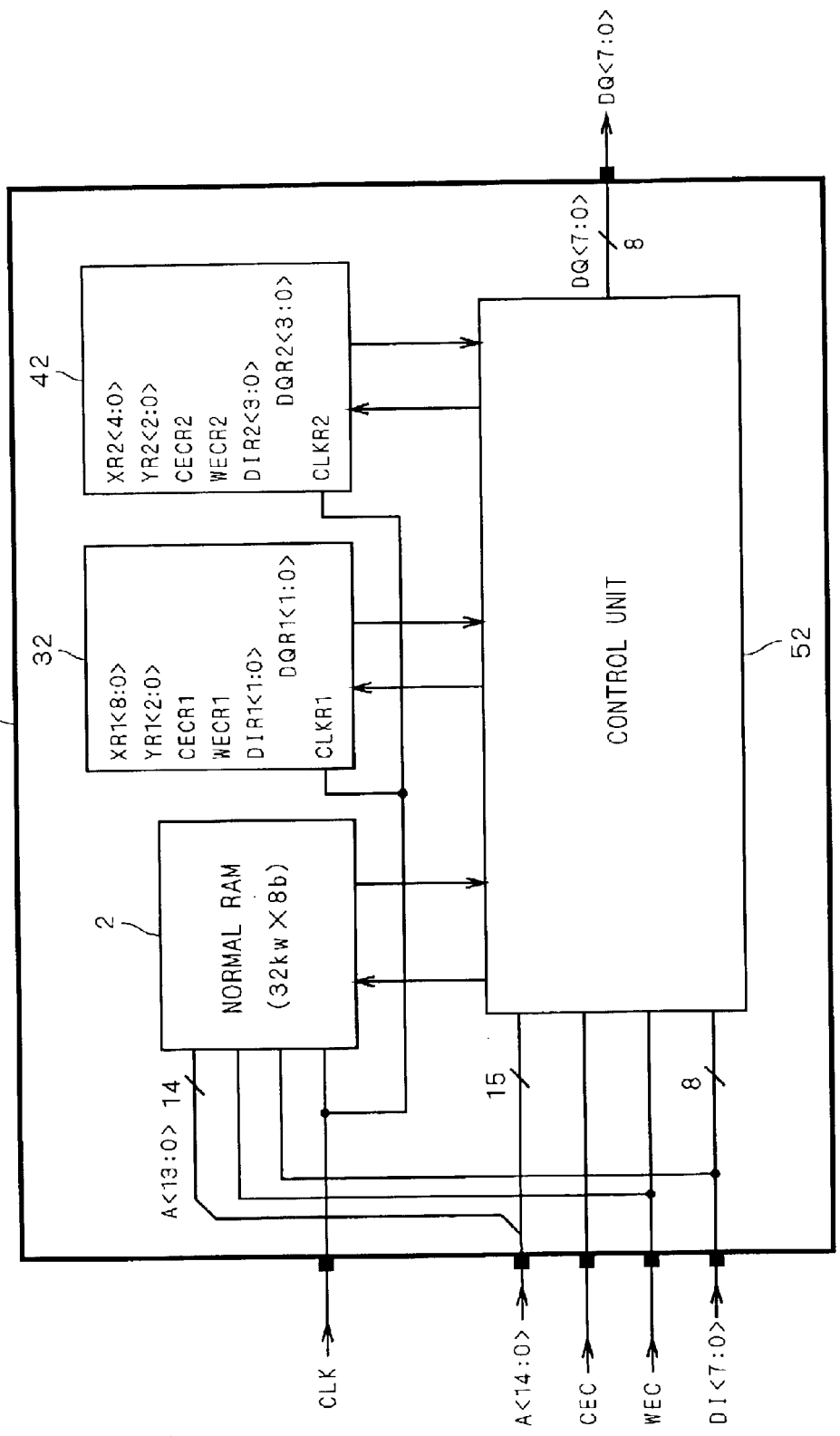

As shown in FIG. 52, the semiconductor memory device 51 of the fifth preferred embodiment comprises the basic constituents of the semiconductor memory device 31 of the third preferred embodiment and further comprises a control unit 52 instead of the control unit 33 and the above-discussed redundancy RAM 42. To make a clear distinction between the redundancy RAM 32 and the redundancy RAM 42, the names of the respective input/output signals of these redundancy RAMs are changed.

In the redundancy RAM 32, the column address XR<8:0>, the row address YR<2:0>, the chip enable signal CECR, the write signal WECR, the clock CLKR, the data DIR<1:0> and DQR<1:0> are changed into the column address XR1<8:0>, the row address YR1<2:0>, the chip enable signal CECR1, the write signal WECR1, the clock CLKR1, the data DIR1<1:0> and DQR1<1:0>, respectively.

In the redundancy RAM 42, the column address XR<4:0>, the row address YR<2:0>, the chip enable signal CECR, the write signal WECR, the clock CLKR, the data DIR<3:0> and DQR<3:0> are changed into the column address XR2<4:0>, the row address YR2<2:0>, the chip enable signal CECR2, the write signal WECR2, the clock CLKR2, the data DIR2<3:0> and DQR2<3:0>, respectively.

Now, discussion will be made on a method of replacing the normal memory cell array 17 in each of the normal RAMs 2a and 2b by the redundancy memory cell array 98 of the redundancy RAM 42 or the redundancy memory cell array 88 of the redundancy RAM 32.

Figure 56:
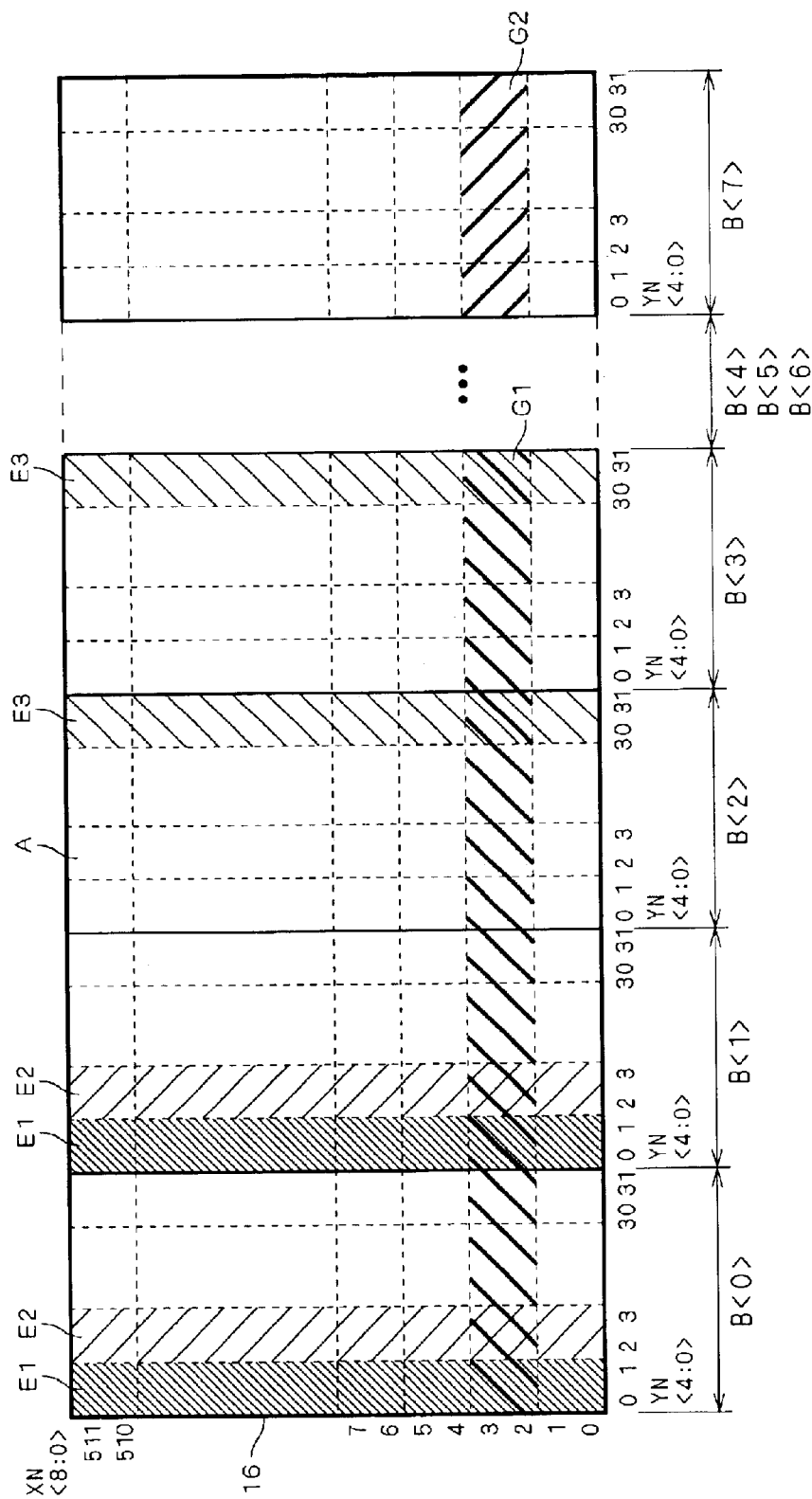
FIG. 56 is a diagram showing a constitution of a normal memory cell array in accordance with the fifth preferred embodiment of the present invention.

FIG. 56 is a diagram showing a constitution of the normal memory cell array 17 in each of the normal RAMs 2a and 2b, which is the same as the normal memory cell array 17 of FIG. 12. As indicated by the broken line in FIG. 56, the normal memory cell array 17 in each of the normal RAMs 2a and 2b is logically divided in advance into the above-discussed sections G1, G2 and A. As to the sections E1 to E3 in this figure, like those in FIG. 37, the sections A constituting the column replacement unit are defined as the sections E1 to E3, for convenience of illustration.

In the semiconductor memory device 51 of the fifth preferred embodiment, when the normal memory cell array 17 has a defect and a column replacement is performed, it is possible to replace the column replacement unit (a pair of sections A) in the normal memory cell array 17 corresponding to the defective portion by arbitrary one of the redundancy sections F1 to F3 in the redundancy memory cell array 88 of the redundancy RAM 32 by a control of the control unit 52. Further, when a row replacement is performed, it is possible to replace the row replacement unit (the section G1, G2) in the normal memory cell array 17 corresponding to the defective portion by arbitrary one of the redundancy sections H in the redundancy memory cell array 98 of the redundancy RAM 42 by a control of the control unit 52. The redundancy sections F1 to F3 in the redundancy RAM 32 are as shown in FIG. 38. The redundancy sections H in the redundancy RAM 42 are as shown in FIG. 51.

Next discussion will be made on an internal constitution of the control unit 52 for performing such a replacement. FIG. 53 is a block diagram showing a constitution of the control unit 52. As shown in FIG. 53, the control unit 52 of the fifth preferred embodiment comprises the basic constituents of the control unit 33 of the third preferred embodiment and further comprises a data output selection circuit 55 instead of the data output selection circuit 35 and a redundancy control circuit 54 instead of the redundancy control circuit 34.

Figure 54:
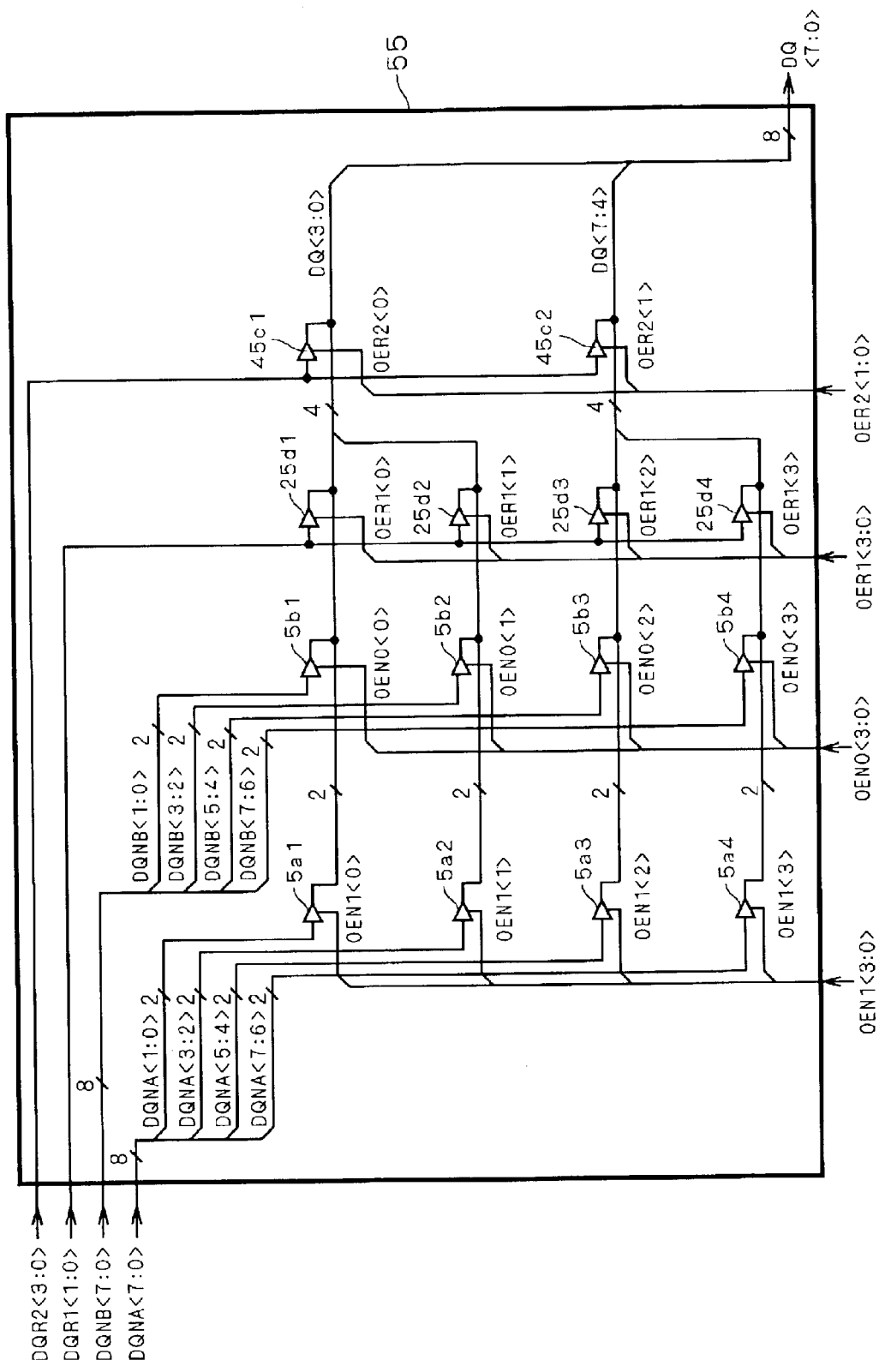

FIG. 54 is a circuit diagram showing a configuration of the data output selection circuit 55. As shown in FIG. 54, the data output selection circuit 55 comprises the basic constituents of the above-discussed data output selection circuit 35 and further comprises the tristate buffers 45c1 and 45c2 of the data output selection circuit 45 in the fourth preferred embodiment.

The data DQR1<1:0> outputted from the redundancy RAM 32 are inputted to all the tristate buffers 25d1 to 25d4, and the data DQR2<3:0> outputted from the redundancy RAM 42 are inputted to both the tristate buffers 45c1 and 45c2.

The output of the subtristate buffers in the tristate buffer 45c1 for outputting the inputted data as the data DQ<0>, DQ<1>, DQ<2> and DQ<3> is connected to the output of the subtristate buffers in the tristate buffers 25d1 and 25d2 for outputting the inputted data as the data DQ<0>, DQ<1>, DQ<2> and DQ<3>, respectively.

The output of the subtristate buffers in the tristate buffer 45c2 for outputting the inputted data as the data DQ<4>, DQ<5>, DQ<6> and DQ<7> is connected to the output of the subtristate buffers in the tristate buffers 25d3 and 25d4 for outputting the inputted data as the data DQ<5>, DQ<6>, DQ<7> and DQ<8>, respectively.

Connection of the tristate buffers 5a1 to 5a4, the tristate buffers 5b1 to 5b4 and the tristate buffers 25d1 and 25d4 are as discussed in the third preferred embodiment.

The tristate buffers 25d1 to 25d4 are controlled on activation/inactivation by the enable signals OER1<0> to OER1<3>, respectively. The tristate buffers 45c1 and 45c2 are controlled on activation/inactivation by the enable signals OER2<0> and OER2<1>, respectively.

Figure 55:
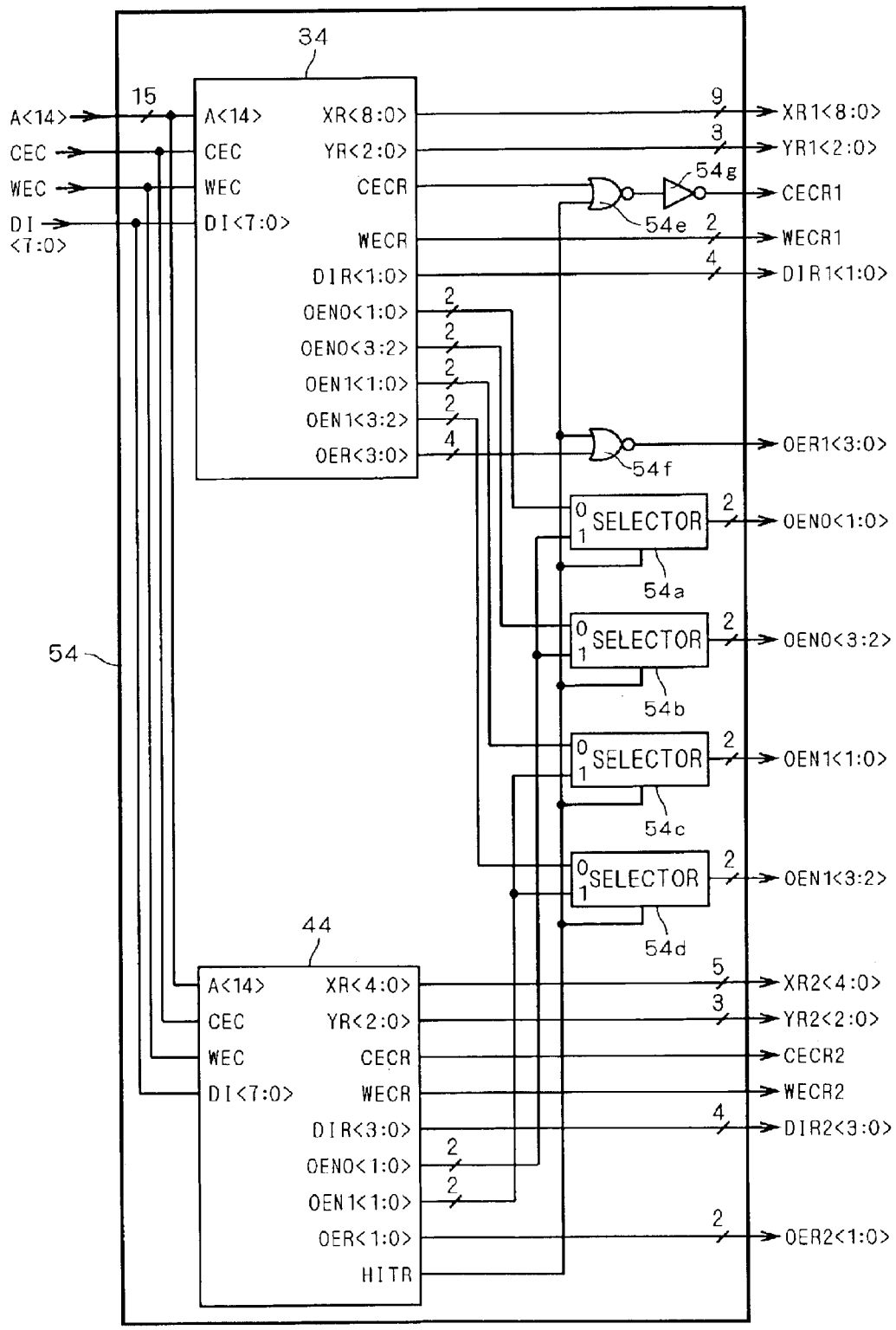

FIG. 55 is a block diagram showing a constitution of the redundancy control circuit 54. As shown in FIG. 55, the redundancy control circuit 54 comprises the redundancy control circuit 34 in the third preferred embodiment, the redundancy control circuit 44 in the fourth preferred embodiment, selector circuits 54a to 54d, NOR circuits 54e and 54f and an inverter 54g. The redundancy control circuit 44 further outputs the hit signal HITR generated therein to the outside thereof.

The column address XR<8:0>, the row address YR<2:0>, the write signal WECR and the data DIR<1:0> from the redundancy control circuit 34 are outputted to the redundancy RAM 32 as the column address XR1<8:0>, the row address YR1<2:0>, the write signal WECR1 and the data DIR1<1:0>, respectively.

The column address XR<4:0>, the row address YR<2:0>, the chip enable signal CECR, the write signal WECR and the data DIR<3:0> from the redundancy control circuit 44 are outputted to the redundancy RAM 42 as the column address XR2<4:0>, the row address YR2<2:0>, the chip enable signal CECR2, the write signal WECR2 and the data DIR2<3:0>, respectively. The enable signal OER<1:0> from the redundancy control circuit 44 is outputted to the data output selection circuit 55 as the enable signal OER2<1:0>.

The selector circuit 54a outputs the enable signal OEN0<1:0> from the redundancy control circuit 44 to the data output selection circuit 55 when the hit signal HITR=1 and outputs the enable signal OEN0<1:0> from the redundancy control circuit 34 to the data output selection circuit 55 when the hit signal HITR=0.

The selector circuit 54b outputs the enable signal OEN0<1:0> from the redundancy control circuit 44 to the data output selection circuit 55 as the enable signal OEN0<3:2> when the hit signal HITR=1 and outputs the enable signal OEN0<3:2> from the redundancy control circuit 34 to the data output selection circuit 55 when the hit signal HITR=0.

The selector circuit 54c outputs the enable signal OEN1<1:0> from the redundancy control circuit 44 to the data output selection circuit 55 when the hit signal HITR=1 and outputs the enable signal OEN1<1:0> from the redundancy control circuit 34 to the data output selection circuit 55 when the hit signal HITR=0.

The selector circuit 54d outputs the enable signal OEN1<1:0> from the redundancy control circuit 44 to the data output selection circuit 55 as the enable signal OEN1<3:2> when the hit signal HITR=1 and outputs the enable signal OEN1<3:2> from the redundancy control circuit 34 to the data output selection circuit 55 when the hit signal HITR=0.

The NOR circuit 54f performs a NOR operation of the enable signal OER<3:0> from the redundancy control circuit 34 and the hit signal HITR and outputs the operation result to the data output selection circuit 55 as the enable signal OER1<3:0>.

The NOR circuit 54e performs a NOR operation of the chip enable signal CECR from the redundancy control circuit 34 and the hit signal HITR and outputs the operation result. The inverter 54g inverts the output of the NOR circuit 54e and outputs the inverted signal to the redundancy RAM 32 as the chip enable signal CECR1.

The other constituents of the semiconductor memory device 51 in the fifth preferred embodiment are the same as those of the semiconductor memory device 31 in the third preferred embodiment, and description of these constituents will be omitted.

Next, an operation of the semiconductor memory device 51 of the fifth preferred embodiment will be discussed. First discussion will be made on an operation in the case where the normal memory cell array 17 in each of the normal RAMs 2a and 2b has no defect. In this case, no fuse in the redundancy control circuits 34 and 44 is programmed, and the hit signal HITR from the redundancy control circuit 44 becomes "0". Therefore, the enable signals OEN0<3:0> and OEN1<3:0> outputted from the redundancy control circuit 34 are inputted to the data output selection circuit 55. Further, in the redundancy control circuit 34, the hit signals HITB<3:0> are all always "0". The normal RAM 2 in the fifth preferred embodiment thereby performs the same operation as the normal RAM 2 in the third preferred embodiment.

On the side of the redundancy RAM 32, the chip enable signal CECR1 becomes "1" and the redundancy RAM 32 is inactivated, and further the enable signals OER1<3:0> are all "0" and the data DQR1<1:0> of the redundancy RAM 32 is not outputted to the outside of the semiconductor memory device 51.

On the side of the redundancy RAM 42, since the hit signals HRj<1:0>, HITR and HITB<1:0> are all always "0" in the redundancy control circuit 44, the chip enable signal CECR2 becomes "1" and the redundancy RAM 42 is inactivated. Further, the enable signals OER2<1:0> all become "0" and therefore the data DQR2<3:0> from the redundancy RAM 42 is not outputted to the outside of the semiconductor memory device 51.

Next discussion will be made on an operation of the semiconductor memory device 51 in the case where the normal memory cell array 17 in the normal RAM 2 has a column defect. In the fifth preferred embodiment, like in the above third preferred embodiment, considered is a case where the column replacement unit in the normal RAM 2 defined by the address A<13:10>=the address Yi<4:1>, the address A<14>=the address Zi<0> and subword number SB<1:0>=subword number Bi<1:0> is replaced by the i-th redundancy section F (i=0 to 2). In this case, the subword number SB<1:0> indicates subword No. k (k=0 to 3) and the k-th column replacement unit is replaced by the i-th redundancy section F. Since the operation of the redundancy control circuit 34 in this case has been discussed in the above third preferred embodiment, the detailed discussion thereof will be omitted.

In the column replacement, since no fuse in the redundancy control circuit 44 is programmed, the hit signal HITR becomes "0". Therefore, the enable signals OEN0<3:0> and OEN1<3:0> outputted from the redundancy control circuit 34 are inputted to the data output selection circuit 55.

The enable signals OEN0<k> and OEN1<k> out of the enable signals OEN0<3:0> and OEN1<3:0> become "0", regardless of the value of the address A<14>. Therefore, the outputs of the tristate buffers to which the enable signals OEN0<k> and OEN1<k> are inputted come into a high impedance state. Accordingly, the respective data corresponding to the k-th subword out of the data DQNA<7:0> and DQNB<7:0> are not outputted to the outside of the semiconductor memory device 51.

Since the hit signal HITR inputted to the OR circuit 54f is "0", the enable signal OER<3:0> from the redundancy control circuit 34 is inputted to the data output selection circuit 55 as the enable signal OER1<3:0>. Since the enable signal OER<k> out of the enable signal OER<3:0> becomes "1", the tristate buffer to which the enable signal is connected is activated. Therefore, the data DQR1<1:0> of the redundancy RAM 32 is outputted to the outside of the semiconductor memory device 51 instead of the output data corresponding to the k-th subword in the normal RAM 2. Further, since the enable signals OER<1:0> from the redundancy control circuit 44 are all "0", the tristate buffers 45c1 and 45c2 are not activated.

Next discussion will be made on an operation of the semiconductor memory device 51 in the case where the normal memory cell array 17 in the normal RAM 2 has a row defect. In the fifth preferred embodiment, like in the fourth preferred embodiment, considered is a case where the row replacement unit (the sections G1, G2) in the normal RAM 2 defined by the address A<8:1>=the address Xj<8:1>, the address A<14>=the address Zj<0> and subword number SB<0>=subword number Bi<0> is replaced by the j-th redundancy section H (j=0 to 3). In this case, the subword number SB<0> indicates the k-th section G (k=0, 1), and considered is a case where the k-th section G is replaced by the j-th section H. Since the operation of the redundancy control circuit 44 in this case has been discussed in the above fourth preferred embodiment, the detailed discussion thereof will be omitted.

In the row replacement, since the fuses in the redundancy control circuit 44 are programmed, the hit signal HITR becomes "1". Therefore, the enable signals OEN0<1:0>, OEN0<1:0>, OEN1<1:0> and OEN1<1:0> from the redundancy control circuit 44 are inputted to the data output selection circuit 55 as the enable signals OEN0<1:0>, OEN0<3:2>, OEN1<1:0> and OEN1<3:2>, respectively.

In the redundancy control circuit 44, since the hit signal HITB<k> is "1", the enable signals OEN0<k> and OEN1<k> out of the enable signals OEN0<1:0> and OEN1<1:0> become "0", regardless of the value of the address A<14>. Therefore, the outputs of the tristate buffers to which the enable signals OEN0<k> and OEN1<k> are inputted come into a high impedance state. Accordingly, the respective data corresponding to the k-th section G out of the data DQNA<7:0> and DQNB<7:0> are not outputted to the outside of the semiconductor memory device 51.

In the redundancy control circuit 44, the enable signal OER<k> corresponding to the hit signal HITB<k> becomes "1". Accordingly, the enable signal OER2<k> inputted to the data output selection circuit 55 becomes "1". Therefore, the tristate buffer to which the enable signal OER2<k> is connected is activated. As a result, the data DQR<3:0> of the redundancy RAM 42 is outputted to the outside of the semiconductor memory device 51 instead of the output data corresponding to the k-th section G in the normal RAM 2. Further, since the hit signal HITR inputted to the OR circuit 54f is "1", the enable signals OER1<3:0> all become "0". Therefore, the tristate buffers 25d1 to 25d4 are not activated.

Thus, in the fifth preferred embodiment, since the redundancy RAM 42 for the row replacement and the redundancy RAM 32 for the column replacement are separately provided, the flexibility in layout of the redundancy circuit increases and an efficient layout can be achieved in the semiconductor memory device 51 on the whole.

The Sixth Preferred Embodiment

Figure 57:
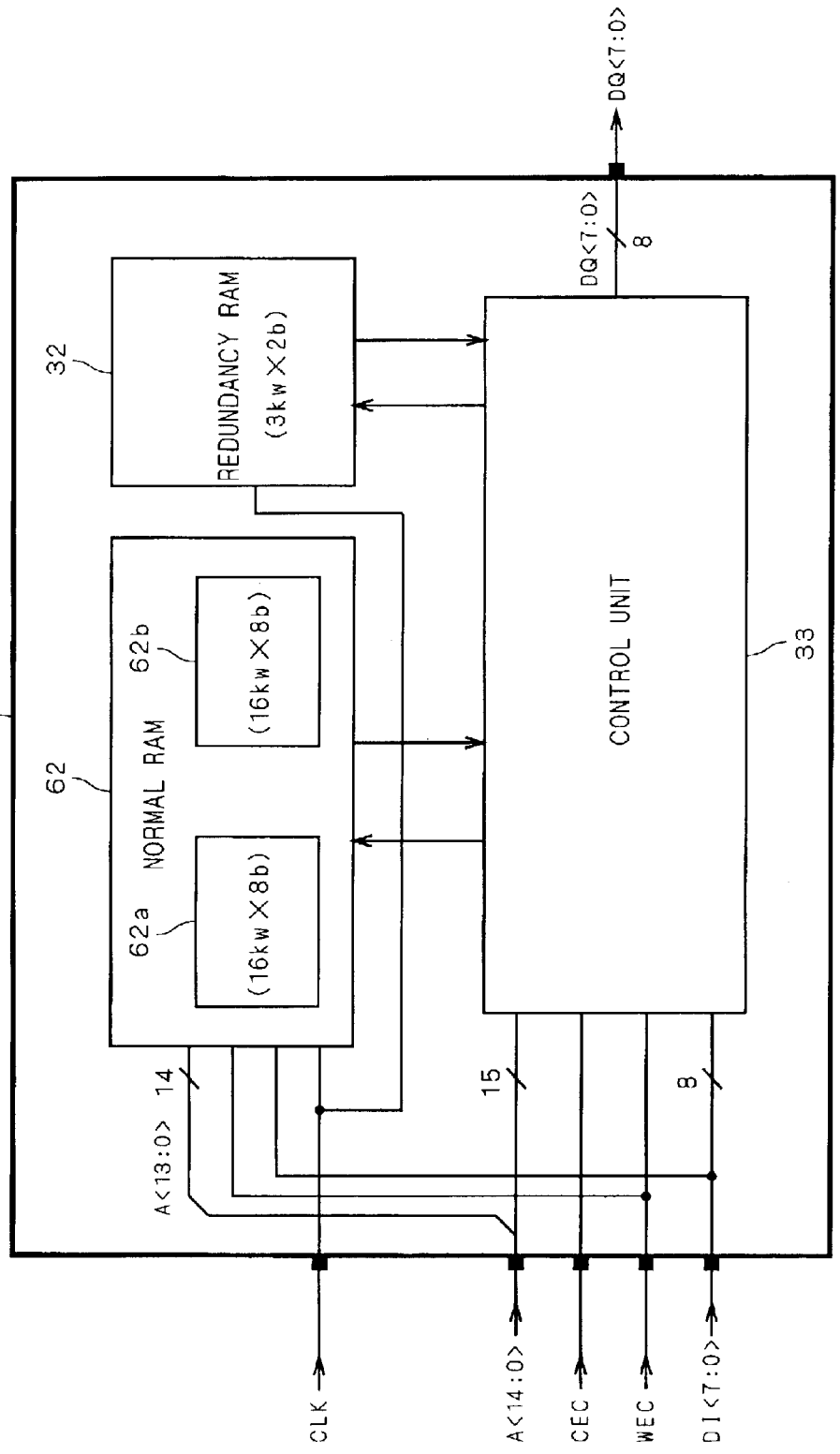
FIGS. 57 to 59 are diagrams showing a constitution of a semiconductor memory device in accordance with a sixth preferred embodiment of the present invention.
Figure 58:
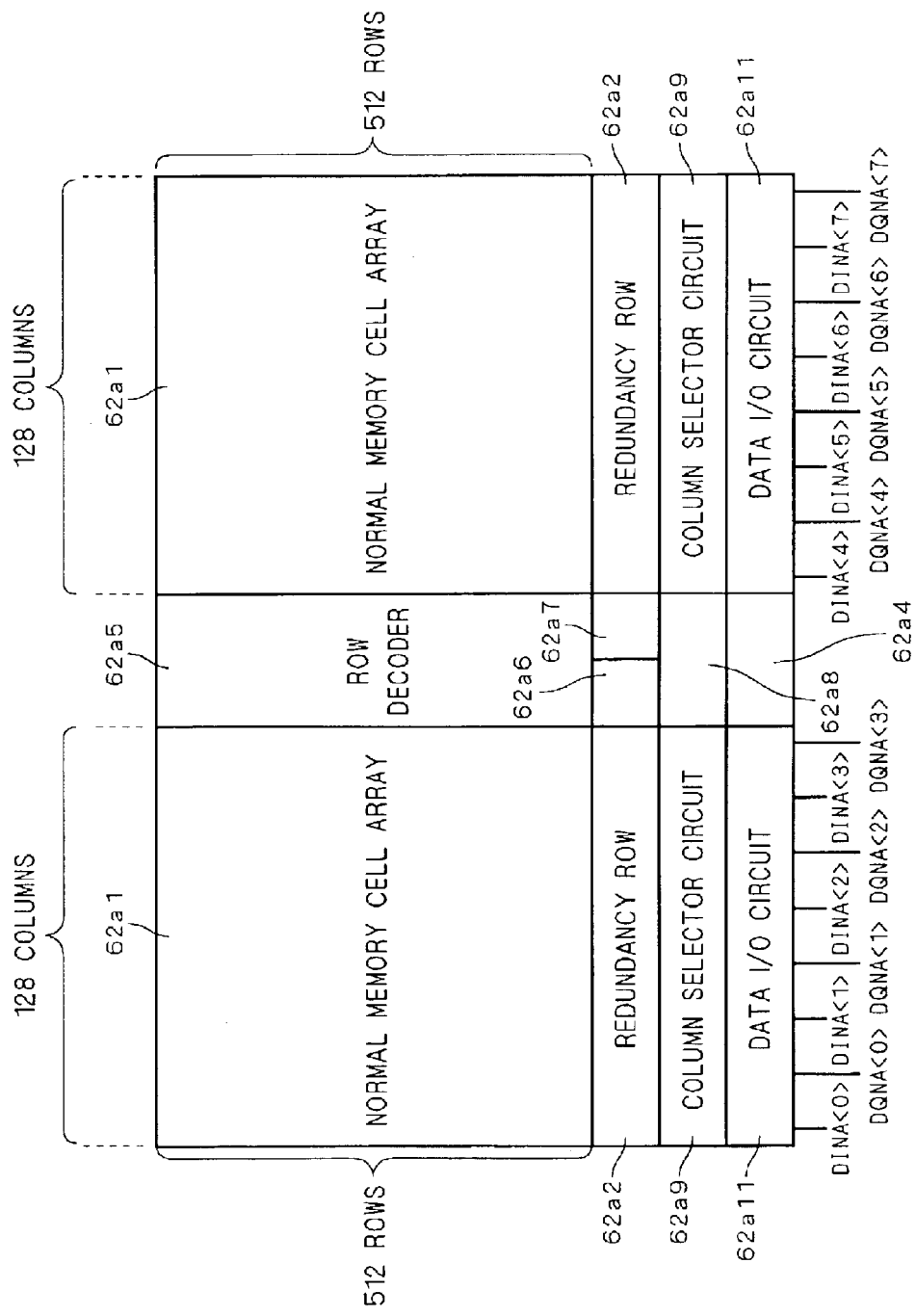
Figure 59:
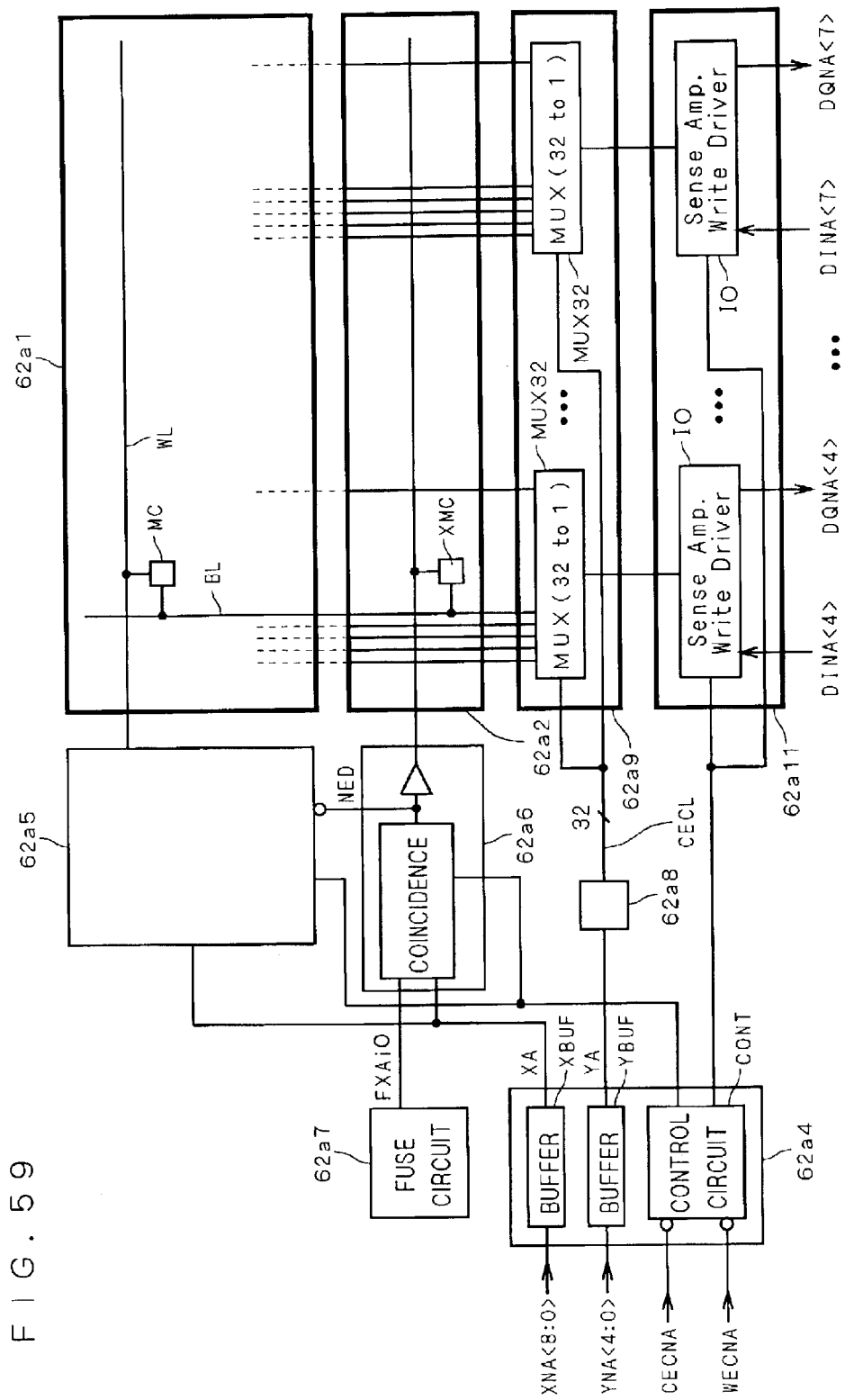

FIGS. 57 to 59 are diagrams showing a constitution of a semiconductor memory device 61 in accordance with the sixth preferred embodiment of the present invention. The semiconductor memory device 61 of the sixth preferred embodiment is a 256-kbit RAM with 8 bits×32 kwords.

As shown in FIG. 57, the semiconductor memory device 61 of the sixth preferred embodiment comprises the basic constituents of the semiconductor memory device 31 of the third preferred embodiment and further comprises a normal RAM 62 instead of the normal RAM 2. The normal RAM 62 comprises normal RAMs 62a and 62b each of which is a 128-kbit RAM with 8 bits×16 kwords, having a function of a 256-kbit RAM with 8 bits×32 kwords on the whole. Each of the normal RAMs 62a and 62b comprises a redundancy circuit for row replacement therein and can perform a row replacement by itself when it has a row defect.

FIG. 58 is a block diagram showing a constitution of the normal RAM 62a, also showing layout of its constituent elements. Since the normal RAMs 62a and 62b have the same constitution, the constitution of the normal RAM 62a will be discussed below as a representative. In some cases, the normal RAMs 62a and 62b are collectively referred to as a "normal RAM 62ab".

As shown in FIG. 58, the normal RAM 62a comprises a normal memory cell array 62a1 consisting of a plurality of normal memory cells arranged in a matrix with 512 rows and 256 columns (not shown), a redundancy row 62a2 serving as a redundancy circuit, a control unit 62a4, a row decoder 62a5, a redundancy row fuse circuit 62a7, a column decoder 62a8, a column selector circuit 62a9 and a data I/O circuit 62a11.

The normal memory cell array 62a1 is divided into two by the row decoder 62a5 disposed at the center thereof and a sub-normal memory cell array thereof is constituted of a plurality of normal memory cells arranged in a matrix with 512 rows and 128 columns. Each sub-normal memory cell array is provided with the redundancy row 62a2, the column selector circuit 62a9 and the data I/O circuit 62a11. The input and output signals of the normal RAMs 62a and 62b are the same as those of the above-discussed normal RAMs 2a and 2b.

FIG. 59 is a block diagram showing respective constitutions of the constituent elements of the normal RAM 62a. In FIG. 59, for simple illustration, shown are the normal memory cell array 62a1, the redundancy row 62a2, the column selector circuit 62a9 and the data I/O circuit 62a11 on the right side of the constituent elements of FIG. 58 and further the row decoder 62a5, a redundancy row decoder 62a6, the redundancy row fuse circuit 62a7, the column decoder 62a8 and the control unit 62a4.

Now, an operation of the normal RAM 62a will be discussed, referring to FIG. 59. First discussion will be made on an operation of the normal RAM 62a in the case where the normal memory cell array 62a1 has no defect. In this case, the redundancy row 62a2 does not work. The redundancy row 62a2 is a redundancy memory cell area consisting of a plurality of redundancy memory cells XMC aligned in a row.

The row address XNA<8:0> inputted form the outside of the semiconductor memory device 61 is inputted to the row decoder 62a5 as a row address XA through a buffer XBUF included in the control unit 62a4. A control circuit CONT provided in the control unit 62a4 activates the row decoder 62a5 when the chip enable signal CECNA inputted from the outside of the semiconductor memory device 61 is "0" and inactivates it when the chip enable signal CECNA is "1". When activated, the row decoder 62a5 decodes the row address XA to select one of the 512 rows, and makes the corresponding word line WL "1" to be activated and makes the other word lines "0" to be inactivated. At this time, the redundancy row decoder 62a6 outputs a signal NED indicating "0" to the row decoder 62a5, regardless of the value of the row address XA. Further, when the signal NED is "0", the row decoder 62a5 decodes the address XA. One row in the normal memory cell array 62a1 is thereby selected and the normal memory cell MC on the row is connected to the bit line BL.

The column address YNA<4:0> from the outside of the semiconductor memory device 61 is inputted to the column decoder 62a8 as a column address YA through a buffer YBUF included in the control unit 62a4.

The column selector circuit 62a9 connected to the column decoder 62a8 is provided with four multiplexers MUX32, and 32 bit lines BL are connected to each multiplexer MUX32. The data I/O circuit 62a11 is provided with four I/O circuits IO each having a sense amplifier and a write driver, and there is a one-to-one correspondence between the I/O circuits 10 and the multiplexers MUX32. The column decoder 62a8 and the each multiplexer MUX32 are connected with thirty-two column selection lines CSEL, and there is a one-to-one correspondence between the thirty-two column selection lines CSEL and the thirty-two bit lines BL connected to the multiplexer MUX32.

The column decoder 62a8 decodes the inputted column address YA, and sets "1" to one of the thirty-two column selection lines CSEL corresponding to the decoded result and sets "0" to the other column selection lines CSEL. Each of the multiplexers MUX32 connects the bit line BL corresponding to the column selection line CSEL of "1" to the corresponding I/O circuit IO.

At this time, when the write signal WECNA and the chip enable signal CECNA inputted from the outside of the semiconductor memory device 61 are both "0", the control circuit CONT activates the write driver in each of the I/O circuits 10. The data DINA<7:4> inputted from the outside of the semiconductor memory device 61 is thereby written into the sub-normal memory cell array on the right side. Further, when the write signal WECNA is "1" and the chip enable signal CECNA is "0", the control circuit CONT activates the sense amplifier in each of the I/O circuits IO. The data read out from the sub-normal memory cell array on the right side is outputted to the outside of the normal RAM 62a as the data DQNA<7:4>. The operation of the normal RAM 62 in the case where the normal memory cell array has no defect is the same as that of the normal RAM 2 in the third preferred embodiment.

In the case where the normal memory cell array 62a1 has a row defect, an enable fuse (not shown) and an address fuse FXAi (not shown) corresponding to the address of the defective row in the redundancy row fuse circuit 62a7 are broken by a laser trimming device. The fuse judgment circuit (not shown) for judging whether the fuse has a break, which is provided in the redundancy row fuse circuit 62a7, outputs an enable signal FEN0 and an address FXAi0 each indicating "1". The enable signal FEN0 of "1" indicates that the enable fuse is broken and the address FXAi0 of "1" indicates that the address fuse FXAi corresponding to the address of the defective row is broken. In contrast, the fuse judgment circuit of an unbroken fuse outputs "0".

The redundancy row decoder 62a6 compares the address FXAi0 specifying the defective row with the row address XA and outputs the signal NED indicating "1" when the addresses coincide with each other. By the signal NED, the word line of the redundancy row 62a2 is activated. In response to the signal NED, the row decoder 62a5 makes all the outputs "0". As a result, only the redundancy memory cell XMC of the redundancy row 62a2 is connected to the bit line BL. Like in the case where the normal memory cell array 62a1 has no defect, each of the multiplexers MUX32 connects the bit line BL corresponding to the column selection line CSEL of "1" to the corresponding I/O circuit IO. Read and write of data is thereby performed from/to the redundancy memory cell XMC of the redundancy row 62a2.

When the row address XA does not coincide with the address FXAi0, the redundancy row decoder 62a6 outputs the signal NED indicating "0". Therefore, in this case, the row decoder 62a5 operates like in the case where the normal memory cell array 62a1 has no defect and access is made to the normal memory cell MC specified by the row address XA and the column address YA.

The normal memory cell array 62a1, the redundancy row 62a2, the column selector circuit 62a9 and the data I/O circuit 62a11 on the left side of FIG. 58 also have the same constitution as shown in FIG. 59 and perform the above operation with the row decoder 62a5, the redundancy row decoder 62a6, the redundancy row fuse circuit 62a7, the column decoder 62a8 and the control unit 62a4 shown in FIG. 59. Further, the data I/O circuit 62a11 on the left side outputs the data DQNA<3:0>, and the data DINA<3:0> is inputted to the data I/O circuit 62a11.

Each of the normal RAMs 62a and 62b performs an operation in synchronization with the clock CLKNA inputted from the outside of the semiconductor memory device 61, and the clock CLKNA is not shown in FIG. 59.

Thus, each of the normal RAMs 62a and 62b comprises the redundancy circuit for row replacement therein and can perform a row replacement by itself. Therefore, even if the normal RAM 62ab performs a row replacement, it has no effect on the control unit 33 of the sixth preferred embodiment. Further, the operation of the control unit 33 has no effect on the row replacement operation of the normal RAM 62ab.

Connection between the normal RAM 62ab and the control unit 33 is the same as the connection between the normal RAMs 2a and 2b and the control unit 33 in the semiconductor memory device 31 of the third preferred embodiment. Further, the normal RAMs 62a and 62b can be automatically generated by a general module generator.

Next discussion will be made on a replacement method in the case where the normal memory cell array 62a1 in each of the normal RAMs 62a and 62b has a column defect.

Figure 60:
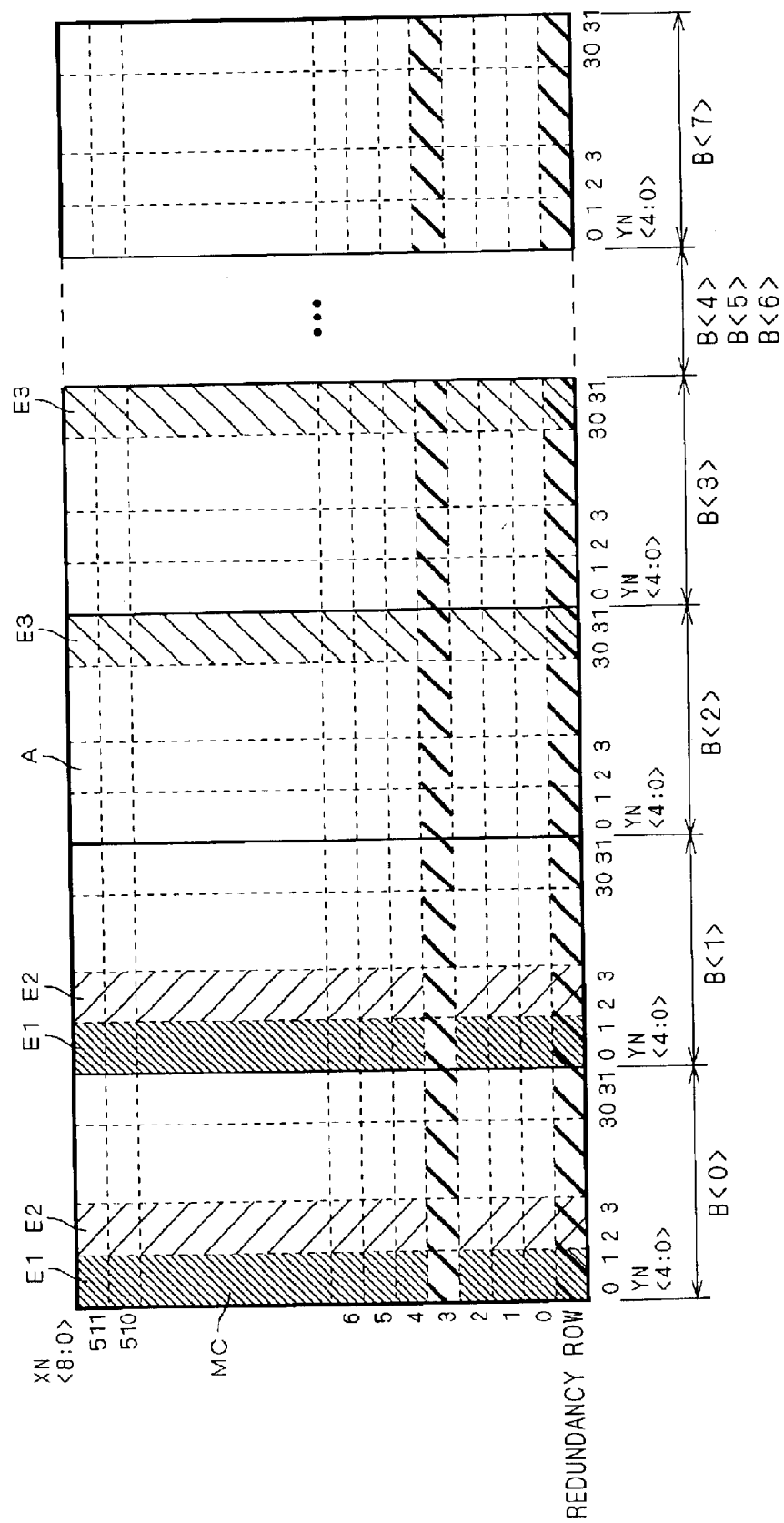
FIG. 60 is a diagram showing a constitution of a normal memory cell array in accordance with the sixth preferred embodiment of the present invention.

FIG. 60 is a diagram schematically showing the normal memory cell array and the redundancy row included in the normal RAM 62ab. The constitution of the normal memory cell array of the normal RAM 62ab is the same as that of the normal memory cell array 17 in the above-discussed third preferred embodiment.

As shown in FIG. 60, the normal memory cell array in the normal RAM 62ab is logically divided in advance into a plurality of sections A, like the normal memory cell array 17 in the third preferred embodiment. As to the sections E1 to E3 in this figure, like those in FIG. 37, the sections A constituting the column replacement unit are defined as the sections E1 to E3, for convenience of illustration. Further, the redundancy memory cell array 88 in the redundancy RAM 32 is divided into the sections F1 to F3 in advance, as shown in FIG. 38.

In the semiconductor memory device 61 of the sixth preferred embodiment, when the normal memory cell array in the normal RAM 62ab has a defect and a column replacement is performed, it is possible to replace the column replacement unit (a pair of sections A) in the normal memory cell array corresponding to the defective portion by arbitrary one of the redundancy sections F1 to F3 in the redundancy memory cell array 88 of the redundancy RAM 32 by a control of the control unit 33. Further, when a row replacement is performed, it is possible to replace the normal memory cell MC in a defective row by the redundancy memory cell XMC in the redundancy row, as discussed above.

Though the control unit 33 of the sixth preferred embodiment defines the column replacement unit in the normal memory cell array in a form shown in FIG. 37 in advance, when a row replacement is performed in the normal RAM 62ab, the form of the column replacement unit is changed. In other words, a form of the column replacement unit in performing only the column replacement and that in performing both the row replacement and the column replacement are different from each other. This is because when the inputted row address XN<8:0> specifies a defective row in the column replacement, access is made to the redundancy memory cell XMC in the redundancy row instead of the defective row. The sections E1 to E3 of FIG. 60 reveal a form of the column replacement unit in this case. Specifically, FIG. 60 shows a form of the sections E1 to E3 in the case where a row specified by the row address XN<8:0>=3 (in decimal) is replaced by the redundancy row, and the sections E1 to E3 do not include the normal memory cell MC in the row specified by the row address XN<8:0>=3 (in decimal) but include the redundancy memory cell XMC of the redundancy row instead.

Since the operation for column replacement of the semiconductor memory device 61 in the sixth preferred embodiment is the same as that of the semiconductor memory device 31 in the third preferred embodiment, the detailed discussion will be omitted. Further, since the other constituents of the semiconductor memory device 61 in the sixth preferred embodiment are the same as those of the semiconductor memory device 31 in the third preferred embodiment, description of these constituents will be omitted.

Thus, the semiconductor memory device 61 of the sixth preferred embodiment can perform the row replacement and the column replacement, unlike in the above-discussed second background art. Further, since a normal RAM which has a redundancy circuit for row replacement therein, such as the normal RAM 62ab, can be usually designed with ease, both the column replacement and the row replacement can be achieved by providing the control unit 33 and the redundancy RAM 32 for column replacement outside the normal RAM.

The Seventh Preferred Embodiment

Figure 61:
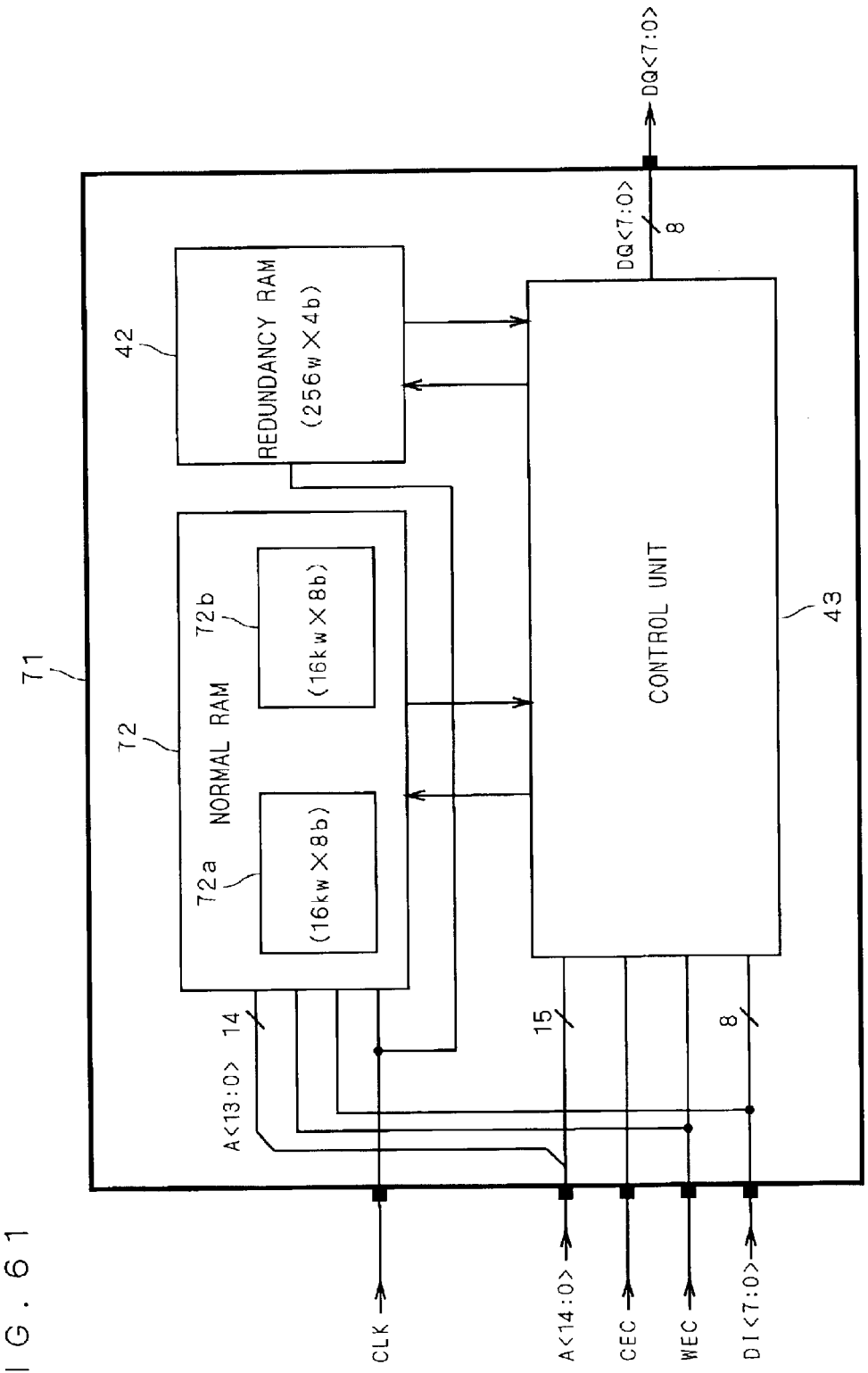
FIGS. 61 to 63 are diagrams showing a constitution of a semiconductor memory device in accordance with a seventh preferred embodiment of the present invention.
Figure 62:
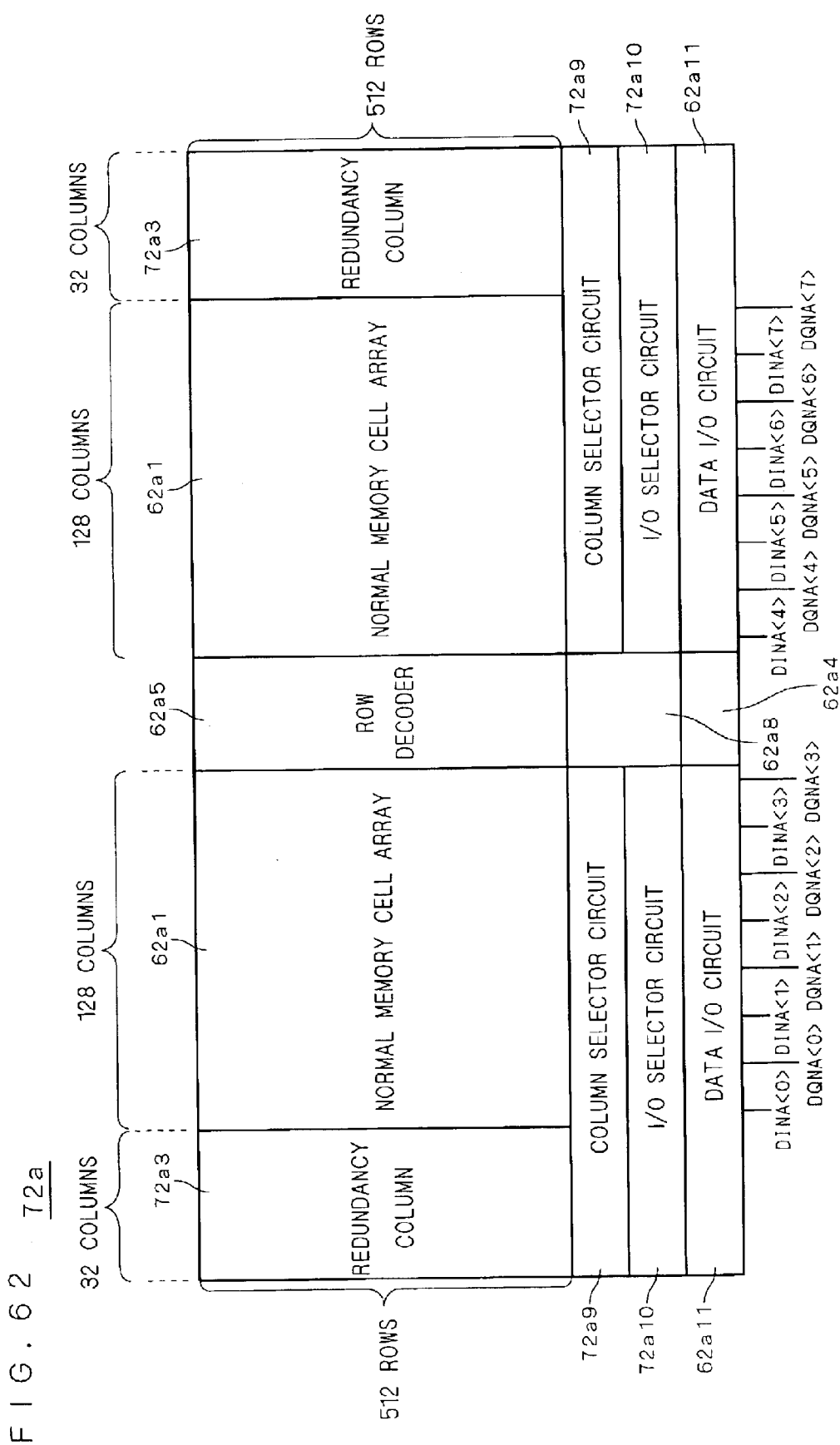
Figure 63:
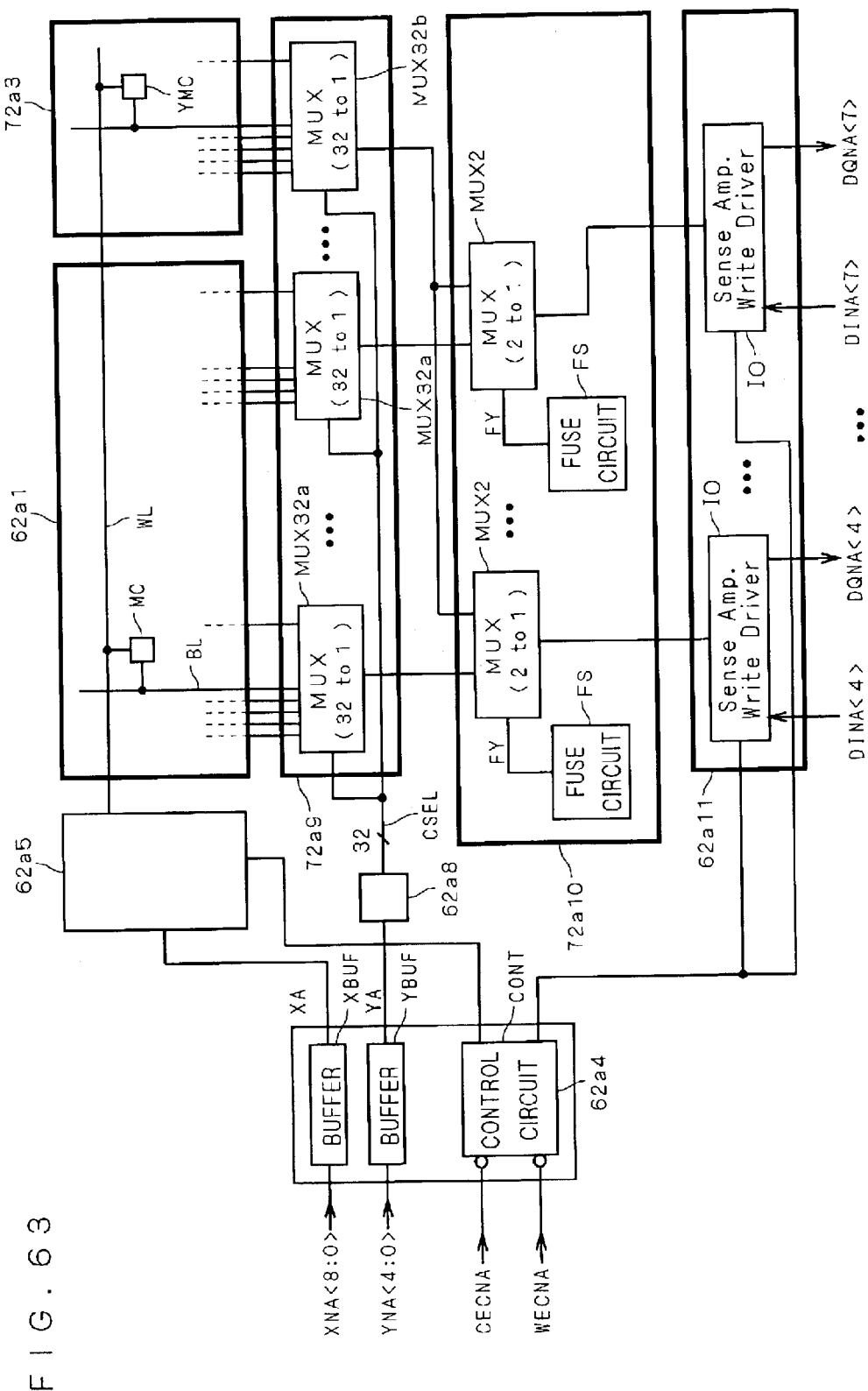

FIGS. 61 to 63 are diagrams showing a constitution of a semiconductor memory device 71 in accordance with the seventh preferred embodiment of the present invention. The semiconductor memory device 71 of the seventh preferred embodiment is a 256-kbit RAM with 8 bits×32 kwords.

As shown in FIG. 61, the semiconductor memory device 71 of the seventh preferred embodiment comprises the basic constituents of the semiconductor memory device 41 of the fourth preferred embodiment and further comprises a normal RAM 72 instead of the normal RAM 2. The normal RAM 72 comprises normal RAMs 72a and 72b each of which is a 128-kbit RAM with 8 bits×16 kwords, having a function of a 256-kbit RAM with 8 bits×32 kwords on the whole. Each of the normal RAMs 72a and 72b comprises a redundancy circuit for column replacement therein and can perform a column replacement by itself when it has a column defect.

FIG. 62 is a block diagram showing a constitution of the normal RAM 72a, also showing layout of its constituent elements. Since the normal RAMs 72a and 72b have the same constitution, the constitution of the normal RAM 72a will be discussed below as a representative. In some cases, the normal RAMs 72a and 72b are collectively referred to as a "normal RAM 72ab".

As shown in FIG. 62, the normal RAM 72a comprises the normal memory cell array 62a1, the control unit 62a4, the row decoder 62a5, the column decoder 62a8 and the data I/O circuit 62a11 which are discussed above and further comprises a redundancy column 72a3 serving as a redundancy circuit, a column selector circuit 72a9 and an I/O selector circuit 72a10.

Each of the sub-normal memory cell arrays of the normal memory cell array 62a1 is provided with the redundancy column 72a3, the column selector circuit 72a9, the I/O selector circuit 72a10 and the data I/O circuit 62a11. The input and output signals of the normal RAMs 72a and 72b are the same as those of the above-discussed normal RAMs 2a and 2b.

FIG. 63 is a block diagram showing respective constitutions of the constituent elements of the normal RAM 72a. In FIG. 63, for simple illustration, shown are the normal memory cell array 62a1, the redundancy column 72a3, the column selector circuit 72a9, the I/O selector circuit 72a10 and the data I/O circuit 62a11 on the right side of the constituent elements of FIG. 62 and further the row decoder 62a5, the column decoder 62a8 and the control unit 62a4.

Now, an operation of the normal RAM 72 will be discussed. Since operations of the normal RAMs 72a and 72b are the same, an operation of the normal RAM 72a will be discussed as a representative.

First discussion will be made on an operation of the normal RAM 72a in the case where the normal memory cell array 62a1 has no defect. In this case, the redundancy column 72a3 does not work. The redundancy column 72a3 is a redundancy memory cell area consisting of a plurality of redundancy memory cells YMC arranged in 32 columns.

The row address XNA<8:0> inputted form the outside of the semiconductor memory device 71 is inputted to the row decoder 62a5 as the row address XA through the buffer XBUF included in the control unit 62a4. The control circuit CONT provided in the control unit 62a4 activates the row decoder 62a5 when the chip enable signal CECNA inputted from the outside of the semiconductor memory device 71 is "0" and inactivates it when the chip enable signal CECNA is "1". When activated, the row decoder 62a5 decodes the row address XA to select one of the 512 rows, and makes the corresponding word line WL "1" to be activated and makes the other word lines "0" to be inactivated. One row in the normal memory cell array 62a1 is thereby selected and the normal memory cell MC on the row is connected to the bit line BL.

The column address YNA<4:0> from the outside of the semiconductor memory device 71 is inputted to the column decoder 62a8 as the column address YA through the buffer YBUF included in the control unit 62a4.

The column selector circuit 72a9 connected to the column decoder 62a8 is provided with four multiplexers MUX32a corresponding to the normal memory cell array 62a1 and one multiplexer MUX32b corresponding to the redundancy column 72a3, and 32 bit lines BL are connected to each of the multiplexers MUX32a and MUX32b.

The I/O selector circuit 72a10 is provided with four pairs of one multiplexer MUX2 and one fuse circuit FS. Each fuse circuit FS is provided with a fuse and a fuse judgment circuit (not shown) therein. The fuse judgment circuit outputs a signal FY indicating "1" when the fuse is broken and indicating "0" when the fuse is not broken to the multiplexer MUX2.

Each multiplexer MUX2 is connected to the multiplexer MUX32b in the column selector circuit 72a9. The multiplexer MUX2 is further connected to the multiplexers MUX32a in a one-to-one correspondence.

The data I/O circuit 62a11 is provided with four I/O circuits IO each having the sense amplifier and the write driver, and there is a one-to-one correspondence between the four I/O circuits IO and the four multiplexers MUX2. The column decoder 62a8 and each of the multiplexers MUX32a and MUX32b are connected with the thirty-two column selection lines CSEL, and there is a one-to-one correspondence between the thirty-two column selection lines CSEL and the thirty-two bit lines BL connected to the multiplexers MUX32a and MUX32b.

The column decoder 62a8 decodes the inputted column address YA, and sets "1" to one of the thirty-two column selection lines CSEL corresponding to the decoded result and sets "0" to the other column selection lines CSEL. Each of the multiplexers MUX32a connects the bit line BL corresponding to the column selection line CSEL of "1" to the corresponding multiplexer MUX2. The multiplexer MUX32b connects the bit line BL corresponding to the column selection line CSEL of "1" to each of the multiplexers MUX2.

In the case where the normal memory cell array 62a1 has no defect, since no fuse of the fuse circuit FS in the I/O selector circuit 72a10 is broken, the signal FY indicates "0". Each of the multiplexers MUX2 thereby connects the bit lines of the normal memory cell array 62a1 to the corresponding I/O circuits IO.

At this time, the control circuit CONT activates the write driver in each of the I/O circuits IO when both the write signal WECNA and the chip enable signal CECNA which are inputted from the outside of the semiconductor memory device 71 indicate "0". The data DINA<7:4> inputted from the outside of the semiconductor memory device 71 is thereby written into the sub-normal memory cell array on the right side. Further, the control circuit CONT activates the sense amplifier in each of the I/O circuits IO when the write signal WECNA indicates "1" and the chip enable signal CECNA indicates "0". The data read out from the sub-normal memory cell array on the right side is thereby outputted to the outside of the normal RAM 72a as the data DQNA<7:4>.

In the case where the normal RAM 62a1 has a column defect, a fuse of the fuse circuit FS in the I/O selector circuit 72a10 corresponding to a batch of 32 columns including the defective column is broken by a laser trimming device. The fuse circuit FS whose fuse is broken outputs the signal FY indicating "1" to the corresponding multiplexer MUX2.

Each of the multiplexers MUX32a connects the bit line BL corresponding to the column selection line CSEL which is set to "1" by the column decoder 62a8 as discussed above to the corresponding multiplexer MUX2. The multiplexer MUX32b connects the bit line BL corresponding to the column selection line CSEL of "1" to each of the multiplexers MUX2.

One of the four multiplexers MUX2 which receives the signal FY indicating "1" connects the bit line BL of the redundancy column 72a3 to the corresponding I/O circuit IO. The other multiplexers MUX2 connect the bit lines BL in the normal memory cell array 62a1 to the corresponding I/O circuits IO.

Word line selection is performed in the same manner as in the case where the normal memory cell array 62a1 has no defect. Thus, access is made to the redundancy column 72a3 instead of the batch of 32 columns including the defective column.

The normal memory cell array 62a1, the redundancy column 72a3, the column selector circuit 72a9 and the I/O selector circuit 72a10 and the data I/O circuit 62a11 on the left side of FIG. 62 also have the same constitution as shown in FIG. 63 and perform the above operation with the row decoder 62a5, the column decoder 62a8 and the control unit 62a4 shown in FIG. 63. Further, the data I/O circuit 62a11 on the left side outputs the data DQNA<3:0>, and the data DINA<3:0> is inputted to the data I/O circuit 62a11.

Each of the normal RAMs 72a and 72b performs an operation in synchronization with the clock CLKNA inputted from the outside of the semiconductor memory device 71, and the clock CLKNA is not shown in FIG. 63.

Thus, each of the normal RAMs 72a and 72b comprises the redundancy circuit for column replacement therein and can perform a column replacement by itself. Therefore, even if the normal RAM 72a or 72b performs a column replacement, it has no effect on the control unit 43 of the seventh preferred embodiment. Further, the input and output signals of the normal RAMs 72a and 72b are the same as those of the above-discussed normal RAMs 2a and 2b, and connection between the normal RAMs 72a and 72b and the control unit 43 is the same as the connection between the normal RAMs 2a and 2b and the control unit 43 in the semiconductor memory device 41 of the fourth preferred embodiment. The row replacement operation of the control unit 43 discussed later has no effect on the column replacement operation of the normal RAMs 72a and 72b.

The normal RAMs 72a and 72b can be automatically generated by a general module generator.

Next discussion will be made on a replacement method in the case where the normal memory cell array 62a1 in each of the normal RAMs 72a and 72b has a row defect.

Figure 64:
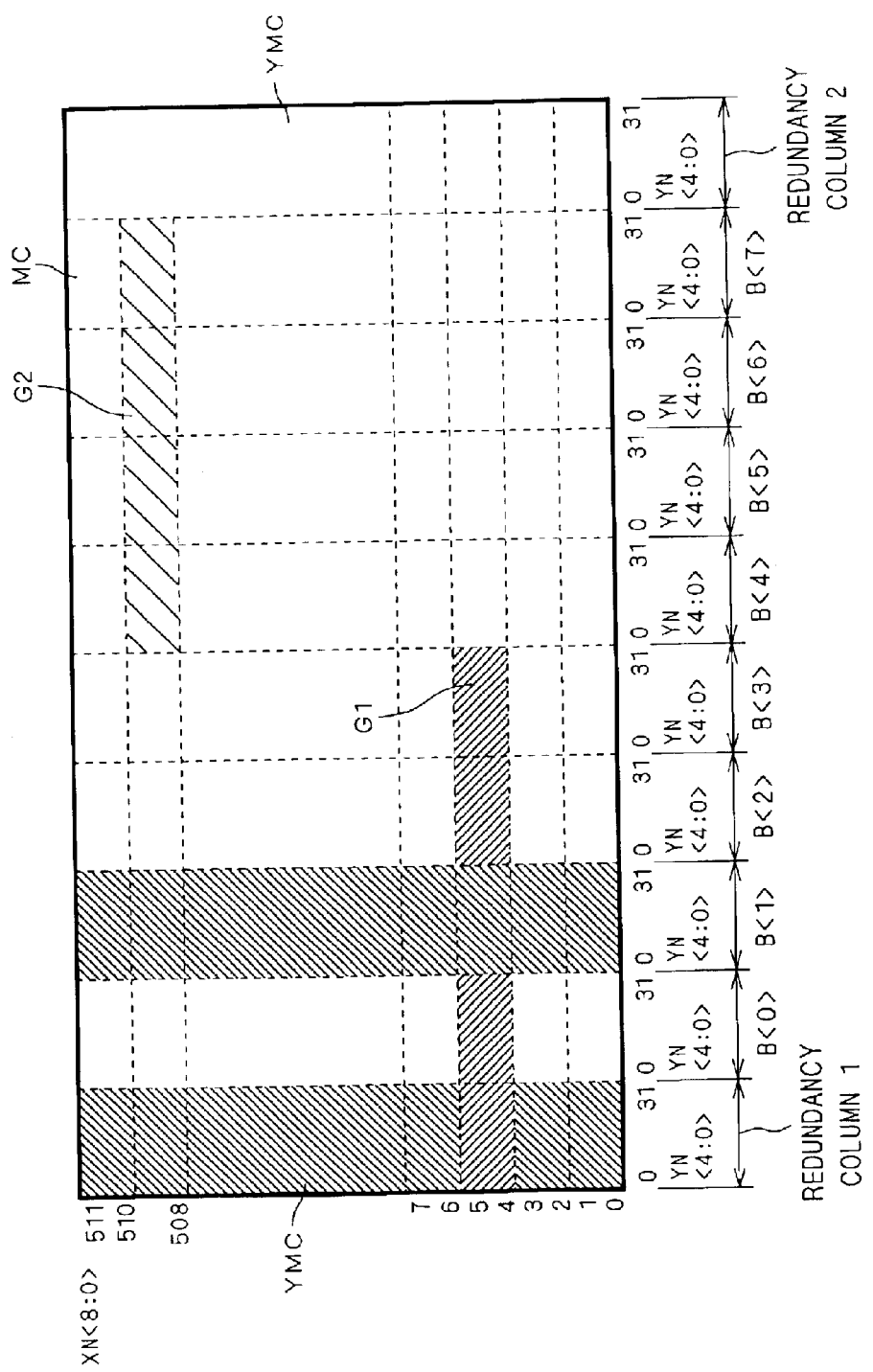
FIG. 64 is a diagram showing a constitution of a normal memory cell array in accordance with the seventh preferred embodiment of the present invention.

FIG. 64 is a diagram schematically showing the normal memory cell array and the redundancy column included in the normal RAM 72ab. The constitution of the normal memory cell array of the normal RAM 72ab is the same as that of the normal memory cell array 17 in the above-discussed fourth preferred embodiment. Further, a redundancy column 1 of FIG. 64 corresponds to the redundancy column on the left side in FIG. 62 and a redundancy column 2 corresponds to the redundancy column on the right side.

As shown in FIG. 64, the normal memory cell array in the normal RAM 72ab is logically divided in advance into a plurality of sections G1 and G2, like the normal memory cell array 17 in the fourth preferred embodiment, and the sections G1 and G2 are row replacement units. The redundancy memory cell array 98 in the redundancy RAM 42 are divided into four redundancy sections H in advance as shown in FIG. 51.

In the semiconductor memory device 71 of the seventh preferred embodiment, when the normal memory cell array in the normal RAM 72ab has a defect and a row replacement is performed, it is possible to replace the row replacement unit (section G1, G2) in the normal memory cell array corresponding to the defective portion by arbitrary one of the redundancy sections H in the redundancy memory cell array 98 of the redundancy RAM 42 by a control of the control unit 43. Further, when a column replacement is performed, it is possible to replace the normal memory cell MC in a defective column by the redundancy memory cell YMC in the redundancy column, as discussed above.

Though the control unit 43 of the seventh preferred embodiment defines the row replacement unit in the normal memory cell array in a form shown in FIG. 50 in advance, when a column replacement is performed in the normal RAM 72ab, the form of the row replacement unit is changed. In other words, a form of the row replacement unit in performing only the row replacement and that in performing both the row replacement and the column replacement are different from each other. This is because when the inputted column address YN<4:0> specifies any one in a batch of 32 columns including a defective column in the row replacement, access is made to the redundancy memory cell YMC in the redundancy column instead of the batch of 32 columns. The redundancy section G1 hatched in FIG. 64 reveals a form of the row replacement unit in this case. Specifically, FIG. 64 shows the section G1 in the case where the batch of 32 columns corresponding to the bit B<1> is replaced by the redundancy column 1, and the section G1 does not include the normal memory cell MC corresponding to the bit B<1> but includes the redundancy memory cell YMC of the redundancy column 1 instead.

Since the operation for row replacement of the semiconductor memory device 71 in the seventh preferred embodiment is the same as that of the semiconductor memory device 41 in the fourth preferred embodiment, the detailed discussion will be omitted. Further, since the other constituents of the semiconductor memory device 71 in the seventh preferred embodiment are the same as those of the semiconductor memory device 41 in the fourth preferred embodiment, description of these constituents will be omitted.

Thus, the semiconductor memory device 71 of the seventh preferred embodiment can perform the row replacement and the column replacement, unlike in the above-discussed second background art. Further, since a normal RAM which has a redundancy circuit for column replacement therein, such as the normal RAM 72ab, can be usually designed with case, both the column replacement and the row replacement can be achieved by providing the control unit 43 and the redundancy RAM 42 for row replacement outside the normal RAM.

Figure 65:
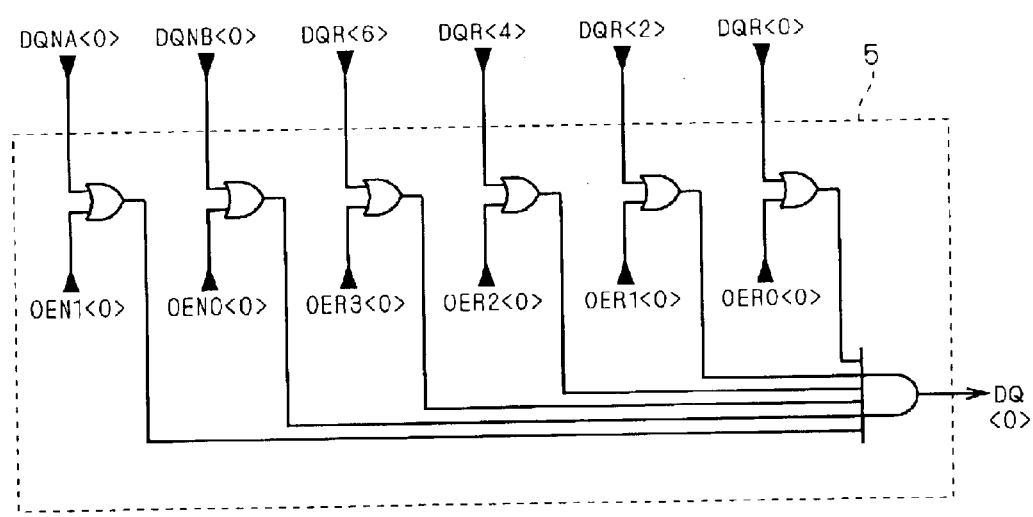
FIG. 65 is a diagram showing a variation of circuit configuration of a data output selection circuit.
Figure 66:
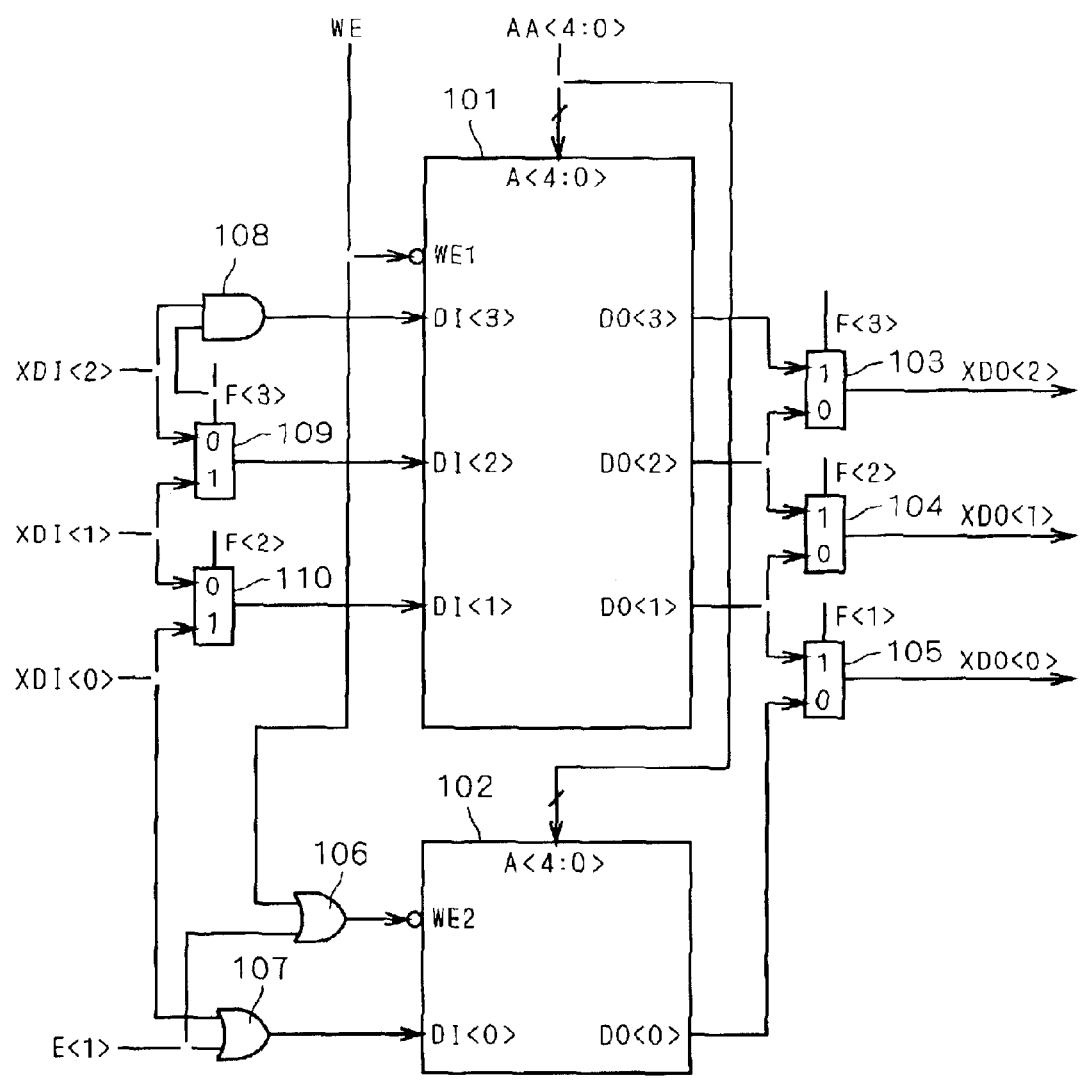
FIGS. 66 to 69 are diagrams showing a configuration of a semiconductor memory device in the first background art.
Figure 67:
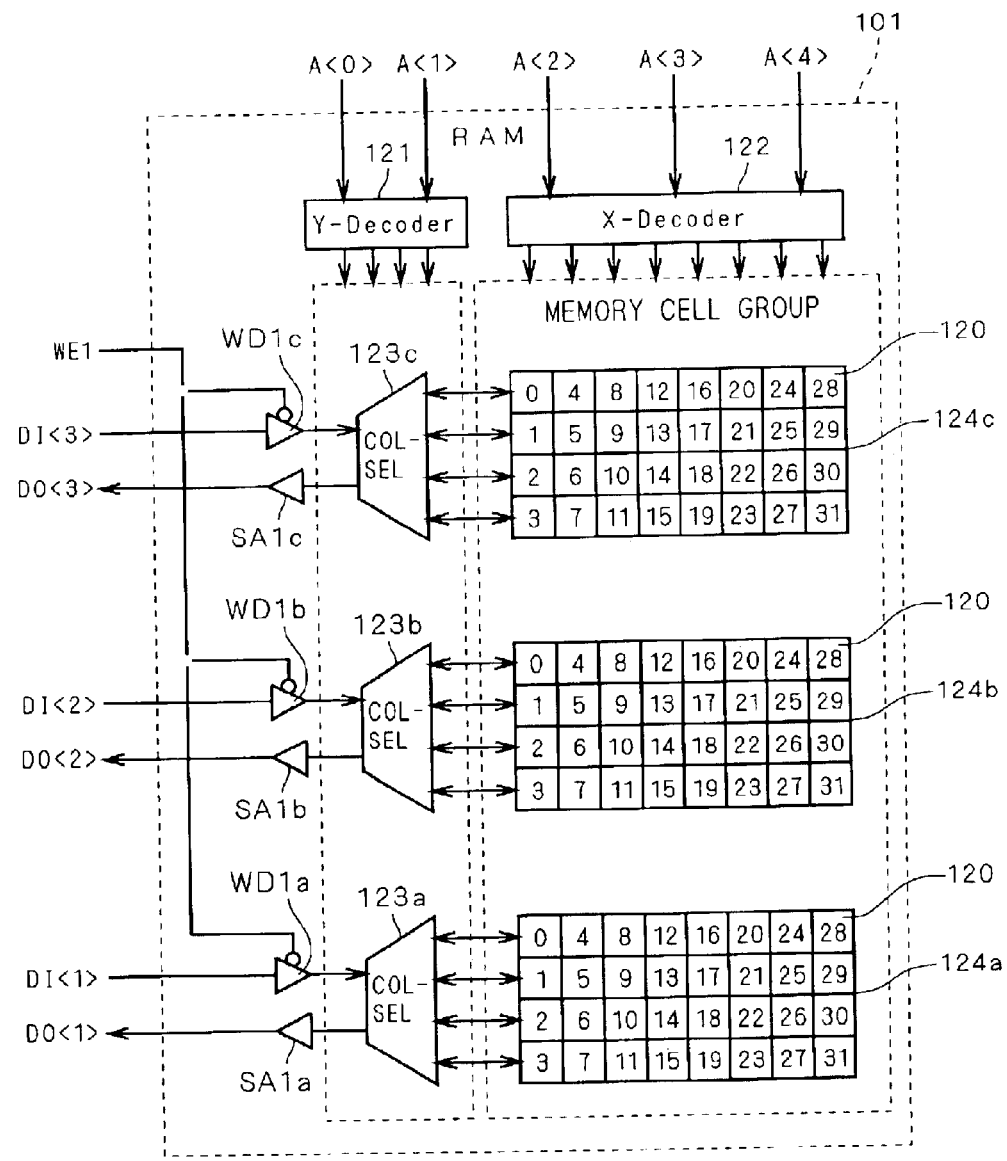
Figure 68:
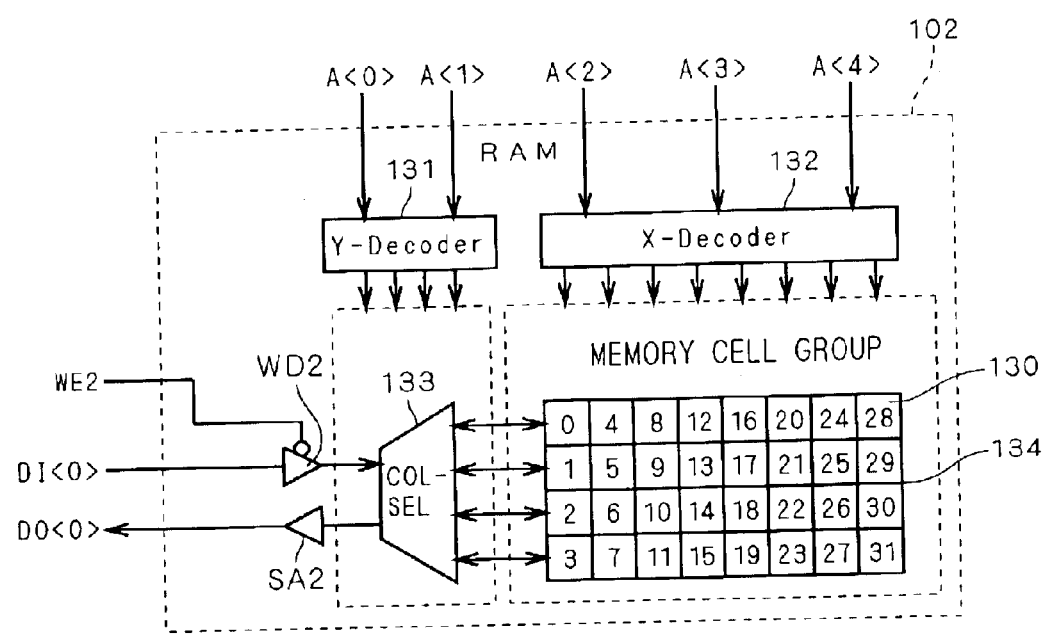
Figure 69:
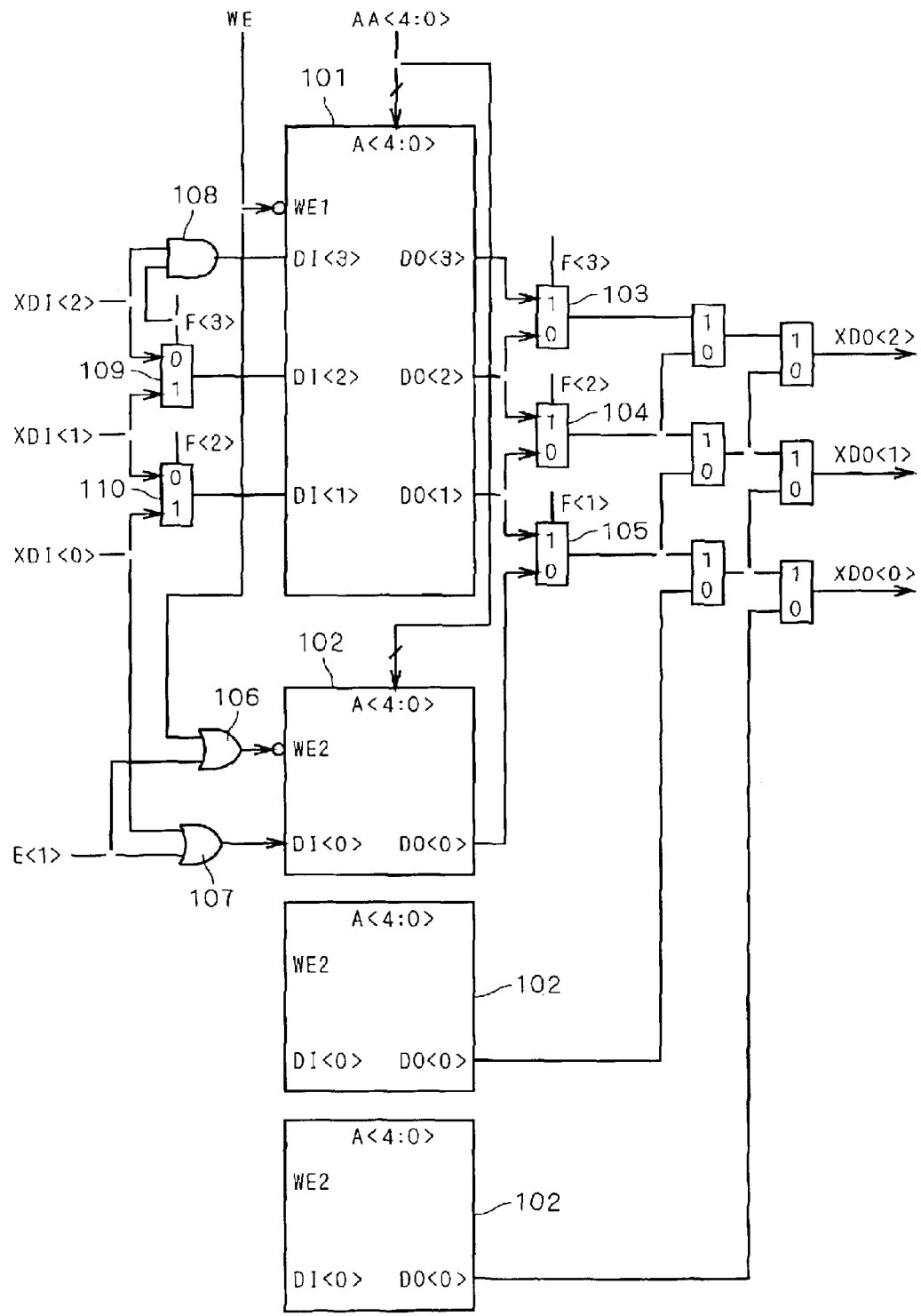

Further, though the data output selection circuit for outputting the data to the outside of the semiconductor memory device is constituted of a plurality of tristate buffers in the above-discussed first to seventh preferred embodiments, the data output selection circuit may be constituted of combination of AND circuits and OR circuits as shown in FIG. 65. Though FIG. 65 shows only a circuit configuration for outputting the data DQ<0>, the same is applied to that for outputting the data DQ<1> to DQ<7>.

The circuit of FIG. 65 performs an AND operation of an operation result on an OR operation of the data DQNA<0> and the enable signal OEN1<0>, that on an OR operation of the data DQNB<0> and the enable signal OEN0<0>, that on an OR operation of the data DQR<6> and the enable signal OER3<0>, that on an OR operation of the data DQR<4> and the enable signal OER2<0>, that on an OR operation of the data DQR<2> and the enable signal OER1<0> and that on an OR operation of the data DQR<0> and the enable signal OER0<0>, and outputs the operation result to the outside of the semiconductor memory device as the data DQ<0>.

Further, in the above-discussed first to seventh preferred embodiments, the normal RAM and the redundancy RAM may be formed on the same semiconductor substrate, and may be formed on different ones.

Furthermore, though a method of programming the fuse is adopted as a method of storing replacement information in the above-discussed first to seventh preferred embodiments, other methods may be adopted. There may be a case, for example, where a circuit using a BIST (Built In Self Test) technique to automatically judge a defect in the normal RAM and store replacement information in accordance with the judgment result in a register is incorporated into the semiconductor memory device of the present invention and the replacement information written in the register is used.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory device, comprising:
   a first memory device having a normal memory cell area;
   a second memory device provided independently from said first memory device, having a redundancy memory cell area; and
   a control unit configured to define a replacement unit with respect to said normal memory cell area in advance to be used for relieving said normal memory cell area which has a defect, said control unit also configured to replace said replacement unit in said normal memory cell area by some of a plurality of redundancy memory cells constituting said redundancy memory cell area when said normal memory cell area actually has a defect,
   wherein a number of bits of data included in unit data in said first memory device and corresponding to said replacement unit is smaller than a number of bits of said unit data in said first memory device, and said data included in said unit data and corresponding to said replacement unit has plurality of bits.

2. A semiconductor memory device, comprising:
   a first memory device having a normal memory cell area;
   a second memory device provided independently from said first memory device, having a redundancy memory cell area; and
   a control unit configured to define a replacement unit with respect to said normal memory cell area in advance to be used for relieving said normal memory cell area which has a defect, said control unit also configured to replace said replacement unit in said normal memory cell area by said redundancy memory cell area when said normal memory cell area actually has a defect,
   wherein a number of bits of first data included in unit data in said first memory device and corresponding to said replacement unit is smaller than a number of bits of said unit data in said first memory device, and
   wherein, when said replacement unit is replaced by said redundancy memory cell area, said control unit is further configured to output second data included in said unit data in said first memory device and other than said first data at its bit position without any change and to output third data read out from said redundancy memory cell area instead of said first data at the bit position of said first data.

3. A semiconductor memory device, comprising:
   a plurality of first memory devices provided independently from one another, to which different address areas are allocated, each having a normal memory cell area;
   a second memory device provided independently from said plurality of first memory devices, having a redundancy memory cell area; and
   a control unit configured to define a replacement unit with respect to said normal memory cell area in advance to be used for relieving said normal memory cell area in each of said plurality of first memory devices which has a defect, said control unit also configured to replace said replacement unit in one of said plurality of first memory devices corresponding to an inputted address by said redundancy memory cell area,
   wherein, in each of said plurality of first memory devices, a number of bits of data included in unit data and corresponding to said replacement unit is smaller than a number of bits of said unit data.

4. The semiconductor memory device according to claim 2, wherein said first data has a plurality of bits.

5. The semiconductor memory device according to claim 3, wherein said data included in said unit data and corresponding to said replacement unit has a plurality of bits.

6. The semiconductor memory device according to claim 1, wherein
   said control unit has a plurality of buffers provided correspondingly to a plurality of output terminals of data in said semiconductor memory device, respectively, for connecting output terminals of data in said second memory device to said plurality of output terminals of data in said semiconductor memory device, and
   said buffers are controlled on activation/inactivation by said control unit in units of a predetermined number of bits of said data included in said unit data and corresponding to said replacement unit.

7. The semiconductor memory device according to claim 2, wherein
   said control unit has a plurality of buffers provided correspondingly to a plurality of output terminals of data in said semiconductor memory device, respectively, for connecting output terminals of data in said second memory device to said plurality of output terminals of data in said semiconductor memory device,
   said first data has a plurality of bits, and
   said buffers are controlled on activation/inactivation by said control unit in units of a predetermined number of bits of said first data.

8. The semiconductor memory device according to claim 3, wherein
   said control unit has a plurality of buffers provided correspondingly to a plurality of output terminals of data in said semiconductor memory device, respectively, for connecting output terminals of data in said second memory device to said plurality of output terminals of data in said semiconductor memory device,
   said data included in said unit data and corresponding to said replacement unit has a plurality of bits, and
   said buffers are controlled on activation/inactivation by said control unit in units of a predetermined number of bits of said data included in said unit data and corresponding to said replacement unit.

* * * * *